US008407556B2

(12) United States Patent
Shen et al.

(10) Patent No.: US 8,407,556 B2

(45) **Date of Patent: *Mar. 26, 2013**

(54) LDPC (LOW DENSITY PARITY CHECK) CODING AND INTERLEAVING IMPLEMENTED IN MIMO COMMUNICATION SYSTEMS

(75) Inventors: Ba-Zhong Shen, Irvine, CA (US); Christopher J. Hansen, Sunnyvale, CA (US); Joseph Paul Lauer, Mountain View, CA (US); Kelly Brian Cameron, Irvine, CA (US); Tak K. Lee, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1033 days.

This patent is subject to a terminal disclaimer.

(21) Appl. No.: 12/413,552

(22) Filed: Mar. 28, 2009

(65) Prior Publication Data

US 2009/0187804 A1 Jul. 23, 2009

Related U.S. Application Data

(63) Continuation of application No. 11/264,998, filed on Nov. 2, 2005, now Pat. No. 7,516,390.

(60) Provisional application No. 60/718,449, filed on Sep. 19, 2005, provisional application No. 60/675,346, filed on Apr. 27, 2005, provisional application No. 60/674,084, filed on Apr. 22, 2005, provisional application No. 60/642,689, filed on Jan. 10, 2005.

(51) Int. Cl.
*H03M 13/00* (2006.01)

(52) U.S. Cl. ......... 714/755; 714/786; 714/784; 714/756

(58) Field of Classification Search .................. 714/752, 714/755–756, 784, 786

See application file for complete search history.

(56) References Cited

U.S. PATENT DOCUMENTS

| | | | | |
|---|---|---|---|---|
| 6,430,233 | B1 * | 8/2002 | Dillon et al. | 375/316 |
| 6,567,465 | B2 * | 5/2003 | Goldstein et al. | 375/222 |
| 7,516,390 | B2 * | 4/2009 | Shen et al. | 714/755 |
| 7,549,105 | B2 * | 6/2009 | Shen et al. | 714/755 |

* cited by examiner

*Primary Examiner* — Guy Lamarre

(74) *Attorney, Agent, or Firm* — Garlick & Markison; Shayne X. Short

(57) ABSTRACT

LDPC (Low Density Parity Check) coding and interleaving implemented in multiple-input-multiple-output (MIMO) communication systems. As described herein, a wide variety of irregular LDPC codes may be generated using GRS or RS codes. A variety of communication device types are also presented that may employ the error correcting coding (ECC) using a GRS-based irregular LDPC code, along with appropriately selected interleaving, to provide for communications using ECC. These communication devices may be implemented to in wireless communication systems including those that comply with the recommendation practices and standards being developed by the IEEE 802.11*n* Task Group (i.e., the Task Group that is working to develop a standard for 802.11 TGn (High Throughput)).

20 Claims, 35 Drawing Sheets

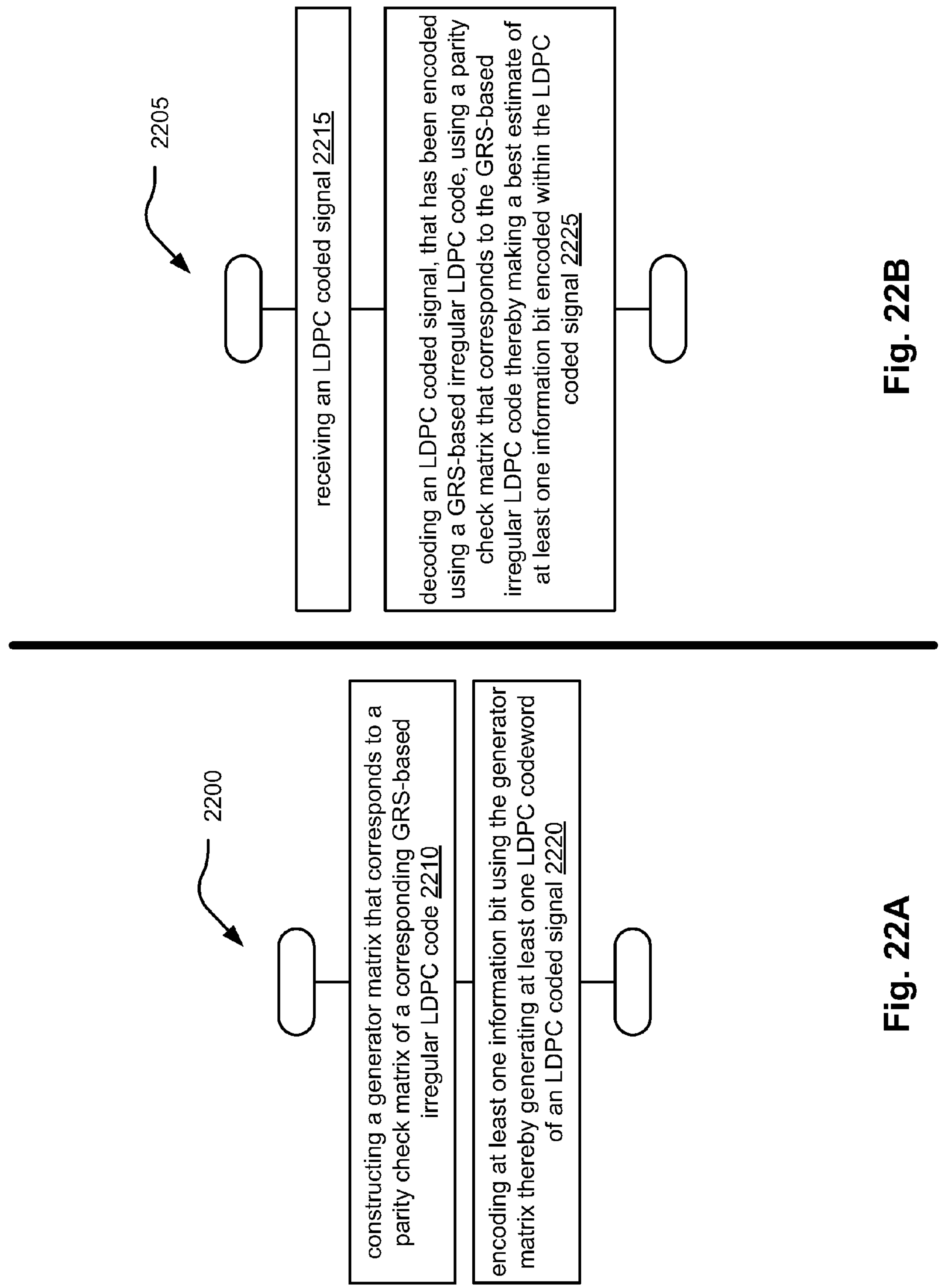
2205
receiving an LDPC coded signal 2215
decoding an LDPC coded signal, that has been encoded using a GRS-based irregular LDPC code, using a parity check matrix that corresponds to the GRS-based irregular LDPC code thereby making a best estimate of at least one information bit encoded within the LDPC coded signal 2225
Fig. 22B
2200
constructing a generator matrix that corresponds to a parity check matrix of a corresponding GRS-based irregular LDPC code 2210
encoding at least one information bit using the generator matrix thereby generating at least one LDPC codeword of an LDPC coded signal 2220
Fig. 22A

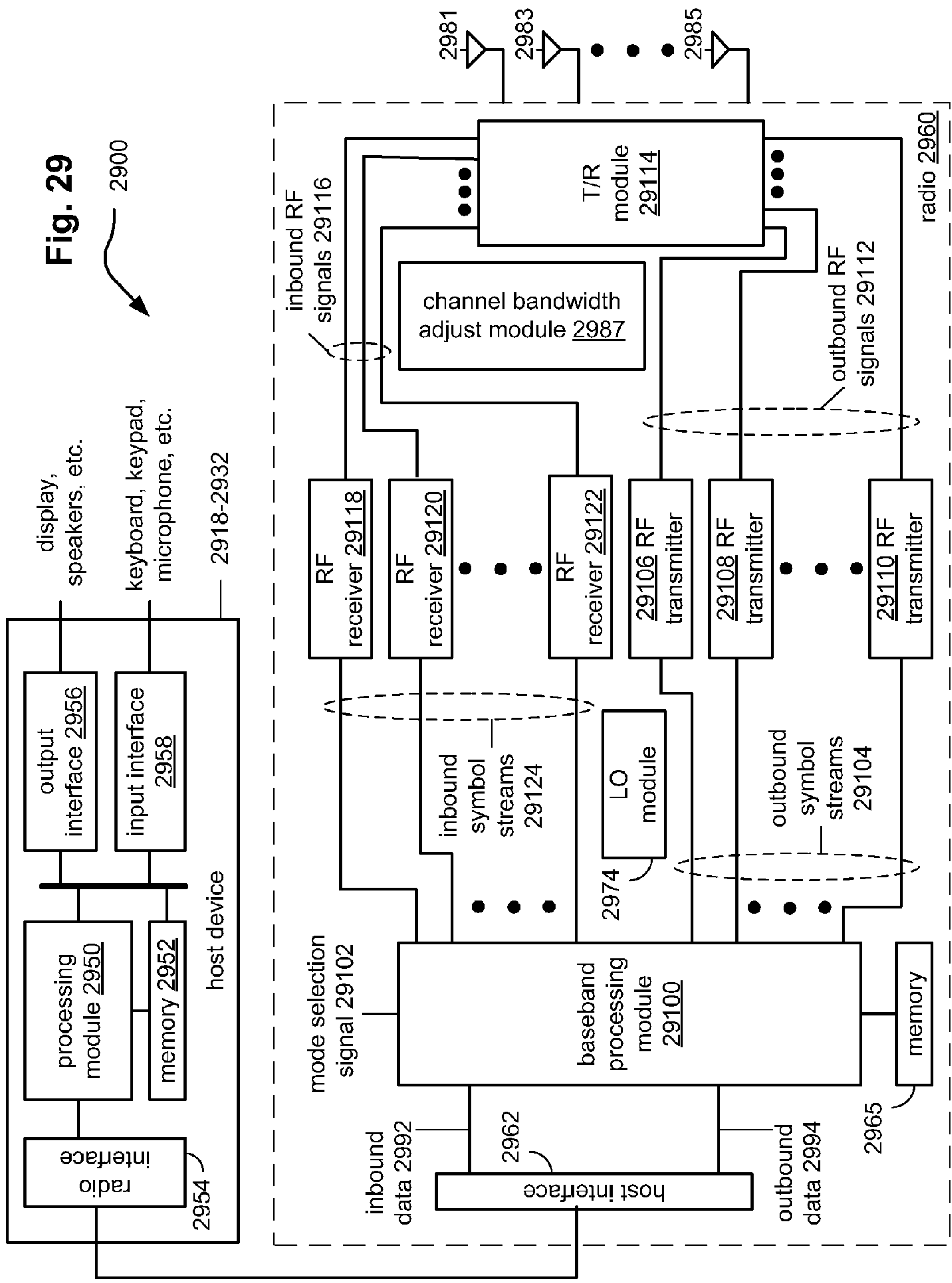

Fig. 29
2900
2981
2983
2985
radio 2960
T/R module 29114
inbound RF signals 29116
channel bandwidth adjust module 2987
outbound RF signals 29112
RF receiver 29118
RF receiver 29120
RF receiver 29122
29106 RF transmitter
29108 RF transmitter
29110 RF transmitter
inbound symbol streams 29124
LO module
2974
outbound symbol streams 29104
mode selection signal 29102
baseband processing module 29100
memory
2965
inbound data 2992
2962
host interface
outbound data 2994
display, speakers, etc.
keyboard, keypad, microphone, etc.
2918-2932
output interface 2956
input interface 2958
processing module 2950
memory 2952
host device
radio interface
2954

LDPC (LOW DENSITY PARITY CHECK) CODING AND INTERLEAVING IMPLEMENTED IN MIMO COMMUNICATION SYSTEMS

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility application Ser. No. 11/264,998, entitled "LDPC (Low Density Parity Check) coding and interleaving implemented in MIMO communication systems," filed Nov. 2, 2005, pending, and scheduled to issue as U.S. Pat. No. 7,516,390 on Apr. 7, 2009, which claims priority pursuant to 35 U.S.C. §119(e) to the following U.S. Provisional Patent Applications which are hereby incorporated herein by reference in their entirety and made part of the present U.S. Utility patent application for all purposes:

a. U.S. Provisional Application Ser. No. 60/642,689, entitled "Construction of LDPC (Low Density Parity Check) codes using generalized RS (Reed-Solomon) code," filed Jan. 10, 2005, now expired.

b. U.S. Provisional Application Ser. No. 60/674,084, entitled "Construction of Irregular LDPC (Low Density Parity Check) codes using RS (Reed-Solomon) codes or GRS (Generalized Reed-Solomon) code," filed Apr. 22, 2005, now expired.

c. U.S. Provisional Application Ser. No. 60/675,346, entitled "Construction of Irregular LDPC (Low Density Parity Check) codes using RS (Reed-Solomon) codes or GRS (Generalized Reed-Solomon) code," filed Apr. 27, 2005, now expired.

d. U.S. Provisional Application Ser. No. 60/718,449, entitled "LDPC (Low Density Parity Check) coding and interleaving implemented in MIMO communication systems," filed Sep. 19, 2005, now expired.

INCORPORATION BY REFERENCE

The following U.S. Utility patent applications are hereby incorporated herein by reference in their entirety and made part of the present U.S. Utility patent application for all purposes:

1. U.S. Utility patent application Ser. No. 11/190,333, entitled "Construction of LDPC (Low Density Parity Check) codes using GRS (Generalized Reed-Solomon) code," filed Jul. 27, 2005, pending.

2. U.S. Utility patent application Ser. No. 11/264,997, entitled "Construction of Irregular LDPC (Low Density Parity Check) codes using RS (Reed-Solomon) codes or GRS (Generalized Reed-Solomon) code," filed Nov. 2, 2005, pending.

BACKGROUND OF THE INVENTION

1. Technical Field of the Invention

The invention relates generally to communication systems; and, more particularly, it relates to encoding processing and/or decoding processing of information within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. Theoretically, LDPC code has been shown to come within 0.004 dB (decibels) away from the Shannon limit. While this example was achieved using an irregular LDPC code of a length of one million, it nevertheless demonstrates the very promising application of LDPC codes within communication systems.

There appears continually to be a need in the art for some alternative coding types and modulation implementations that can provide near-capacity achieving error correction. LDPC codes offer such performance and are such possible candidates for this ongoing development.

There is no generally agreed "best" method to follow for the construction of LDPC codes with good performance. In the following reference [a], a regular LDPC code is constructed based on two codewords of an RS (Reed-Solomon) code.

[a] I. Djurdjevic, J. Xu, K. Abdel-Ghaffar and S. Lin, "A Class of Low-Density Parity-Check Codes Constructed Based on Reed-Solomon Codes With Two Information Symbols," *IEEE Communications Letter*, vol. 7, no. 7, pp. 317-319, July 2003.

However, this LDPC codes presented using the approach of this prior art reference are of a very narrow type and there is very little, if any, flexibility presented by this approach by which other types of LDPC codes may be designed. This lack of flexibility presents a significant challenge for any designed of such LDPC codes and/or communication devices to be implemented using such LDPC codes. Clearly, there seems to be a continual need for additional and better types of codes for use in various communication systems to provide for better means of error correction and better BER while operating at various amounts of SNR.

There are a wide variety of types of communication systems. Communication systems are known to support wireless and wire lined communications between wireless and/or wire lined communication devices. Such communication systems range from national and/or international cellular telephone systems to the Internet to point-to-point in-home wireless networks, and to other types of communication systems. Each type of communication system is constructed, and hence operates, in accordance with one or more communication standards. For instance, wireless communication systems may operate in accordance with one or more standards including, but not limited to, IEEE (Institute of Electrical & Electronics Engineers) 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc. communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In many systems, the transmitter will include one antenna for transmitting the RF signals, which are received by a single antenna, or multiple antennas, of a receiver. When the receiver includes two or more antennas, the receiver will select one of them to receive the incoming RF signals. In this instance, the wireless communication between the transmitter and receiver is a single-output-single-input (SISO) communication, even if the receiver includes multiple antennas that are used as diversity antennas (i.e., selecting one of them to receive the incoming RF signals). For SISO wireless communications, a transceiver includes one transmitter and one receiver. Currently, most wireless local area networks (WLAN) that are IEEE 802.11, 802.11a, 802.11b, or 802.11g employ SISO wireless communications.

Other types of wireless communications include single-input-multiple-output (SIMO), multiple-input-single-output (MISO), and multiple-input-multiple-output (MIMO). In a SIMO wireless communication, a single transmitter processes data into radio frequency signals that are transmitted to a receiver. The receiver includes two or more antennas and two or more receiver paths. Each of the antennas receives the RF signals and provides them to a corresponding receiver path (e.g., LNA, down conversion module, filters, and ADCs). Each of the receiver paths processes the received RF signals to produce digital signals, which are combined and then processed to recapture the transmitted data.

For a multiple-input-single-output (MISO) wireless communication, the transmitter includes two or more transmission paths (e.g., digital to analog converter, filters, up-conversion module, and a power amplifier) that each converts a corresponding portion of baseband signals into RF signals, which are transmitted via corresponding antennas to a receiver. The receiver includes a single receiver path that receives the multiple RF signals from the transmitter.

For a multiple-input-multiple-output (MIMO) wireless communication, the transmitter and receiver each include multiple paths. In such a communication, the transmitter parallel processes data using a spatial and time encoding function to produce two or more streams of data. The transmitter includes multiple transmission paths to convert each stream of data into multiple RF signals. The receiver receives the multiple RF signals via multiple receiver paths that recapture the streams of data utilizing a spatial and time decoding function. The recaptured streams of data are combined and subsequently processed to recover the original data.

In such SISO, MISO, and MIMO communication systems, as within other types of communication systems, there is a continual need for additional and better types of codes for use in various communication systems to provide for better means of error correction and better BER while operating at various amounts of SNR.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

and a second GRS-based irregular LDPC code ($LDPC_2$) on an AWGN (Additive White Gaussian Noise) communication channel.

Figure 8:
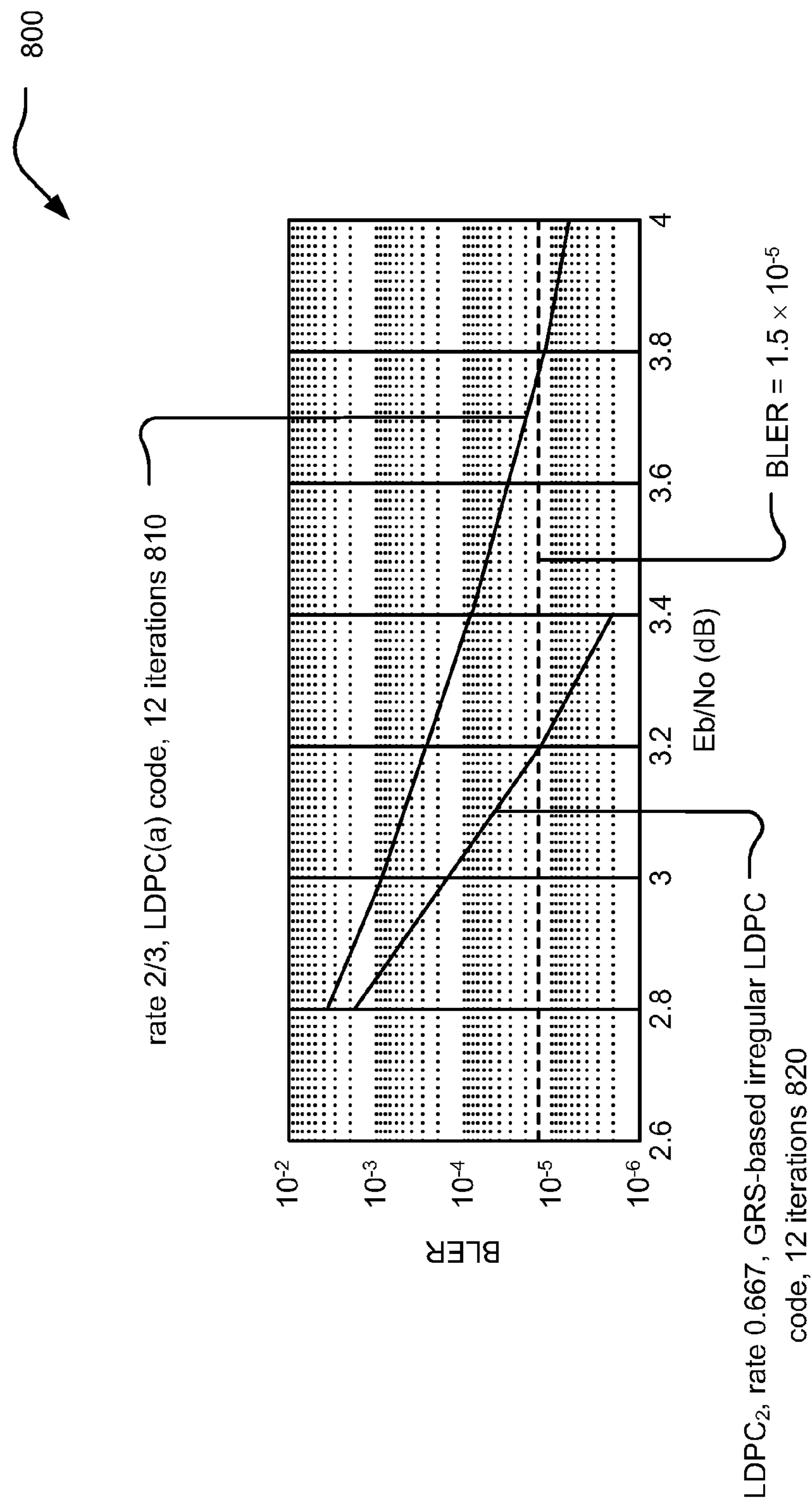

FIG. 8 illustrates an embodiment of a performance comparison between a GRS-based irregular LDPC code ($LDPC_2$) and an alternative LDPC code, LDPC(a), on an AWGN communication channel.

FIG. 9, FIG. 10, FIG. 11, FIG. 12, and FIG. 13 illustrate embodiments of bit to symbol interleaving.

Figure 14:
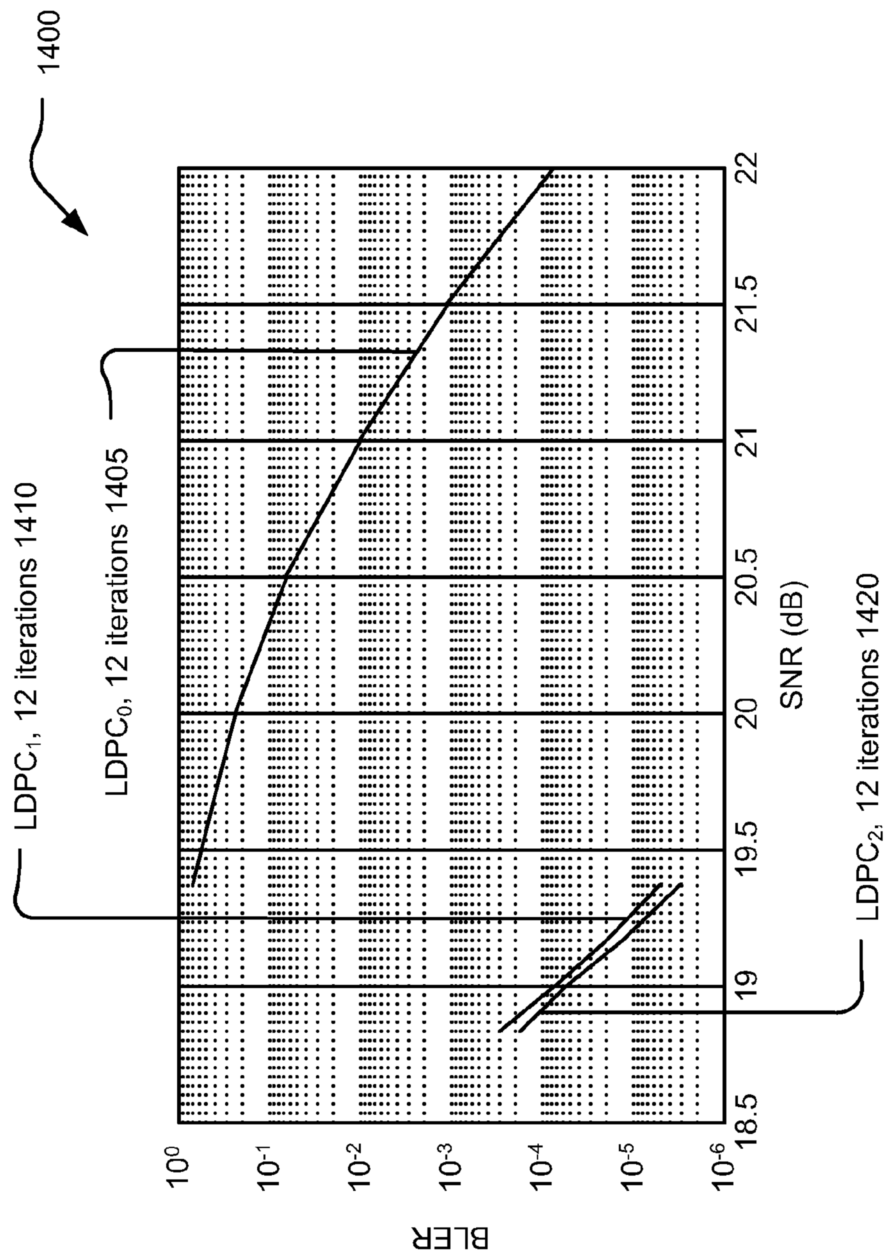

FIG. 14 illustrates an embodiment of a performance comparison between a GRS-based regular LDPC code ($LDPC_0$), a first GRS-based irregular LDPC code ($LDPC_1$), and a second GRS-based irregular LDPC code ($LDPC_2$) on a Rayleigh fading communication channel.

Figure 15:
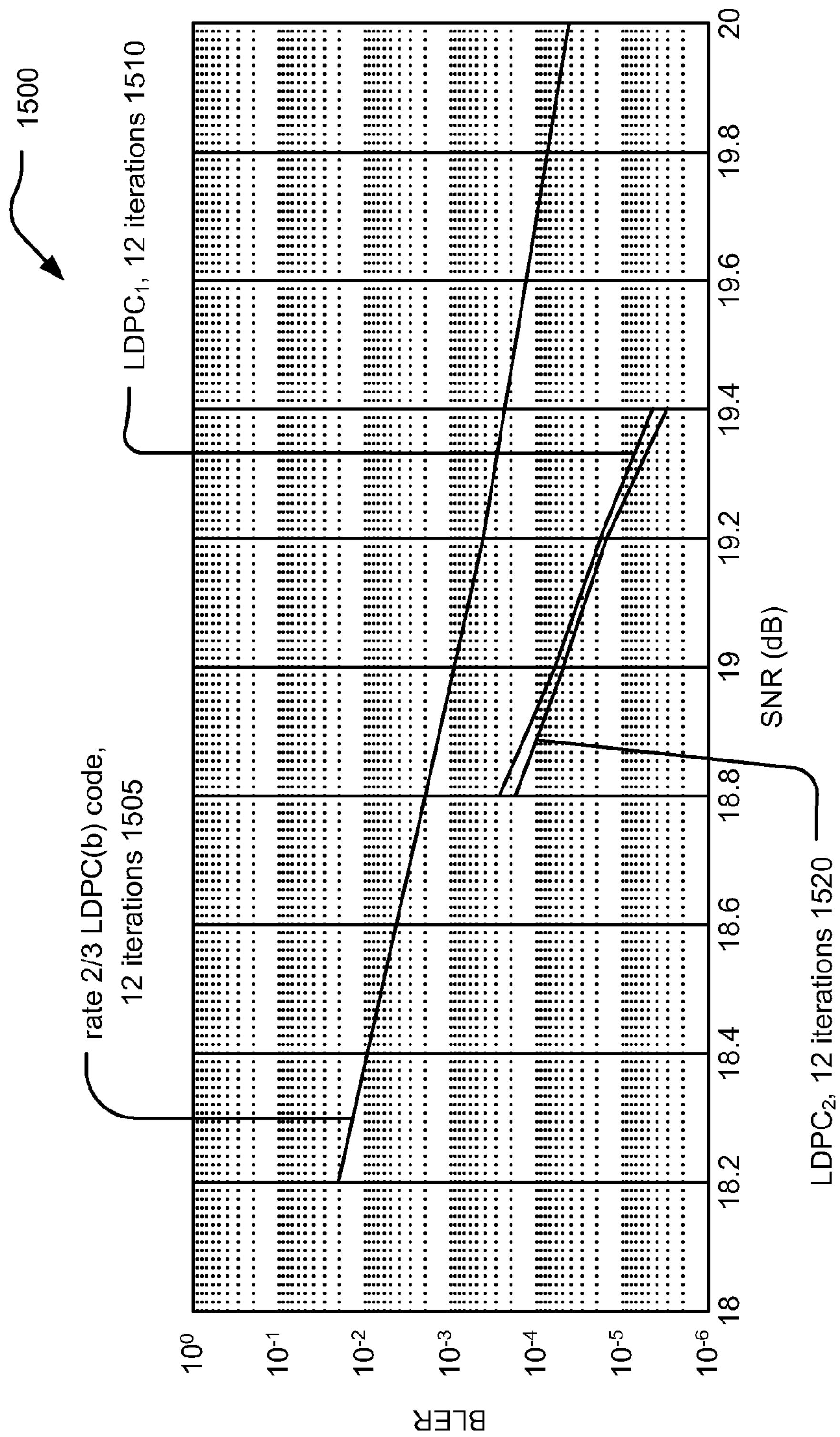

FIG. 15 illustrates an embodiment of a performance comparison between a first GRS-based irregular LDPC code ($LDPC_1$), a second GRS-based irregular LDPC code ($LDPC_2$), and an alternative LDPC code, LDPC(b), on a communication channel.

Figure 16:
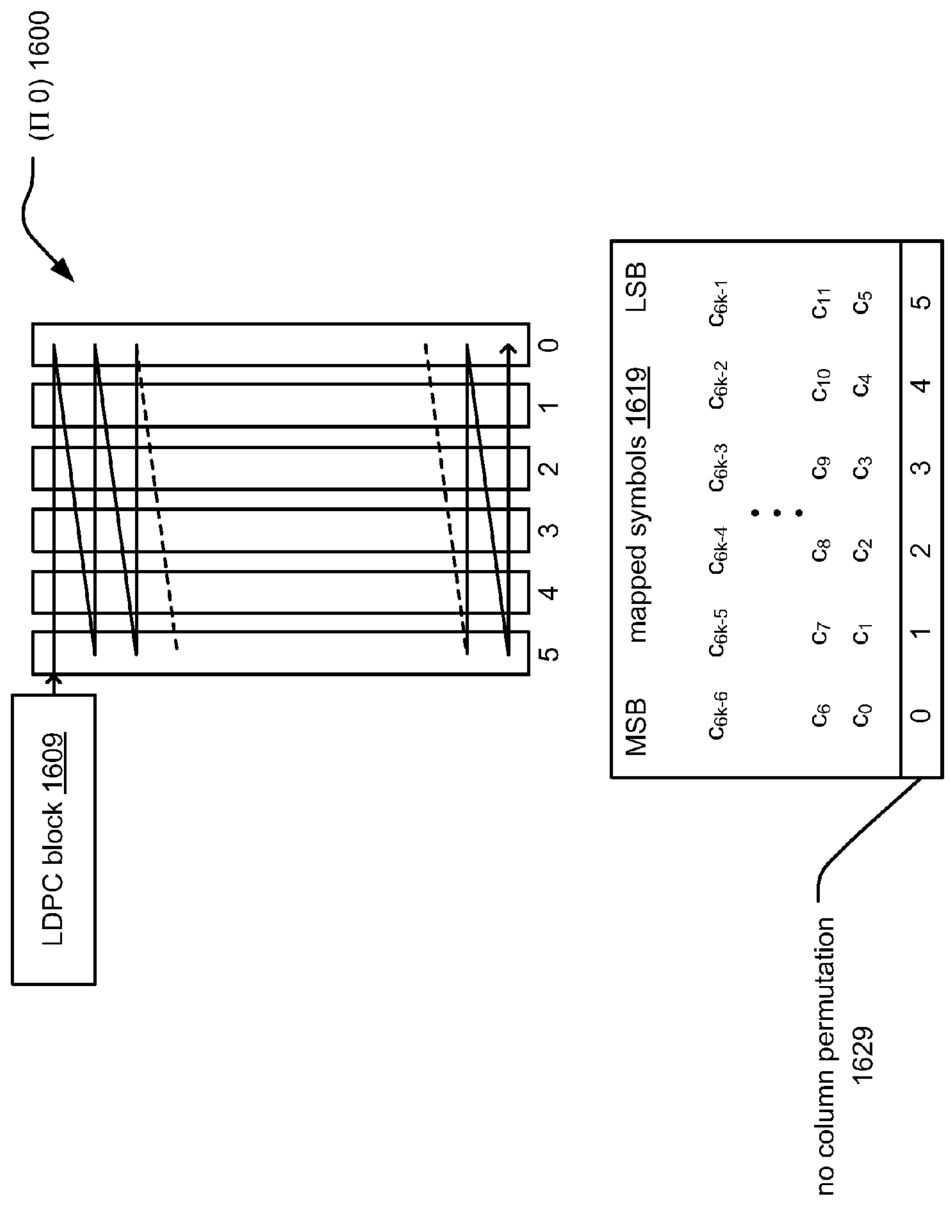
Figure 17:
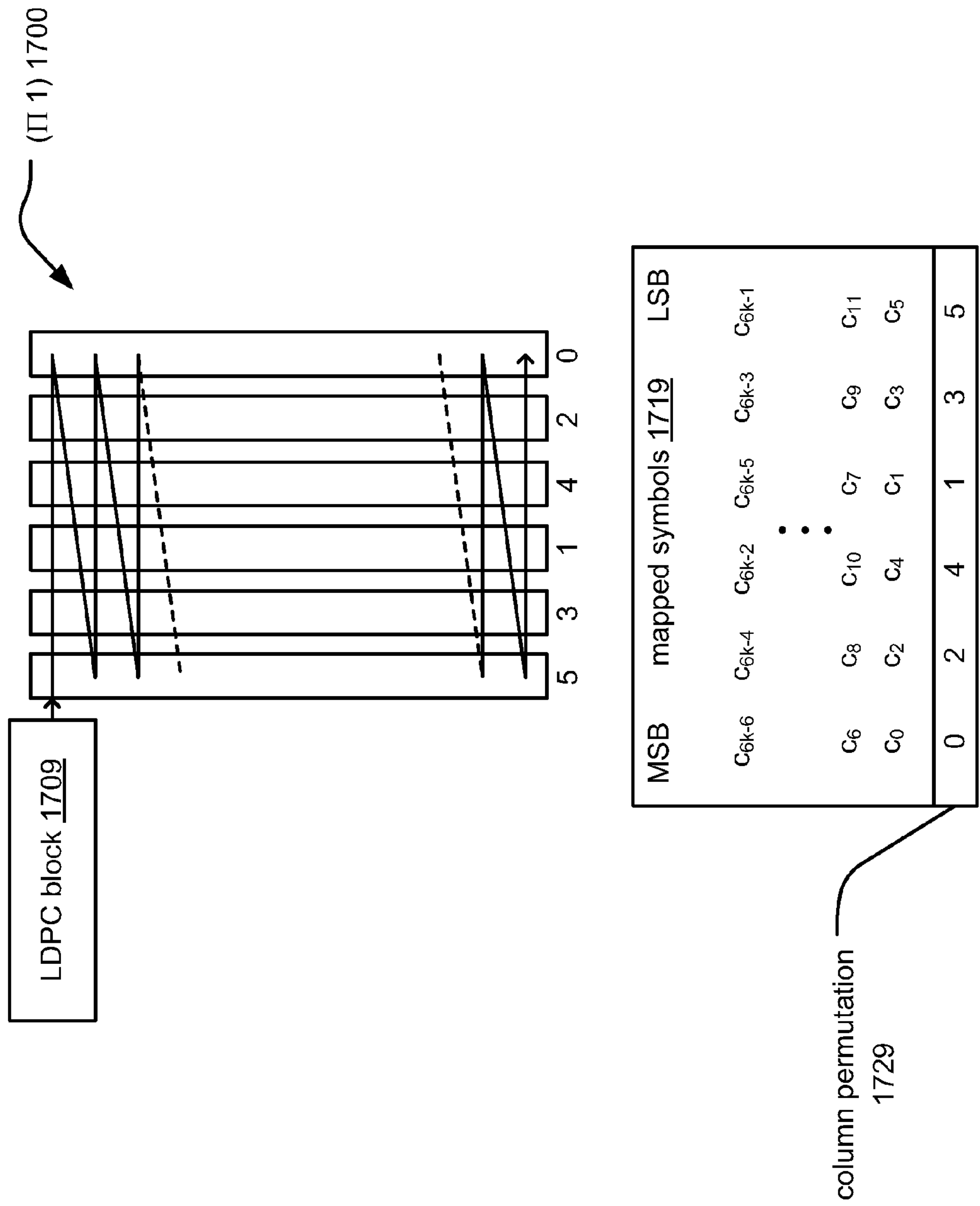

FIG. 16 and FIG. 17 illustrate alternative embodiments of bit to symbol interleaving.

Figure 18:
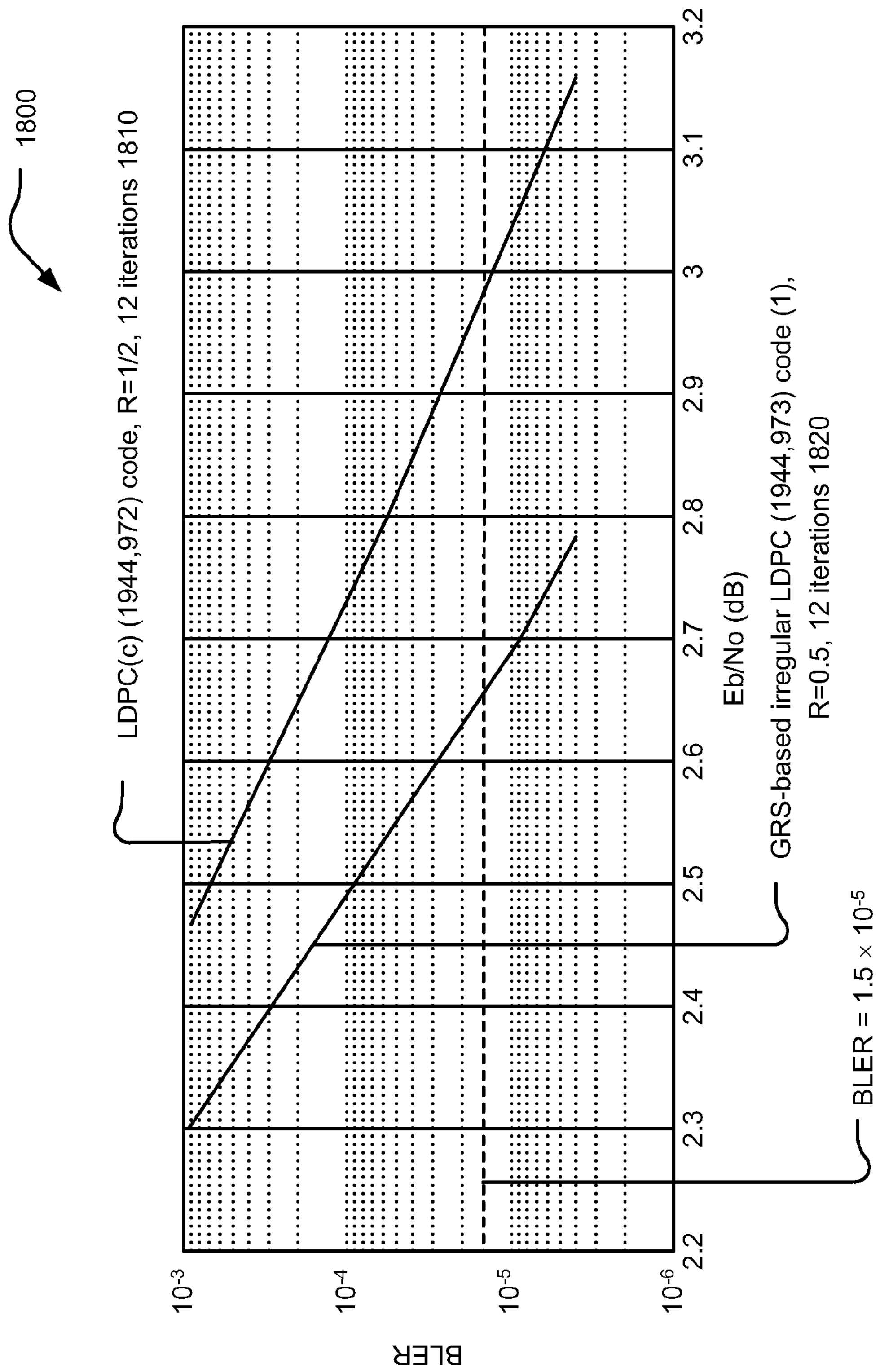

FIG. 18 illustrates an embodiment of a performance comparison between a GRS-based irregular LDPC (1944, 973) code (1) and a first code, LDPC(c) (1944, 972), on a communication channel.

Figure 19:
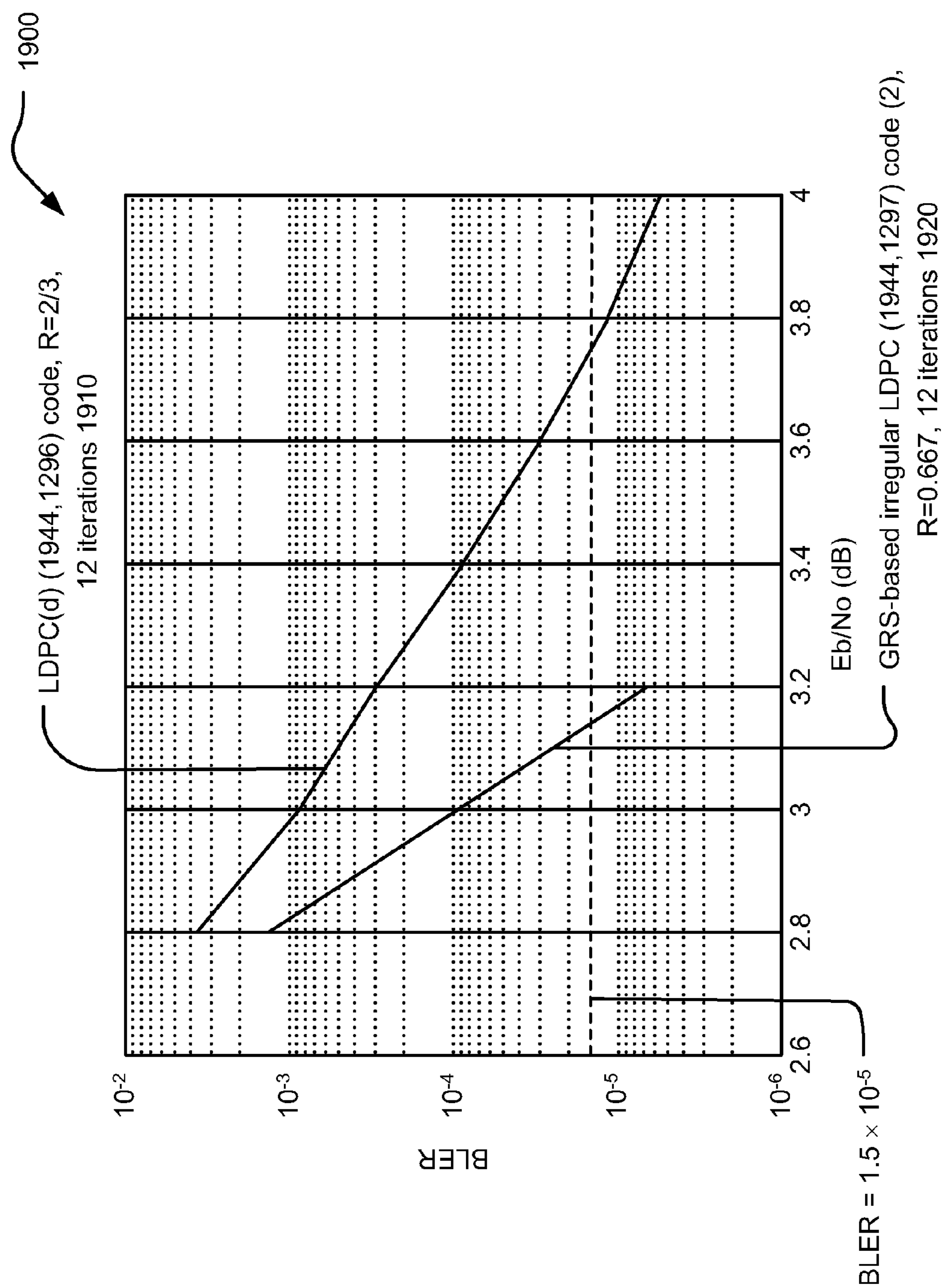

FIG. 19 illustrates an embodiment of a performance comparison between a GRS-based irregular LDPC (1944, 1297) code (2) and a second code, LDPC(d) (1944, 1296), on a communication channel.

Figure 20:
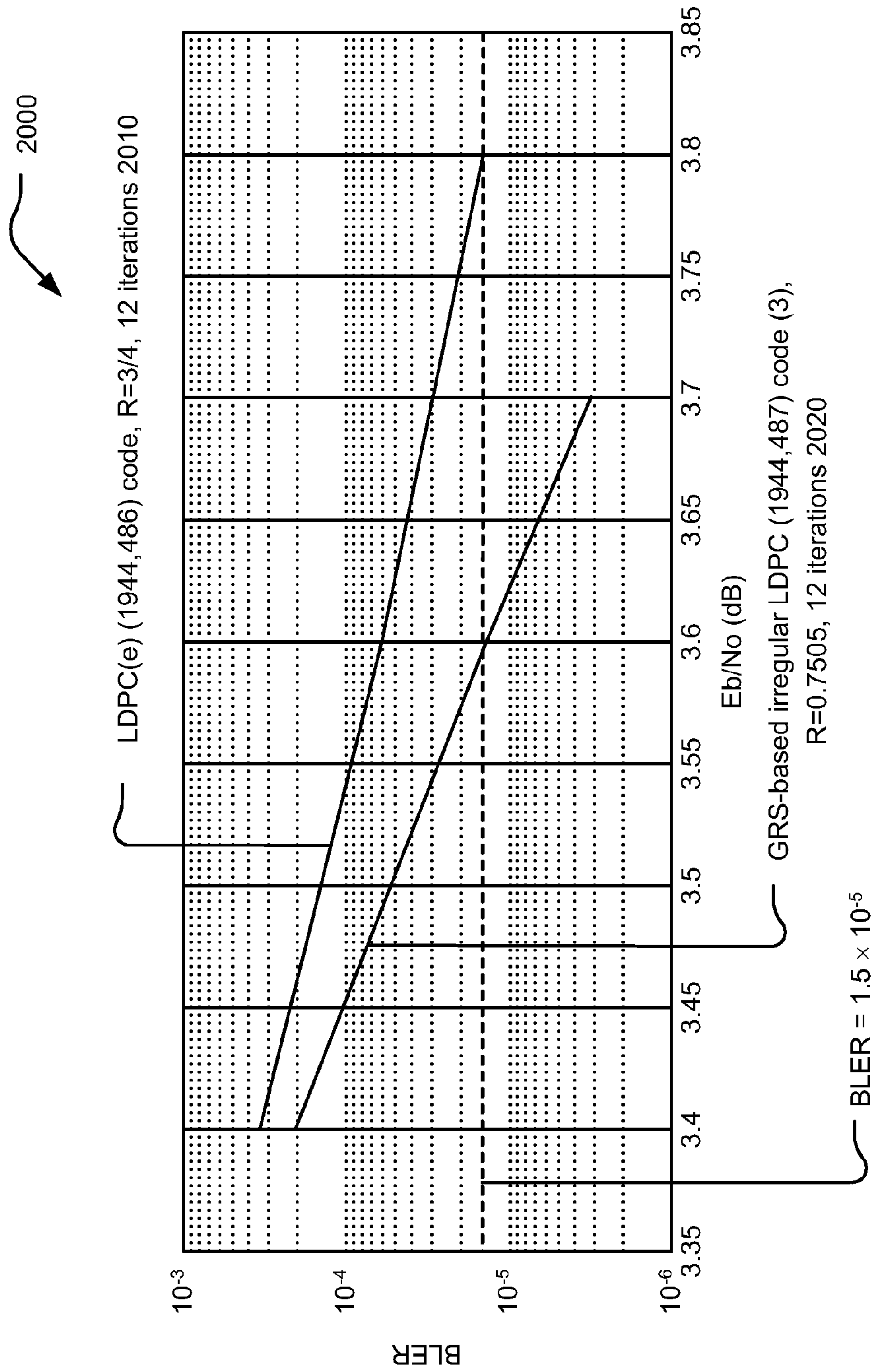

FIG. 20 illustrates an embodiment of a performance comparison between a GRS-based irregular LDPC (1944, 487) code (3) and a third code, LDPC(e) (1944, 487), on a communication channel.

Figure 21:
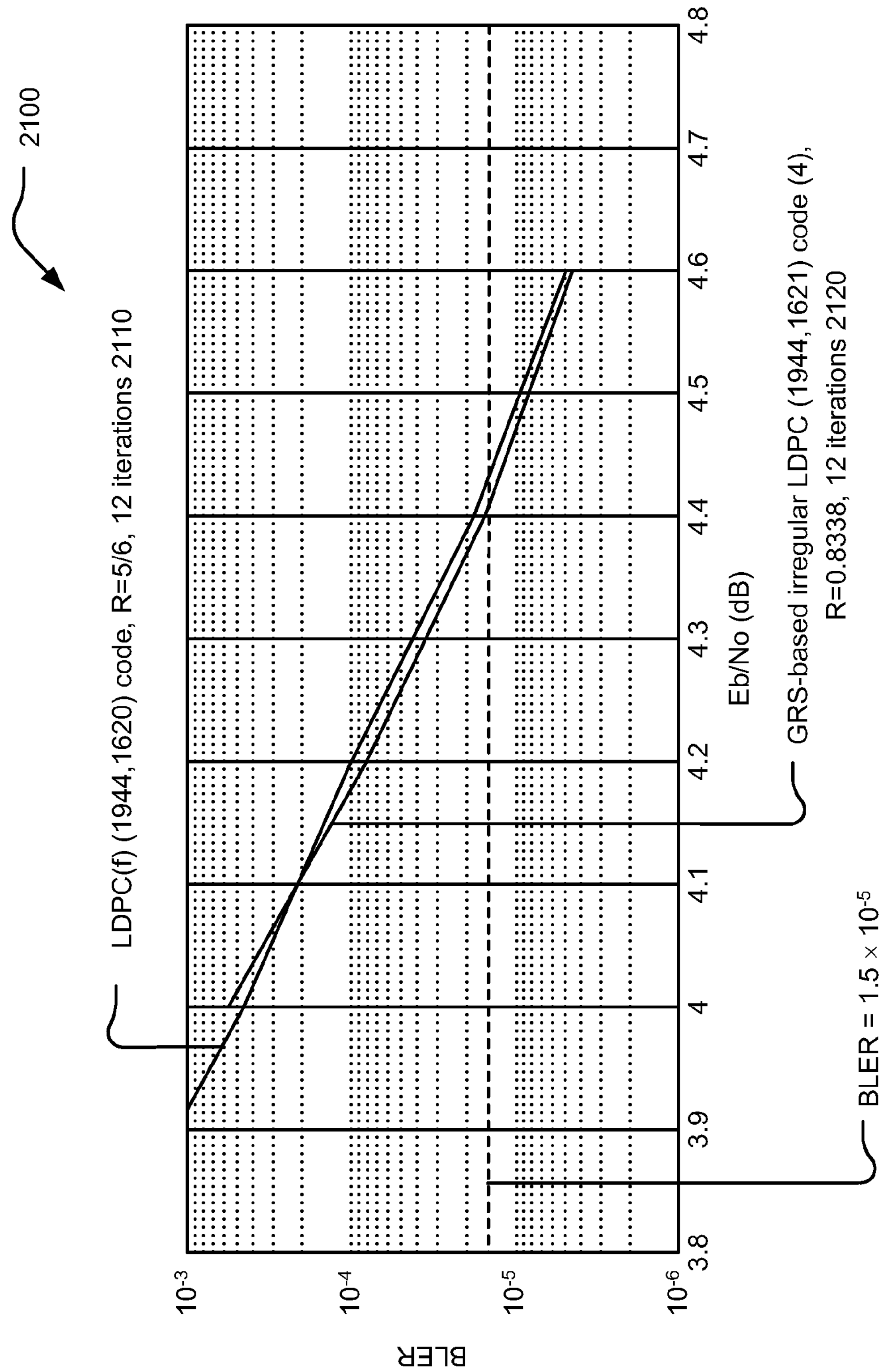

FIG. 21 illustrates an embodiment of a performance comparison between a GRS-based irregular LDPC (1944, 1621) code (4) and a fourth code, LDPC(f) (1944, 1620), on a communication channel.

FIG. 22A illustrates an embodiment of a method for generating an LDPC coded signal.

FIG. 22B illustrates an embodiment of a method for decoding an LDPC coded signal.

Figure 23:
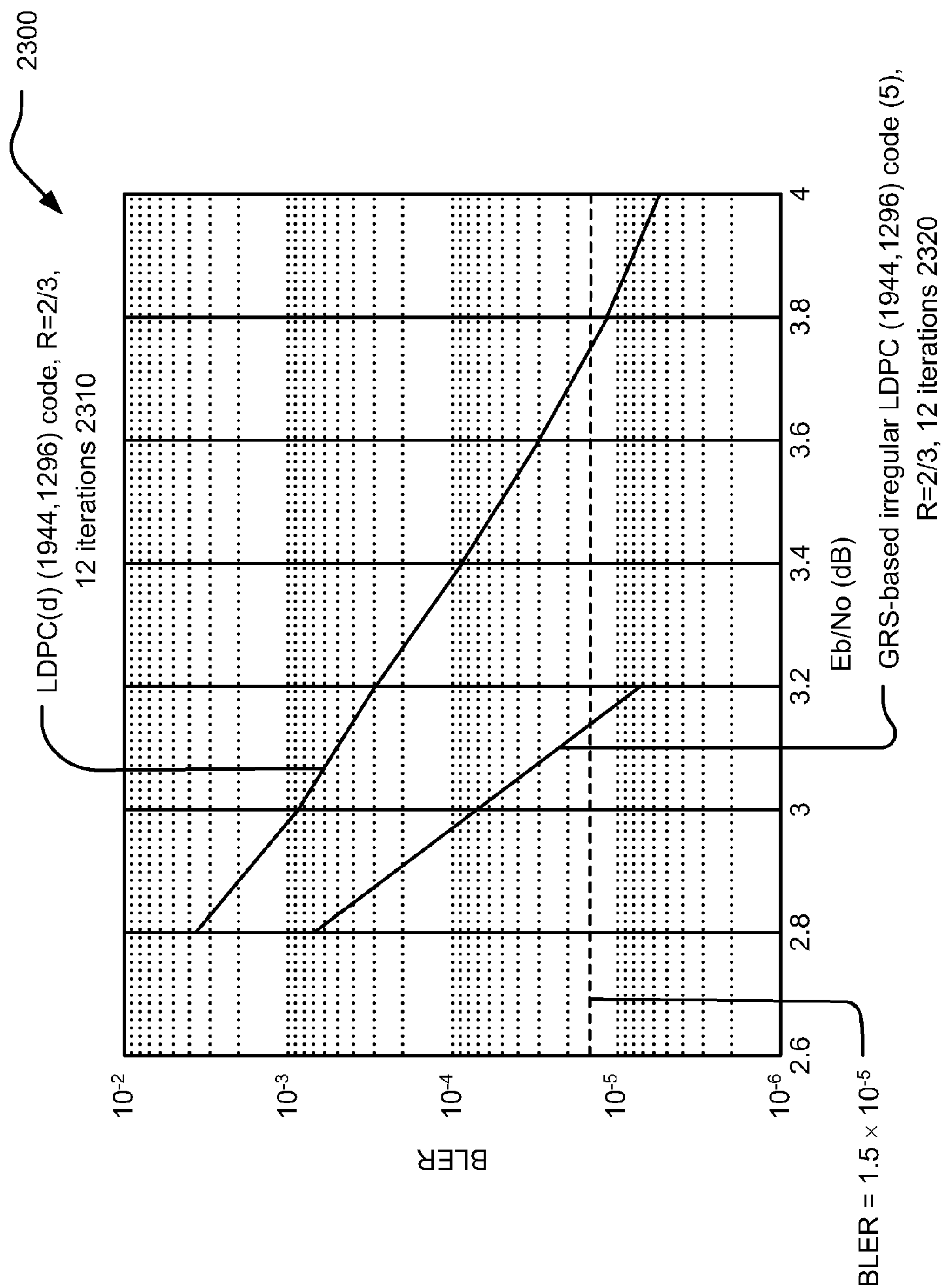

FIG. 23 illustrates an embodiment of a performance comparison between a GRS-based irregular LDPC (1944, 1296) code (5) and the second code, LDPC(d) (1944, 1296), on a communication channel.

Figure 24:
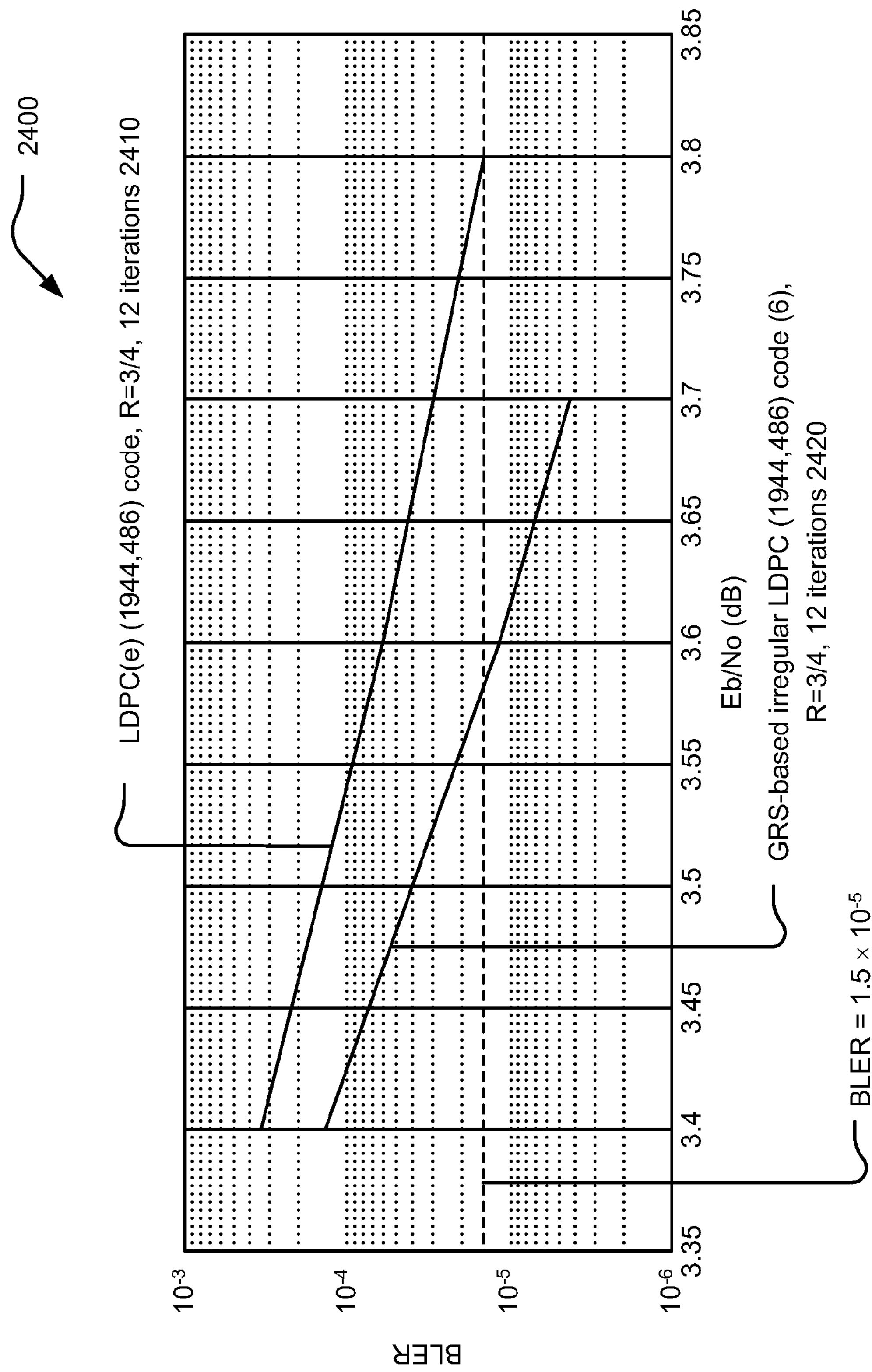

FIG. 24 illustrates an embodiment of a performance comparison between a GRS-based irregular LDPC (1944, 486) code (6) and the third code, LDPC(e) (1944, 486), on a communication channel.

Figure 25:
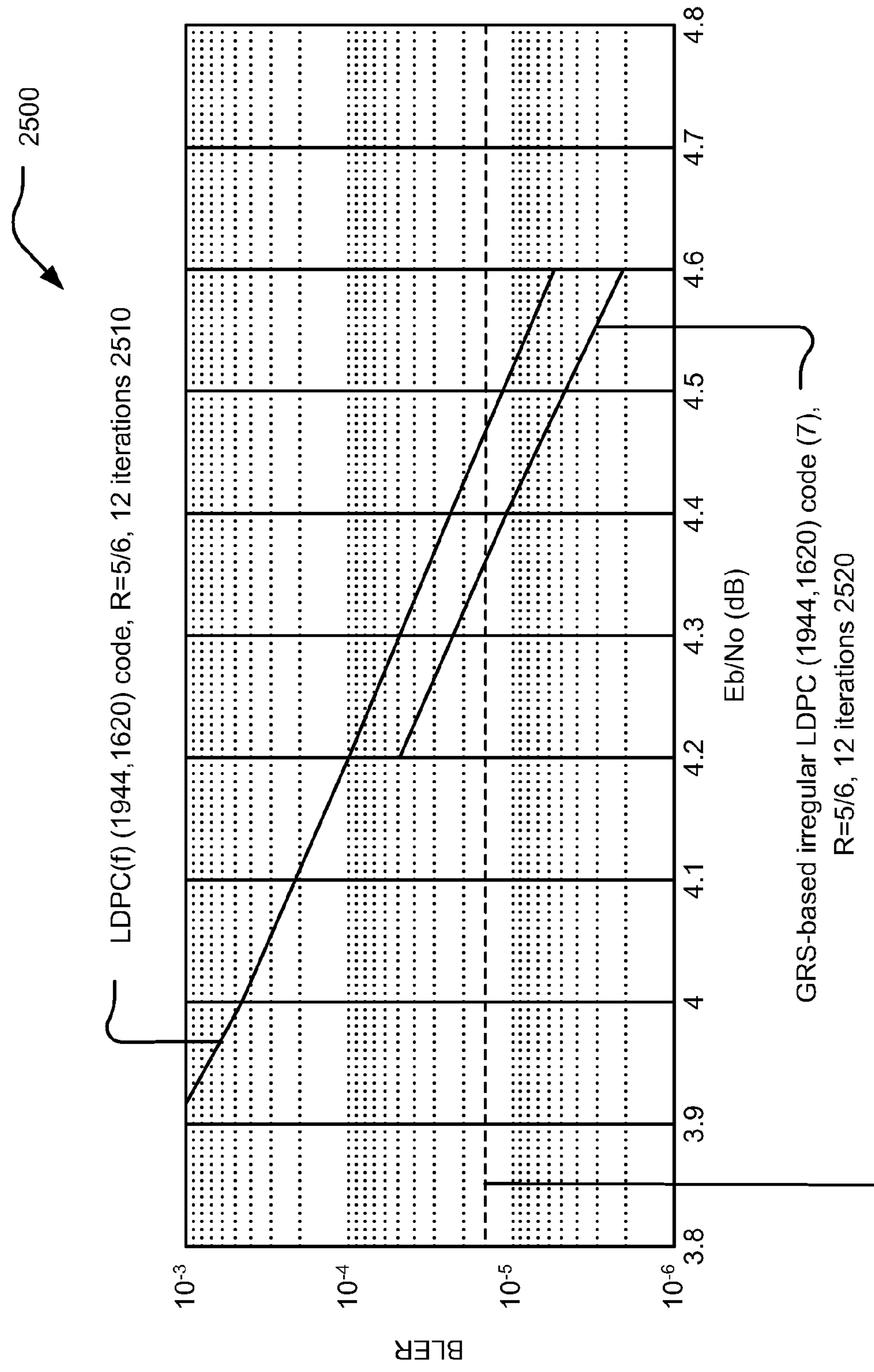

FIG. 25 illustrates an embodiment of a performance comparison between a GRS-based irregular LDPC (1944, 1620) code (7) and the fourth code, LDPC(f) (1944, 1620), on a communication channel.

Figure 26:
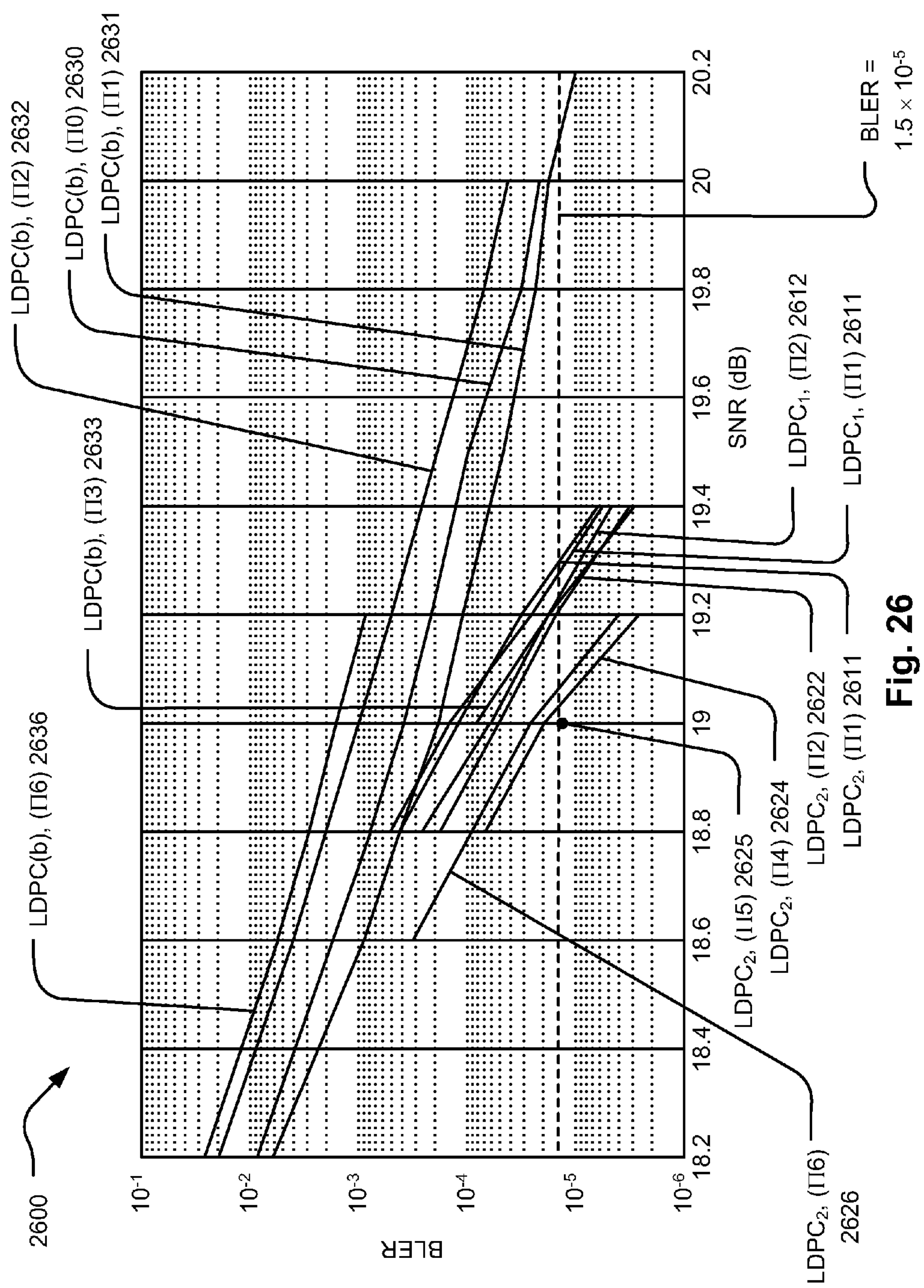

FIG. 26 illustrates an embodiment of a performance comparison between a first GRS-based irregular LDPC code ($LDPC_1$), a second GRS-based irregular LDPC code ($LDPC_2$), and an alternative LDPC code, LDPC(b), using different types of bit to symbol interleaving, on a communication channel.

Figure 27:
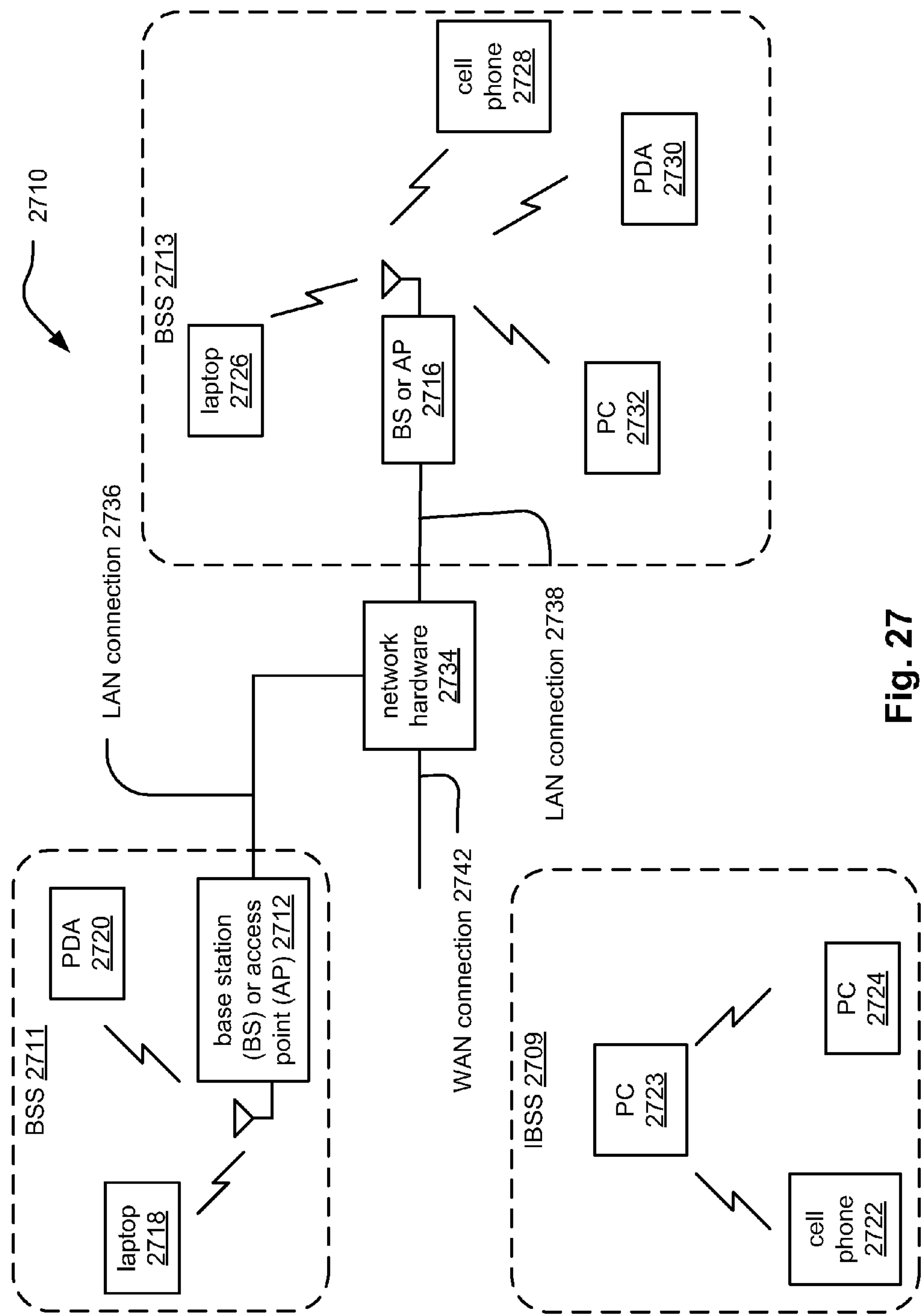

FIG. 27 illustrates an embodiment of a wireless communication system.

Figure 28:
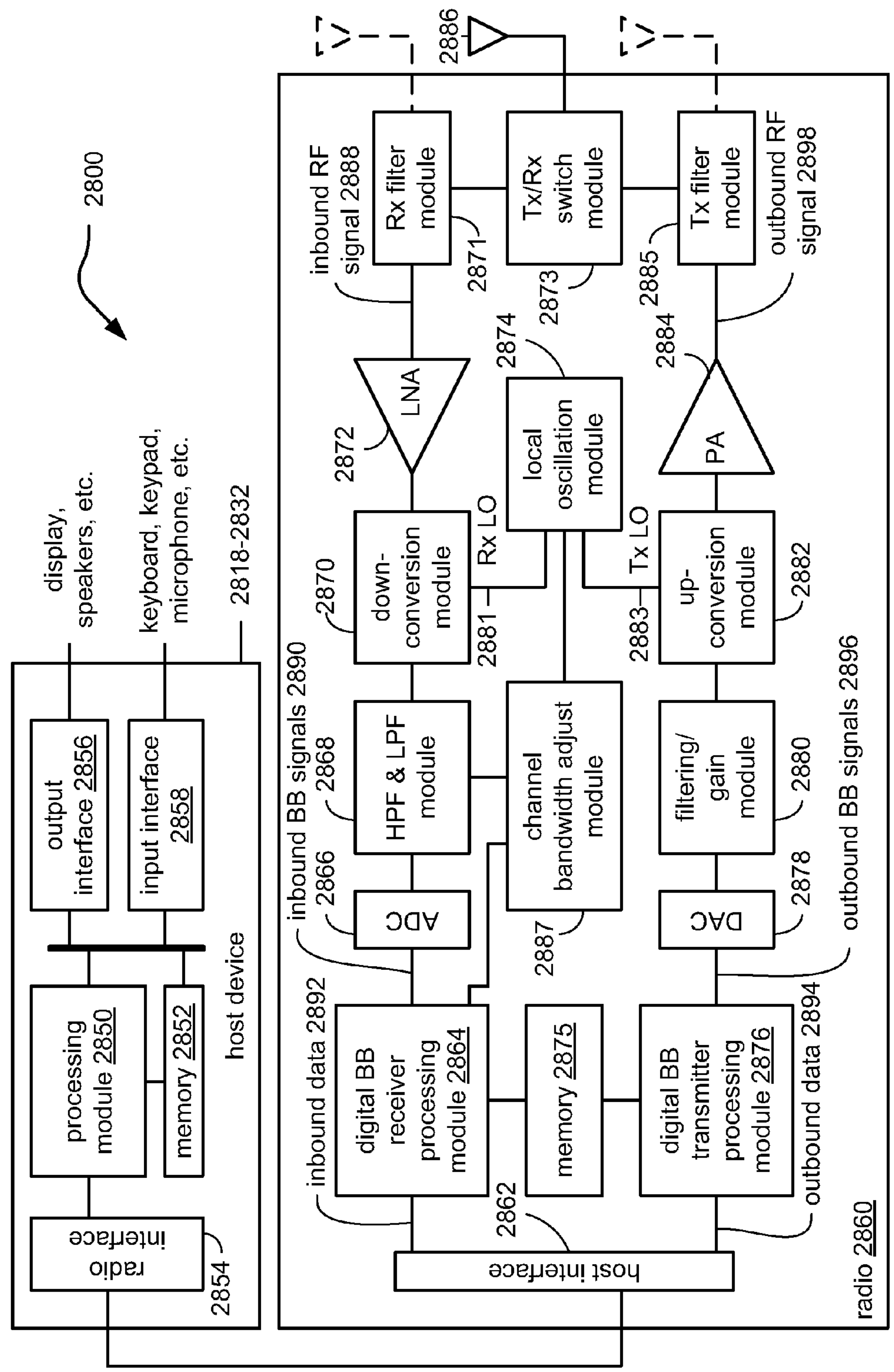

FIG. 28 illustrates an embodiment of a wireless communication device.

FIG. 29 illustrates an alternative embodiment of a wireless communication device.

Figure 30:
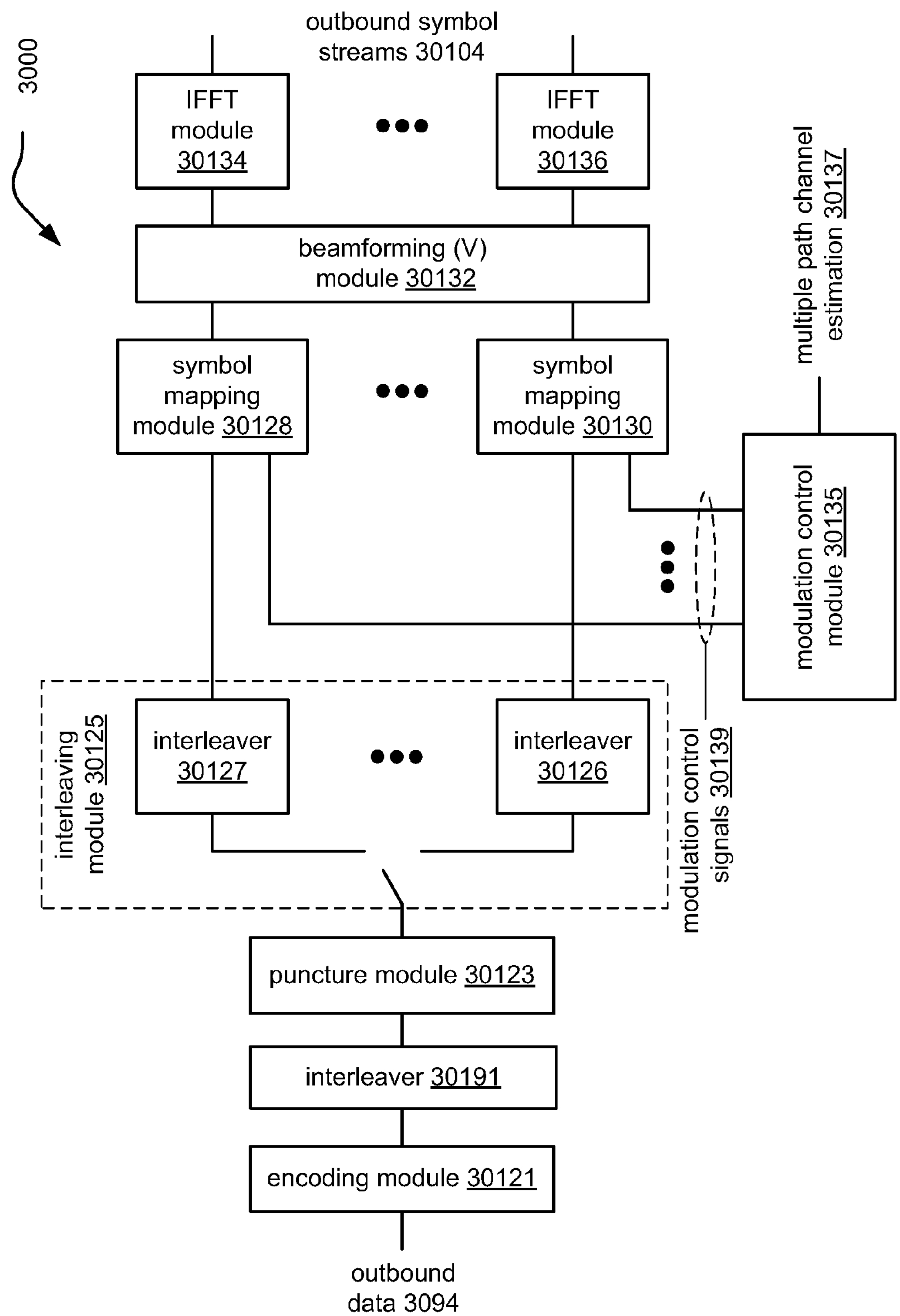

FIG. 30 illustrates an embodiment of baseband transmit processing.

Figure 31:
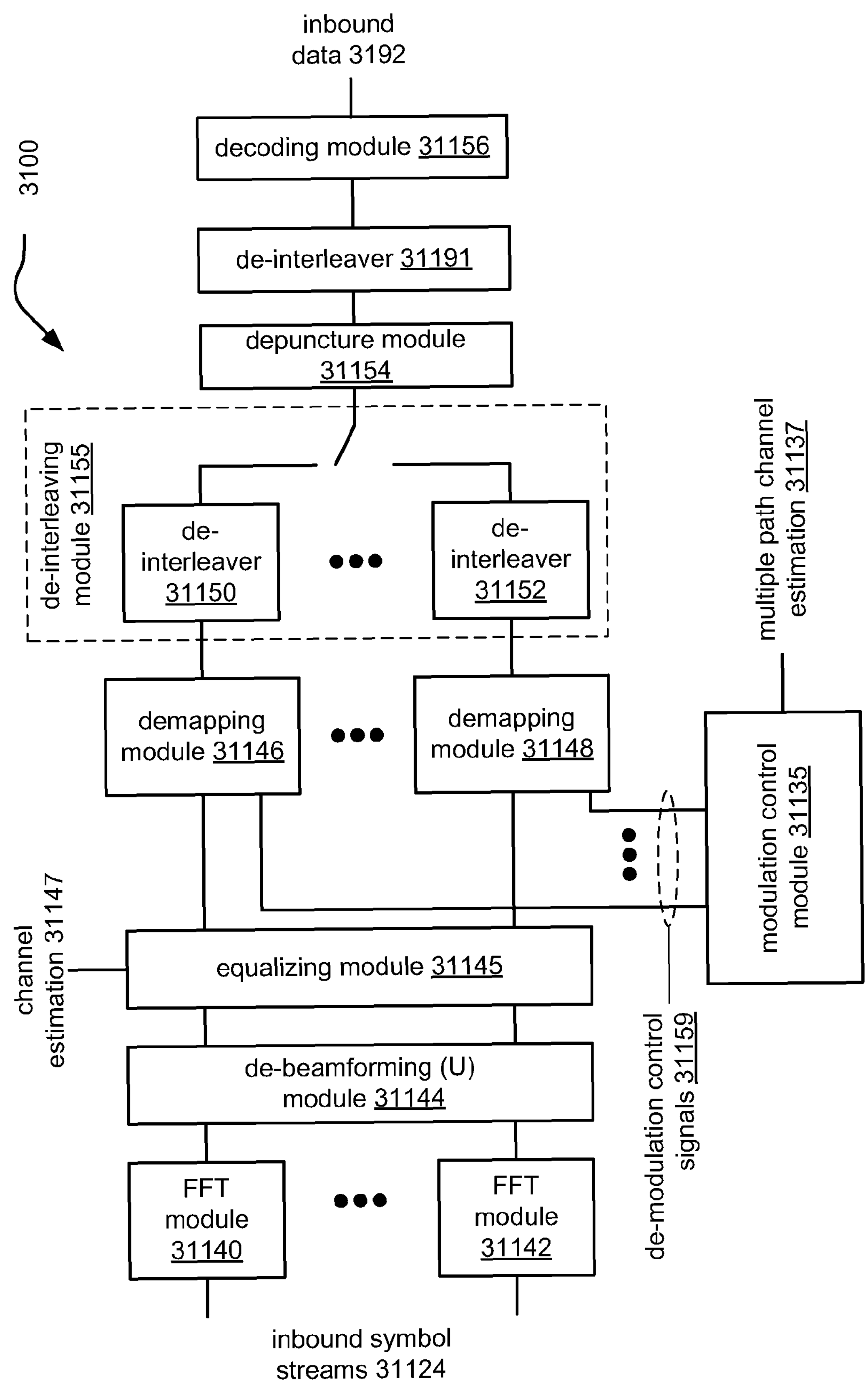

FIG. 31 illustrates an embodiment of baseband receive processing.

Figure 32:
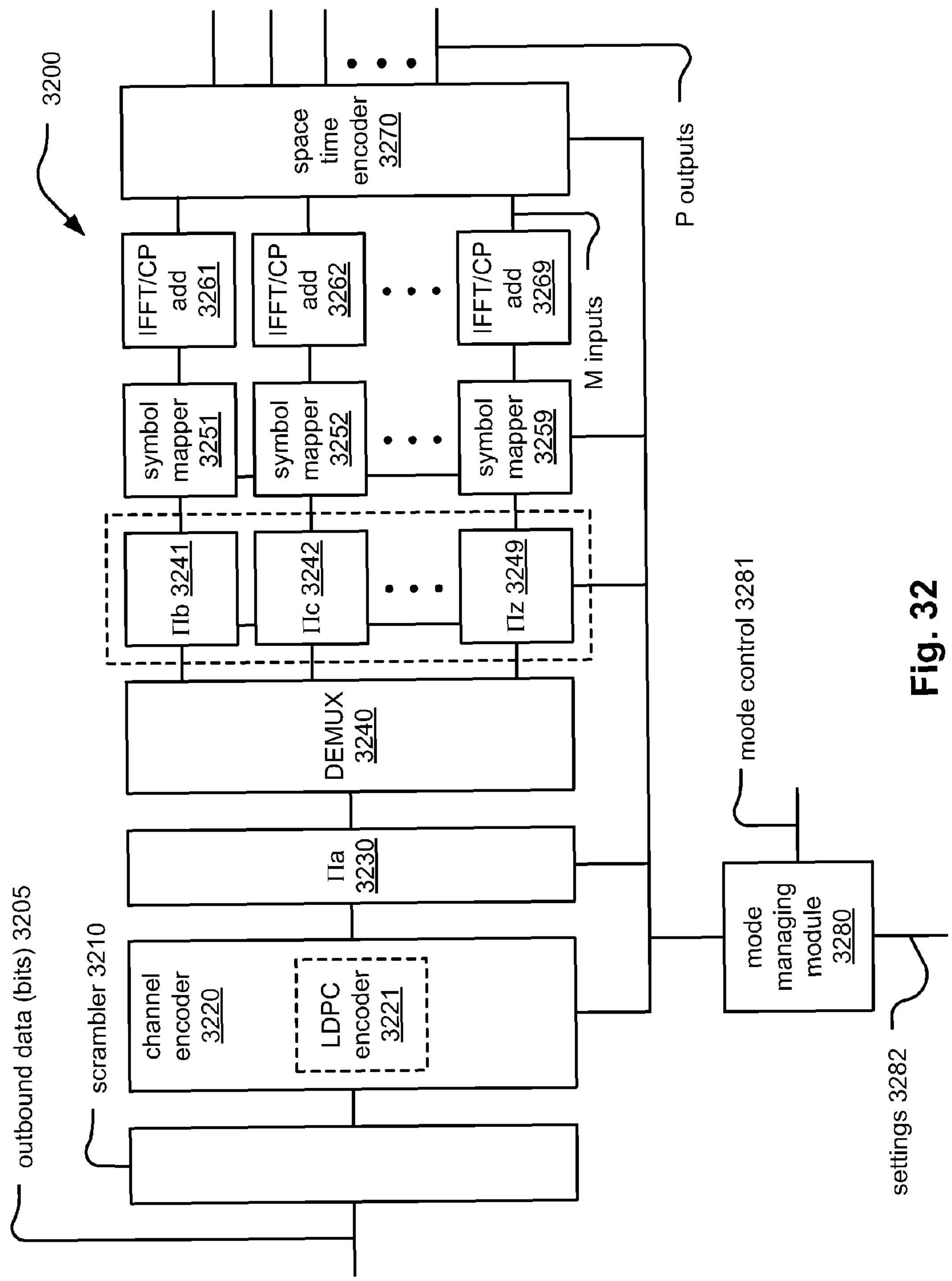

FIG. 32 illustrates an embodiment of transmit processing within a communication device.

Figure 33:
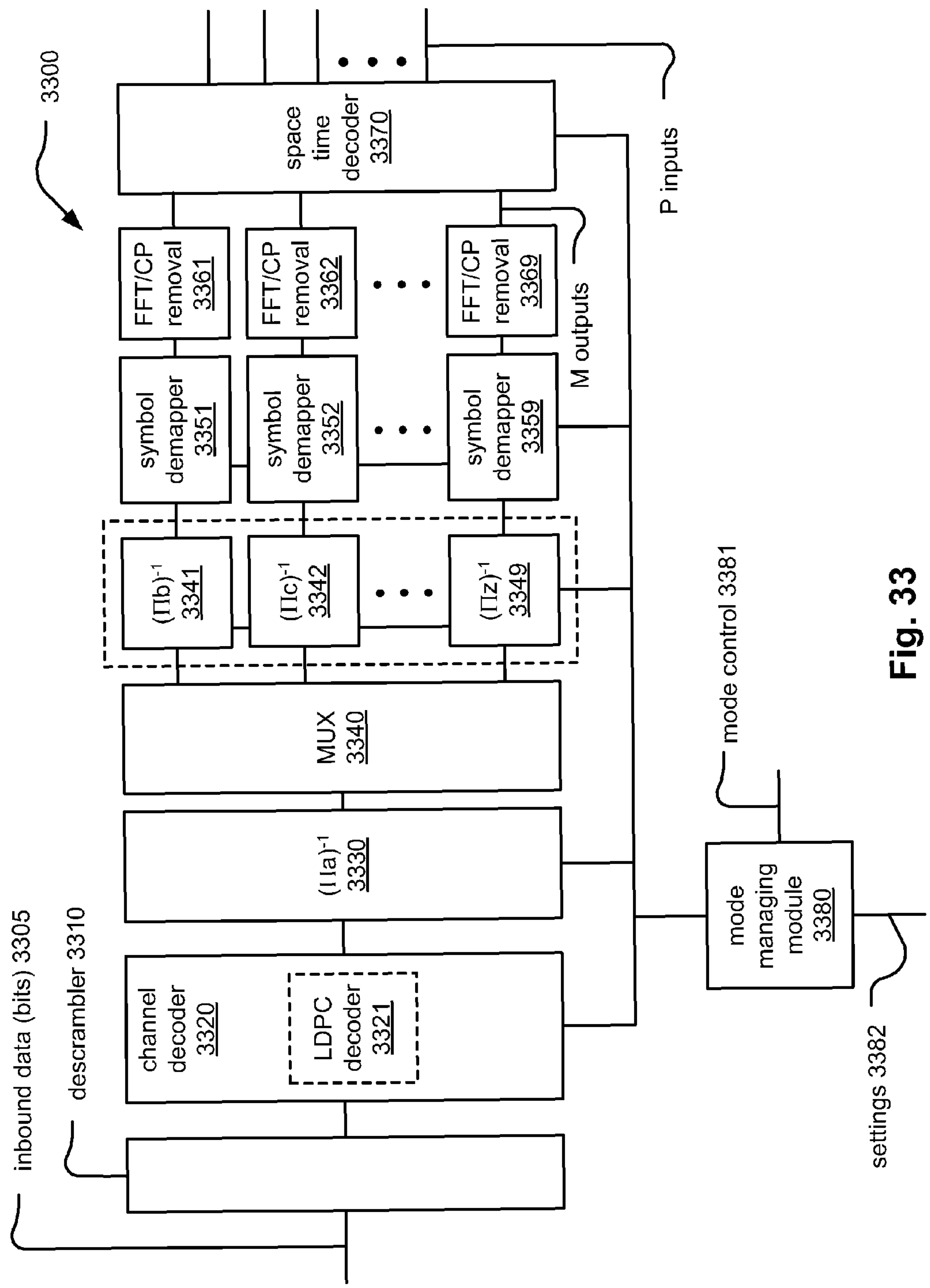

FIG. 33 illustrates an embodiment of receive processing within a communication device.

Figure 34:
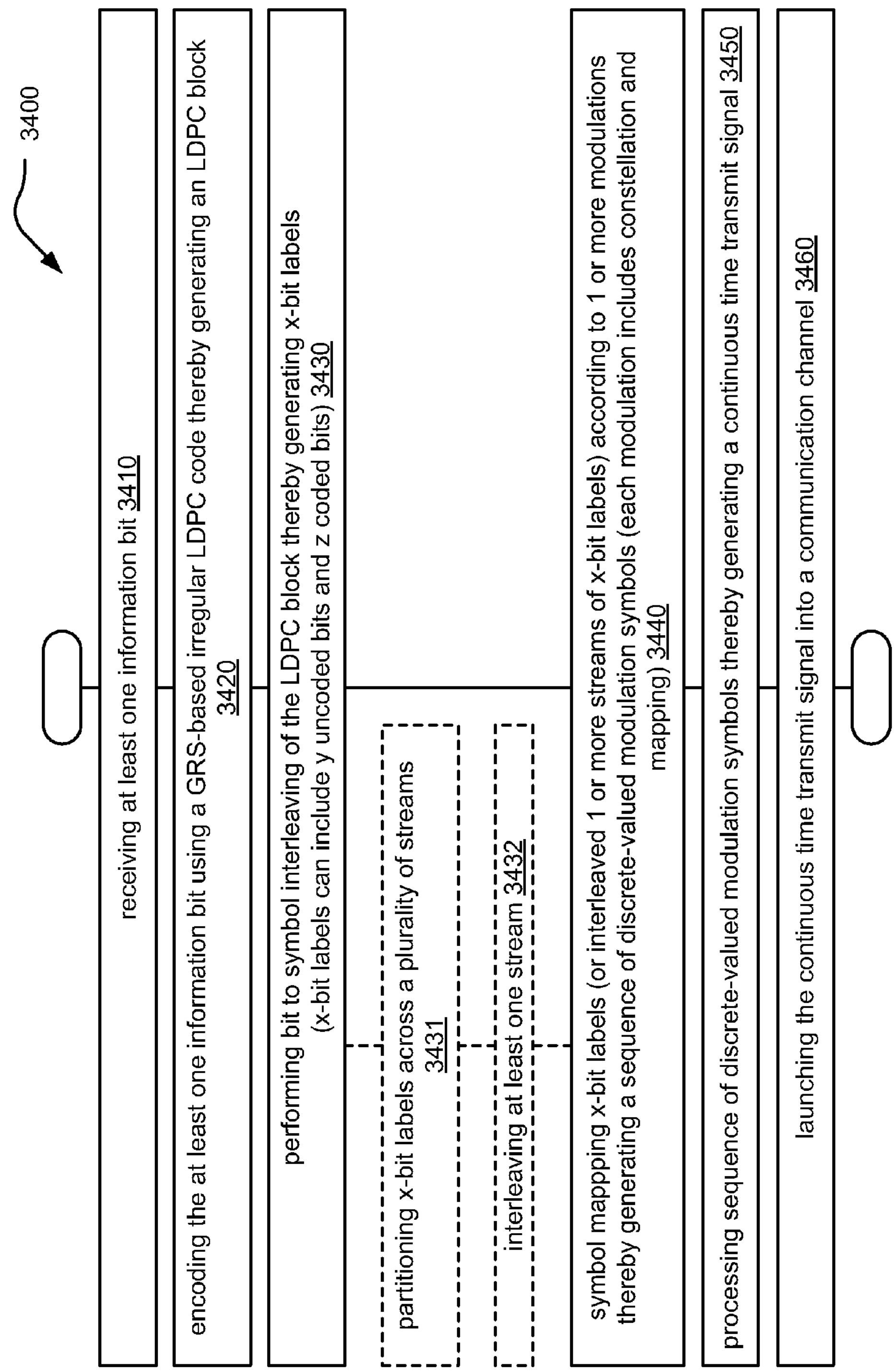

FIG. 34 illustrates an embodiment of a method for transmit processing.

Figure 35:
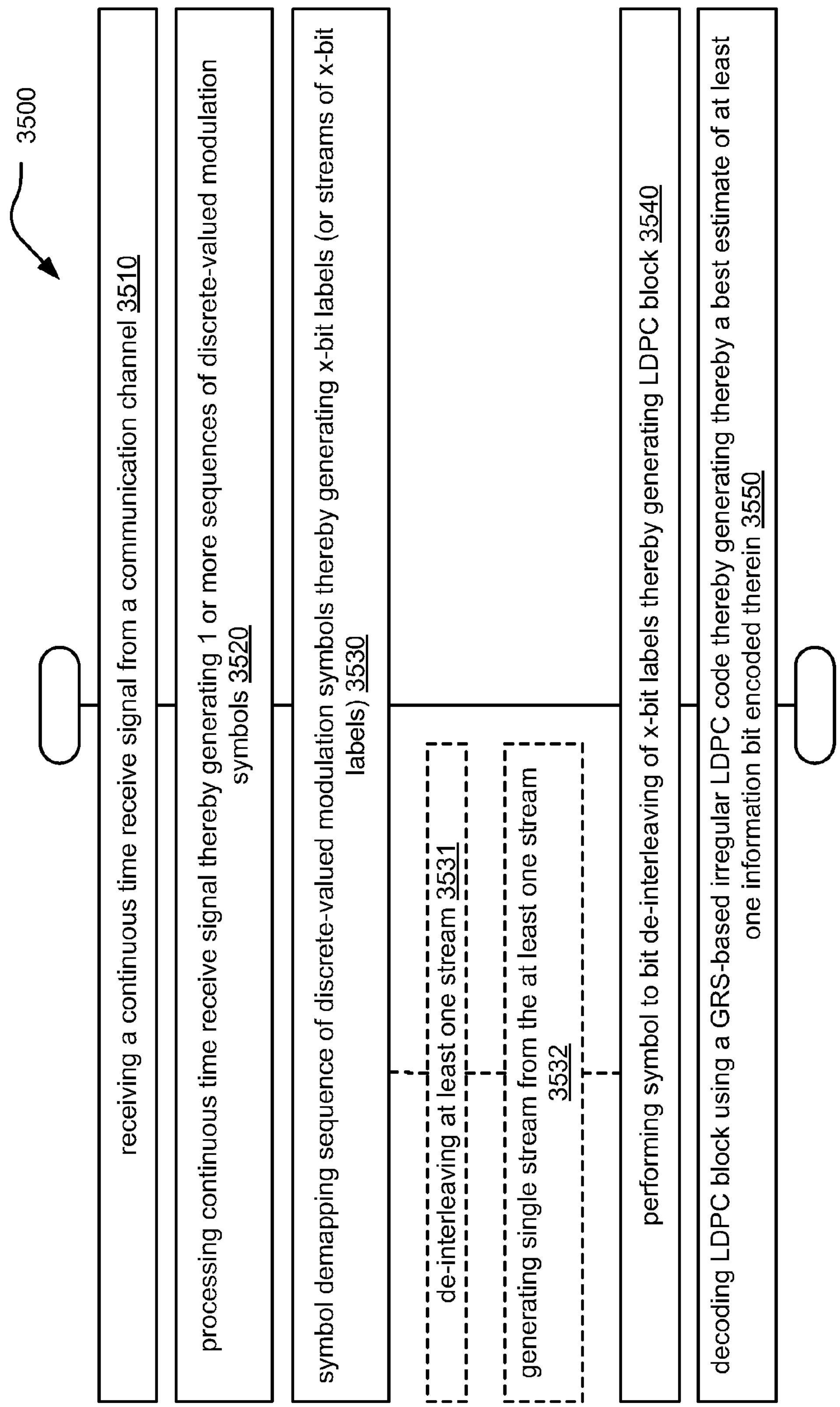

FIG. 35 illustrates an embodiment of a method for receive processing.

DETAILED DESCRIPTION OF THE INVENTION

A novel approach is presented that is operable to generate a wide variety of irregular LDPC (Low Density Parity Check) codes using RS (Reed-Solomon) code or GRS (Generalized Reed-Solomon) code. A designer is provided a great deal of latitude in generating many such irregular LDPC codes using these approaches. Certain of the inventors have invented means by which regular LDPC codes may be generated using GRS code. Using an RS code or GRS code to construct a regular LDPC code provides a good estimate of the minimum distance of the code. The error floor of this kind of regular LDPC code appears at a lower error rate. However, it is well known in the art that regular LDPC codes are not as good as irregular LDPC codes for achieving channel capacity (or Shannon limit) within a communication system.

In order to construct an LDPC code that performance good for both error floor and achieving capacity, a novel approach is presented by which irregular LDPC codes may be constructed based on RS codes or GRS code. Later in this disclosure, one possible embodiment shows that such one such irregular LDPC code gives 0.8 to 1 dB gain when compared to some known irregular LDPC codes in the application of recommendation practices and standards being developed by the IEEE (Institute of Electrical & Electronics Engineers) 802.11n Task Group (i.e., the Task Group that is working to develop a standard for 802.11 TGn (High Throughput)).

Before providing details into the construction of such LDPC codes, various descriptions of some of the communication systems and/or communication devices that may employ such LDPC codes are provided as well as some brief description of LDPC codes.

Figure 1:
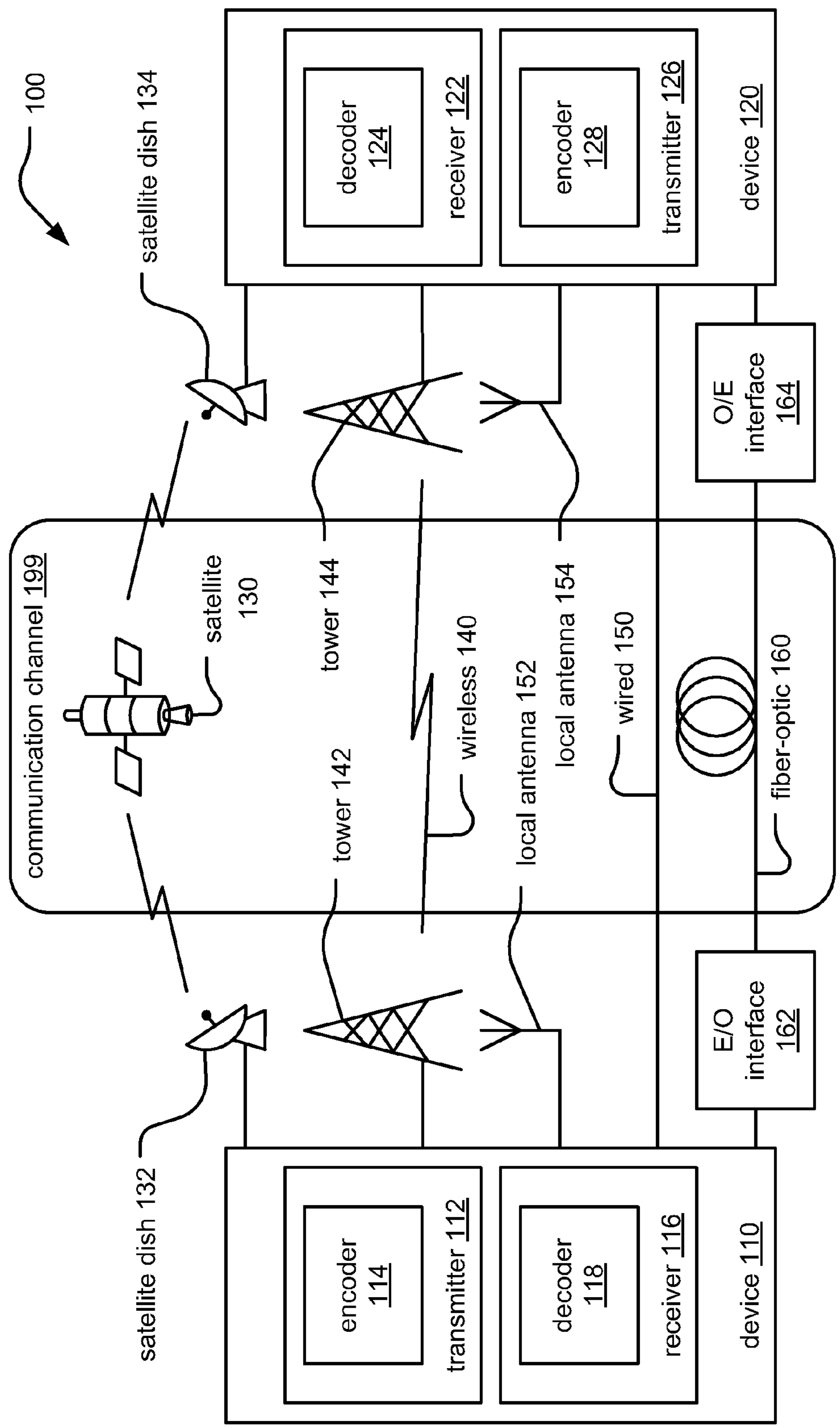
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
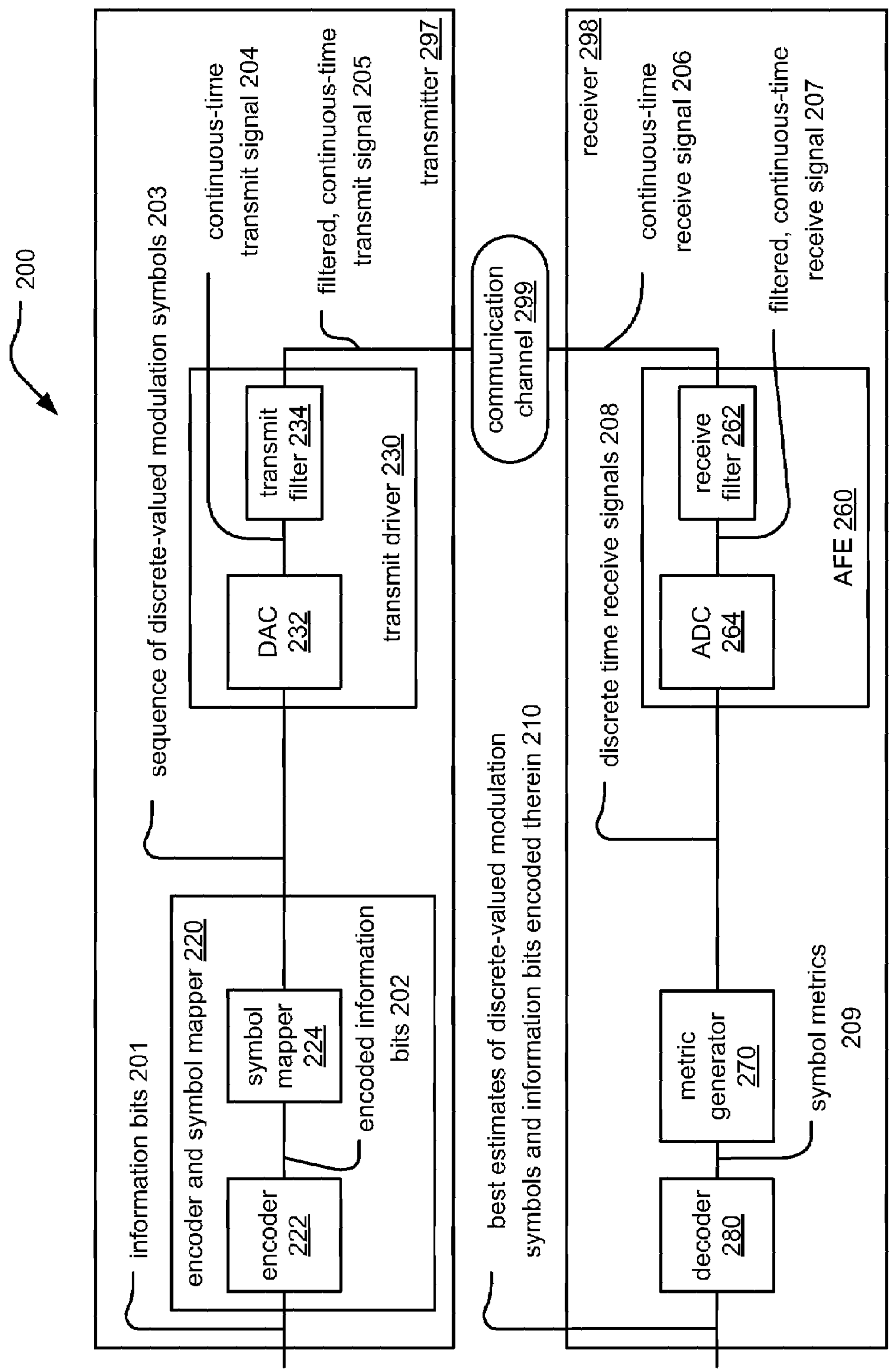

FIG. 1 and FIG. 2 are diagrams illustrating various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The communication devices of either of the previous embodiments can be implemented to include various decoding aspects described herein. In addition, several of the following Figures describe other and particular embodiments (some in more detail) that may be used to support the devices, systems, functionality and/or methods that may be implemented to perform decoding of LDPC codes signals. Before more details are provided below, a general description of LDPC codes is provided.

Several of the following Figures describe other and particular embodiments (some in more detail) that may be used to support the devices, systems, functionality and/or methods that may be implemented to perform decoding of LDPC coded signals. Before more details are provided below, a general description of LDPC codes is provided.

Figure 3:
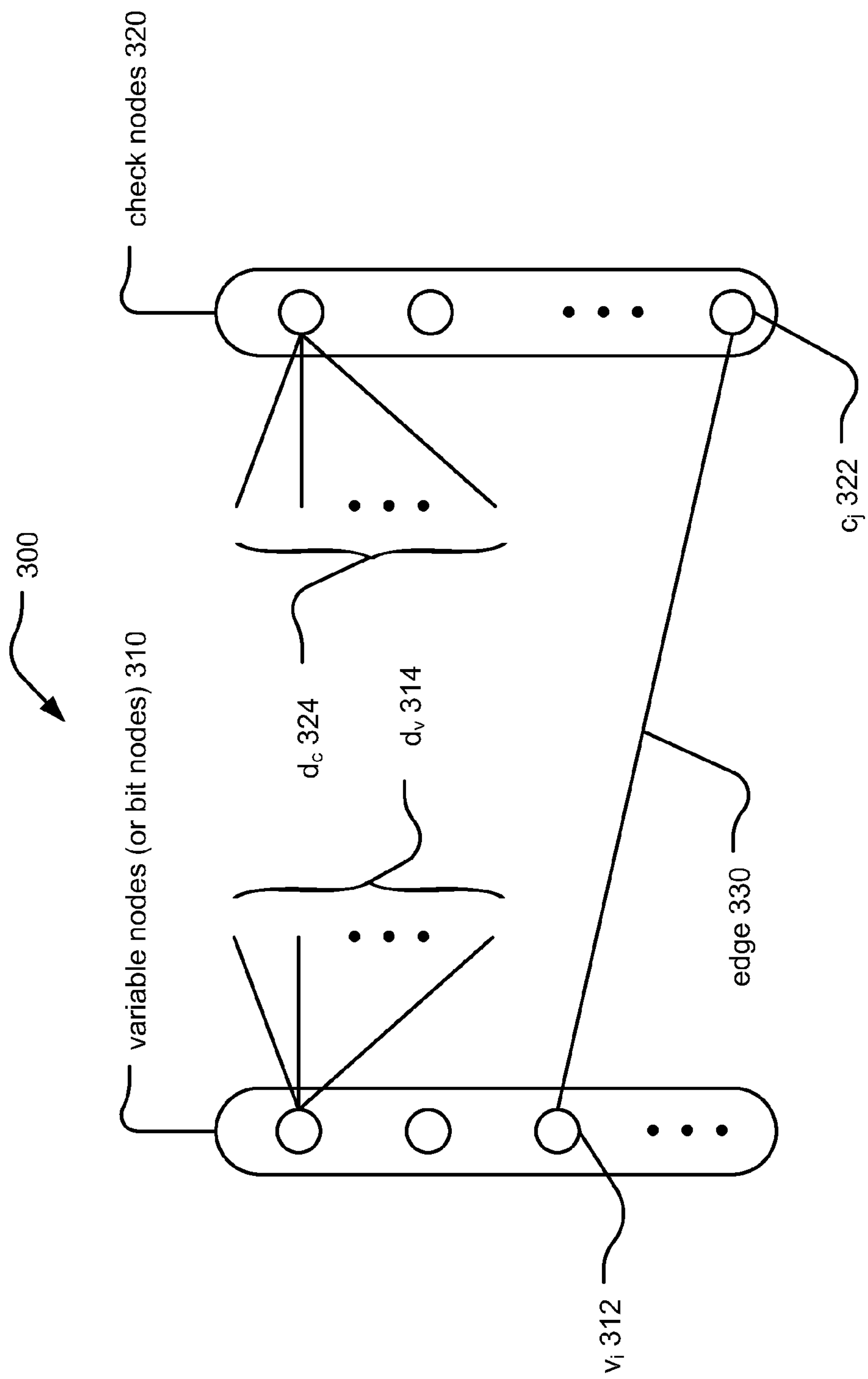
FIG. 3 illustrates an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M\times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes, Cambridge, Mass.: MIT Press,* 1963.

[2] M. Luby, M. Mitzenmacher, M. A. Shokrollahi, D. A. Spielman, and V. Stemann, "Practical Loss-Resilient Codes", *Proc. 29th Symp. on Theory of Computing,* 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i, j)$. However, on the other hand, given an edge $e=(i, j)$, the nodes of the edge may alternatively be denoted as by $e=(v(e),c(e))$ (or $e=(b(e), c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

Initially, some information regarding RS codes and GRS code is provided to assist in the reader in the understanding of the construction of irregular LDPC codes using RS codes or GRS codes in accordance with certain aspects of the invention.

Finite Field

Consider a finite field (Galois field) GF ($p^m$), where p is a prime number. Let α be a primitive element of this field. Then, $$GF(p^m)=\{0,\alpha,\ldots,\alpha^{p^m-}\}. \quad \text{(EQ 1)}$$

Two Codewords Generated from Dimension Two (2-D) RS Code

Let $\rho \leqq p^m-1$. Let C be a two dimensional (2-D) shortened RS code of length ρ. Then it is well known that the minimum distance of this RS code is $\rho-2+1=\rho-1$. Moreover, there are codewords in this code having weight (i.e., the number of non-zero elements) of ρ or ρ−1. One possible way to construct such a code is given in the following reference [a] (also identified above), and whose methodology can be described below.

[a] I. Djurdjevic, J. Xu., K. Abdel-Ghaffar, and S. Lin, "A Class of Low-Density Parity-Check Codes Constructed Based on Reed-Solomon Codes with Two Information Symbols," *IEEE Communications Letters*, Vol. 7, No. 7, July 2003, pp. 317-319.

Define a polynomial $g(x)\in GF(p^m)[x]$ such that $$g(x)=(x-\alpha)(x-\alpha^2)\ \ldots\ (x-\alpha^{\rho-2})=\sum_{i=0}^{\rho-2} g_i x^i \quad \text{(EQ 2)}$$

where $g_{\rho-2}=1$. Then using this polynomial, a 2-D code may be generated with the following generator matrix.

$$G=\begin{bmatrix} g_0 & g_1 & \ldots & g_{\rho-3} & 1 & 0 \\ 0 & g_0 & \ldots & g_{\rho-4} & g_{\rho-3} & 1 \end{bmatrix} \quad \text{(EQ 3)}$$

Next, a weight ρ codeword (e.g., $c_0$) and a weight ρ−1 codeword (e.g., $c_1$), are taken from the 2-D code C.

Alternatively, the two codewords from generalized Reed-Solomon (GRS) code may be generated as described in the U.S. provisional and U.S. utility patent applications that have been incorporated by reference in full detail above and that are briefly referenced again here.

1. U.S. Provisional Application entitled "Construction of LDPC (Low Density Parity Check) codes using generalized RS (Reed-Solomon) code," (60/642,689).

2. U.S. Utility patent application entitled "Construction of LDPC (Low Density Parity Check) codes using GRS (Generalized Reed-Solomon) code," (Ser. No. 11/190,333).

This alternative approach of using 2 codewords from GRS code to generate the LDPC code is briefly described here.

With GRS code, the integer ρ can be any number between 1 to $p^m$. Take a location set $L=\{\alpha^{i_0},\ldots,\alpha^{i_{\rho-1}}\}$. Take ρ non-zero elements $v_0, v_1, \ldots, v_{\rho-1}$ from the Galois field (i.e., GF ($p^m$)). Then one can generate a two dimensional (2-D) GRS code as follows:

$$C=\{(v_0f(\alpha^{i_0}),v_1f(\alpha^{i_1}),\ldots,v_{\rho-1}f(\alpha^{i_{\rho-1}}))|f\in GF(p^m)[x],\ \deg(f)<2\} \quad \text{(EQ 4)}$$

where $GF(p^m)[x]$ is a polynomial ring over Galois field (i.e., $GF(p^m)$). Take degree 1 polynomial $f_0=f_{0,1}x+f_{0,0}$ and $f_1=f_{1,1}x+f_{1,0}$, where $f_{i,j}\in GF(p^m)$, such that $f_0(\lambda)\neq 0$ for all $\lambda\in L$, and $f_1(x)\neq\beta f_0(x)$ for all $\beta\in GF(p^m)$. Then the two codewords of C may be represented as follows:

$$c_0=(v_0f_0(\alpha^{i_0}),v_1f_0(\alpha^{i_1}),\ldots,v_{\rho-1}f_0(\alpha^{i_{\rho-1}}))$$

$$c_1=(v_0f_1(\alpha^{i_0}),v_1f_1(\alpha^{i_1}),\ldots,v_{\rho-1}f_1(\alpha^{i_{\rho-1}})). \quad \text{(EQ 5)}$$

Two Codewords Generated from Dimension Two (2-D) RS Code

With the two codewords of the code C, (i.e., $c_0$, $c_1$), one can generate a one dimensional (1-D) RS code and $p^m-1$ cosets.

A first 1-D code may be generated as follows:

$$C_0=\{\beta c_0|\beta\in GF(p^m)\}=\{c_{0,0},c_{0,1},\ldots,c_{0,p^m-1}\} \quad \text{(EQ 6)}$$

Another $p^m-1$ cosets may be generated as follows:

$$C_i=\alpha^{i-1}c_1+C_0=\{\alpha^{i-1}c_1+x|x\in C_0\},i=1,\ldots,p^m-1 \quad \text{(EQ 7)}$$

Every coset $C_i$ may be denotes $C_i=\{c_{1,0},\ldots,c_{i,p^m-1}\}$. Moreover, every ρ-vector $c_{i,j}$ may be denoted by $c_{i,j}=(c_{i,j,0},\ldots,c_{i,j,\rho-1})$ where $c_{i,j,k}\in GF(p^m)$.

Regular LDPC Codes Generated by Words of the Cosets

Define a location map $L:GF(p^m)\rightarrow\{0,1\}^{p^m}$ such that $L(\alpha^i)$ is a $p^m$-vector and such that the i+1 is 1 and all other positions are 0. For example, L(0)=(10 . . . 0), L(α)=(010 . . . 0), and etc.

For every coset $C_i$, one can construct ρ separate $p^m\times p^m$-permutation matrices as follows:

$$P_{i,k}=\begin{bmatrix} L(c_{i,0,k}) \\ L(c_{i,1,k}) \\ \cdots \\ L(c_{i,p^m-2,k}) \\ L(c_{i,p^m-1,k}) \end{bmatrix},\ k=0,\ldots,\rho-1 \quad \text{(EQ 8)}$$

Choose a set of γ cosets, say $\{C_{i_1}, C_{i_2}, \ldots, C_{i_\gamma}\}$, a parity check matrix H can be constructed as follows:

$$H=\begin{bmatrix} P_{i_1,0} & P_{i_1,1} & \ldots & P_{i_1,\rho-1} \\ P_{i_2,0} & P_{i_2,1} & & P_{i_2,\rho-1} \\ \vdots & & \ddots & \\ P_{i_\gamma,0} & P_{i_\gamma,1} & & P_{i_\gamma,\rho-1} \end{bmatrix} \quad \text{(EQ 9)}$$

which is a low density matrix. Therefore, one can use this low density matrix to generate an LDPC code (having this low density matrix as a LDPC parity check matrix of the LDPC code). Clearly, such an LDPC code has a bipartite graph having bit degree γ and having check degree ρ. Also, such an LDPC code is a regular LDPC code.

In the Djurdjevic, et al. reference [a] identified above, it is shown that such an LDPC code has minimum distance at least γ+2 if γ is even, or γ+1 if γ is odd. In other words, the minimum distance, $d_{min}$, of such an LDPC code is provided as follows:

$$d_{min}\geq\begin{cases}\gamma+2 & \text{even } \gamma \\ \gamma+1 & \text{odd } \gamma\end{cases}$$

These kinds of LDPC codes may be referred to as RS-based LDPC codes or GRS-based regular LDPC codes. Since a RS code is a special case of the GRS code, the general term of GRS code is employed subsequently and may be viewed as including both any of the various RS codes as well as the GRS code.

Constructing GRS-Based Irregular LDPC Codes

In order to achieve both near capacity (or Shannon limit) and a lower error floor, a novel approach is presented herein to construct a GRS-based irregular LDPC code by modifying a GRS-based regular LDPC code that has been constructed according to the principles of H in (EQ 9) above. The generation of the parity check matrix that corresponds to this GRS-based irregular LDPC code is performed by replacing some permutation matrices of the parity check matrix that corresponds to the GRS-based regular LDPC code constructed according to (EQ 9) above within to all 0 matrices; this process of replacing a permutation matrix with an all zero-valued matrix can be referred to as "puncturing". That is to say, at least one permutation matrix within the parity check matrix is replaced with a zero matrix (i.e., a matrix having all 0 valued entries).

One design choice is which of the permutation matrices should be replaced by a zero matrix (i.e., a matrix having all 0 valued entries). There is wide latitude left to the designer to select which of the permutation matrices should be replaced by a zero matrix.

Figure 4:
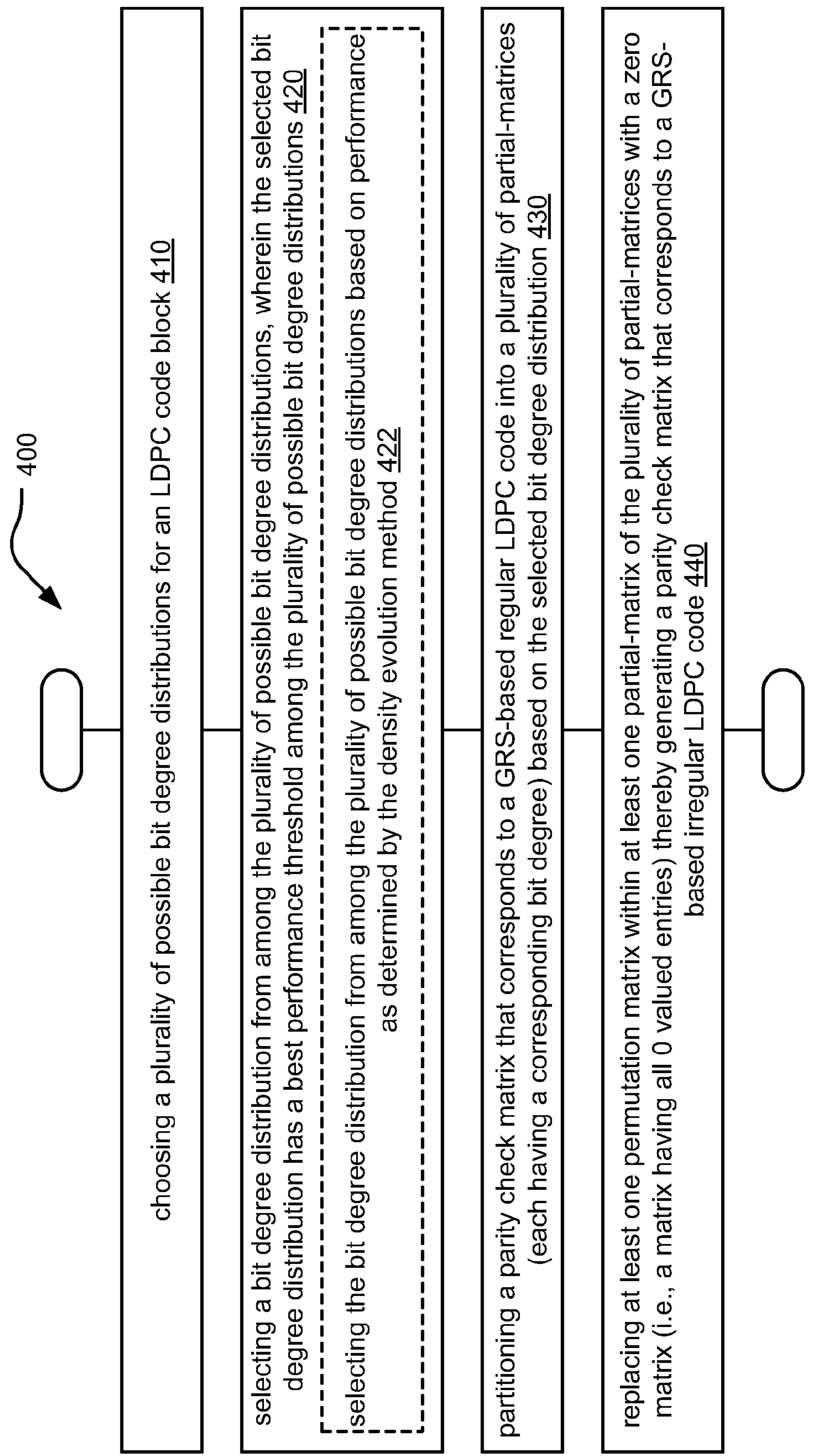
FIG. 4 illustrates an embodiment of a method for constructing a parity check matrix that corresponds to a GRS (Generalized Reed-Solomon)-based irregular LDPC (Low Density Parity Check) code.

FIG. 4 illustrates an embodiment of a method 400 for constructing a parity check matrix that corresponds to a GRS (Generalized Reed-Solomon)-based irregular LDPC (Low Density Parity Check) code.

As shown in a block 410, the method involves choosing a plurality of possible bit degree distributions for an LDPC code block. There is an understanding in the art that 3 different bit degrees in an LDPC code block (e.g., in the irregular LDPC code context) provides for best performance. However, it is noted that degree distributions that include other than 3 different types of bit degrees may also be employed without departing from the scope and spirit of the invention. Several of the embodiments described herein employ 3 different bit degree distributions The method then continues by selecting a bit degree distribution from among the plurality of possible bit degree distributions as shown in a block 420. It is noted that the selected bit degree distribution has a best performance threshold among the plurality of possible bit degree distributions. In some instances, the method may involve selecting the bit degree distribution from among the plurality of possible bit degree distributions based on performance as determined by the density evolution method, as shown in a block 422.

For example, the selection of which bit degree distribution to be employed may be performed using a theoretical method such as density evolution method to get the degree distribution. The density evolution method is described in detail in the following reference [3] (also identified above):

[3] T. J. Richardson and R. L. Urbanke, "The capacity of low-density parity-check code under message-passing decoding," *IEEE Trans. Inform. Theory*, Vol. 47, pp. 599-618, February 2001.

Given a code rate, one may first choose $\gamma$. Then, a parity check matrix, H, may be constructed to be a $\gamma p^m \times \rho p^m$ matrix of the form as described with respect to (EQ 9) above. The largest bit degree of the to-be-constructed GRS-based irregular LDPC code is then $\gamma$. A designed may also choose other degrees that are less than $\gamma$, as well as their corresponding bit degree distribution based on some other theoretical method. The number of bits within the block having the same bit degree will then be the multiple of $p^m$.

An example of the choosing of the plurality of possible bit degree distributions is provided below.

EXAMPLE 1

Let p=3, m=4, ρ=24 and γ=8. Then a GRS-based regular LDPC code can be constructed by a 648×1944H matrix containing 192 distinct 81×81 permutation matrices. It has bit degree 8 and check degree 24. As mentioned above, it is generally understood in the art that usually 3 different bit degrees provide for the best irregular LDPC codes. In this following example, the lowest degree is chosen as being a bit degree of 2. In general, the lowest bit degree within the bit degree distribution can be any number less than 8. Among all of the possible bit degree distributions for the LDPC code block, bit degree distributions including 3 distinct bit degree distributions are consider in this particular example. Specifically, 11 possible bit degree distributions are considered for the LDPC code block. The following table shows these 11 possible bit degree distributions:

TABLE 1

| | deg = 8 | deg = 7 | deg = 6 | deg = 5 | deg = 4 | deg = 3 | deg = 2 |
|---|---|---|---|---|---|---|---|
| D1 | 648 | | | | | 648 | 648 |
| D2 | 648 | | | | 648 | | 648 |
| D3 | 324 | | | | 972 | | 648 |
| D4 | 162 | | | | 1134 | | 648 |
| D5 | 486 | | | | 810 | | 648 |
| D6 | 648 | | | 648 | | | 648 |
| D7 | 216 | | | 1080 | | | 648 |
| D8 | 432 | | | 864 | | | 648 |
| D9 | 648 | | 648 | | | | 648 |
| D10 | 324 | | 972 | | | | 648 |
| D11 | 648 | 648 | | | | | 648 |

Using the density evolution method that is described in the Richardson, et al. reference identified above, it is found that the bit degree distribution, D3, is one of the best candidates. In general, one can use any method to select the bit degree distribution from among a plurality of possible bit degree distributions. For example, one may use the criterion of the bit degree distribution having the best performance threshold among the among the plurality of possible bit degree distributions. Alternatively, the density evolution method may be employed to select the bit degree distribution to be used to construct the GRS-based irregular LDPC code.

The parity check matrix corresponding to the bit degree distribution, D3, may be denoted as H. This parity check matrix, H, then contains 8×24 separate and distinct 81×81 sub-matrices (referred to as permutation matrices when not replaced by a zero matrix). The parity check matrix, H, has 4 columns of 8 permutation matrices, 12 columns of 4 permutation matrices and 8 columns of 2 permutation matrices. The rest of the sub-matrices are all zero matrices (i.e., matrices having all 0 valued entries). Thus, only 4×8+12×4+8×2=96 sub-matrices are permutation matrices. 192−96=96 permutation matrices in the original regular LDPC code needs to be replaced by all zero matrices.

As mentioned above, the method then involves selecting a bit degree distribution from among the plurality of possible bit degree distributions as shown in a block 120. The selection of which permutation matrix or permutation matrices should be replaced by all zero matrices may include a wide variety of design considerations. For example, after constructing a number of different GRS-based irregular LDPC codes, consideration may be given to the performance of the various GRS-based irregular LDPC codes (e.g., selecting the one providing the best performance), the ease/difficulty of a decoder's implementation (e.g., the hardware implementation) to decode such a coded signal in a particular application, as well as other design considerations without departing from the scope and spirit of the invention. It is noted that determination of which GRS-based LDPC code provides the best performance may require a great deal of intensive simulations by a designer.

EXAMPLE 1

Continued

The example provided above is continued here to show several possible selections of parity check matrices that correspond to a GRS-based irregular LDPC code. Subsequently and later in this disclosure, several performance comparisons are provides showing the improvement in performance provided by employing GRS-based irregular LDPC codes.

The method then continues by partitioning a parity check matrix that corresponds to a GRS-based regular LDPC code into a plurality of partial-matrices (each having a corresponding bit degree) based on the selected bit degree distribution, as shown in a block 430. The number of partial-matrices corresponds to the number of bit degrees within the selected bit degree distribution.

As an example of one possible embodiment, when the selected bit degree distribution includes 3 separate bit degrees, then the parity check matrix, H, may be decomposed into 3 separate partial-matrices. Continuing on with this example, this decomposed parity check matrix, H, may be denoted as follows:

$$H=[H_1,H_2,H_3] \quad \text{(EQ 10)}$$

When considering the bit degree distribution selected above, D3, then each of these partial-matrices has a corresponding bit degree. For example, according to the Table 1 provide above, the partial-matrix, $H_1$, has a bit degree of 8; the partial-matrix, $H_2$, has a bit degree of 4; and the partial-matrix, $H_3$, has a bit degree of 2. One possible design of the first partial-matrix, $H_1$, may be depicted as follows:

$$H_1 = \begin{bmatrix} P_{1,1} & P_{1,2} & P_{1,3} & P_{1,4} \\ P_{2,1} & P_{2,2} & P_{2,3} & P_{2,4} \\ P_{3,1} & P_{3,2} & P_{3,3} & P_{3,4} \\ P_{4,1} & P_{4,2} & P_{4,3} & P_{4,4} \\ P_{5,1} & P_{5,2} & P_{5,3} & P_{5,4} \\ P_{6,1} & P_{6,2} & P_{6,3} & P_{6,4} \\ P_{7,1} & P_{7,2} & P_{7,3} & P_{7,4} \\ P_{8,1} & P_{8,2} & P_{8,3} & P_{8,4} \end{bmatrix}.$$

This first partial-matrix, $H_1$, is a 648×423 matrix constructed by the individual permutation matrices, $P_{i,j}$, which are each 81×81 permutation matrices. It is noted that while many different values are employed in various examples within this disclosure, clearly many of these particular values described herein may be selected and modified by a designer of such a GRS-based irregular LDPC code to design an appropriate code for use in a particular application. In other words, these values are employed to assist the reader in understanding the various aspects of the invention, and a designer is free to employ other values to design a different GRS-based irregular LDPC code.

The method continues by replacing at least one permutation matrix within at least one partial-matrix of the plurality of partial-matrices with a zero matrix (i.e., a matrix having all 0 valued entries) thereby generating a parity check matrix that corresponds to a GRS-based irregular LDPC code, as shown in a block 440.

There are a wide variety of means by which certain one or more of the permutation matrices may be replaced by zero matrices.

One possible design of the second partial-matrix, $H_2$, (after modification being depicted as $H_2^1$), may be depicted as follows:

$$H_2^1 = \begin{bmatrix} P_{1,5} & & & P_{1,8} & P_{1,9} & & & P_{1,12} & P_{1,13} & & & P_{1,16} \\ P_{2,5} & & & P_{2,8} & P_{2,9} & & & P_{2,12} & P_{2,13} & & & P_{2,16} \\ P_{3,5} & P_{3,6} & & & P_{3,9} & P_{3,10} & & & P_{3,13} & P_{4,13} & & \\ P_{4,5} & P_{4,6} & & & P_{4,9} & P_{4,10} & & & P_{4,13} & P_{4,14} & & \\ & P_{5,6} & P_{5,7} & & & P_{5,10} & P_{5,11} & & & P_{5,14} & P_{5,15} & \\ & P_{6,6} & P_{6,7} & & & P_{6,10} & P_{6,11} & & & P_{6,14} & P_{6,15} & \\ & & P_{7,7} & P_{7,8} & & & P_{7,11} & P_{7,12} & & & P_{7,15} & P_{7,16} \\ & & P_{8,7} & P_{8,8} & & & P_{8,11} & P_{8,12} & & & P_{8,15} & P_{8,16} \end{bmatrix}$$

This second modified partial-matrix, $H_2^1$, is a 648×972 matrix such that the each of the empty positions of the matrix represents an 81×81 zero matrix (e.g., all 81×81 entries therein being 0) and the remaining matrices, $P_{i,j}$, are all corresponding permutation matrices.

An alternative possible design of the second partial-matrix, $H_2$, (after modification being depicted as $H_2^2$), may be depicted as follows:

$$H_2^2 = \begin{bmatrix} P_{1,5} & & P_{1,7} & & P_{1,6} & & P_{1,9} & & P_{1,11} & & P_{1,13} & \\ & P_{2,6} & & P_{2,5} & & P_{2,8} & & P_{2,10} & & P_{2,12} & & P_{2,14} \\ P_{2,5} & & P_{3,7} & & P_{3,6} & & P_{3,9} & & P_{3,11} & & P_{3,13} & \\ & P_{4,6} & & P_{4,5} & & P_{4,8} & & P_{4,10} & & P_{4,12} & & P_{4,14} \\ P_{5,5} & & P_{5,7} & & P_{5,6} & & P_{5,9} & & P_{5,11} & & P_{5,13} & \\ & P_{6,6} & & P_{6,5} & & P_{6,8} & & P_{6,10} & & P_{6,12} & & P_{6,14} \\ P_{7,5} & & P_{7,7} & & P_{7,6} & & P_{7,9} & & P_{7,11} & & P_{7,13} & \\ & P_{8,6} & & P_{8,5} & & P_{7,8} & & P_{8,10} & & P_{7,12} & & P_{8,14} \end{bmatrix}$$

This alternative embodiment of the modified second partial-matrix, $H_2^2$, is a 648×972 matrix such that the each of the empty positions of the matrix represents an 81×81 zero matrix (e.g., all 81×81 entries therein being 0) and the remaining matrices, $P_{i,j}$, are all corresponding permutation matrices.

One possible design of the third partial-matrix, $H_3$, (after modification being depicted as $H_3^1$), may be depicted as follows:

$$H_3^1 = \begin{bmatrix} P_{1,17} & P_{1,18} & & & & & & \\ & P_{2,18} & P_{2,19} & & & & & \\ & & P_{3,19} & P_{3,20} & & & & \\ & & & P_{4,20} & P_{4,21} & & & \\ & & & & P_{5,21} & P_{5,22} & & \\ & & & & & P_{6,22} & P_{6,23} & \\ & & & & & & P_{7,23} & P_{7,24} \\ P_{8,17} & & & & & & & P_{8,24} \end{bmatrix}$$

This first embodiment of the modified third partial-matrix, $H_3^1$, is a 648×648 matrix such that the each of the empty positions of the matrix represents an 81×81 zero matrix (e.g., all 81×81 entries therein being 0) and the remaining matrices, $P_{i,j}$, are all corresponding permutation matrices.

An alternative possible design of the third partial-matrix, $H_3$, (after modification being depicted as $H_3^2$), may be depicted as follows:

$$H_3^2 = \begin{bmatrix} P_{1,17} & & & & & & & P_{1,24} \\ P_{2,17} & P_{2,18} & & & & & & \\ & P_{3,18} & P_{3,19} & & & & & \\ & & P_{4,19} & P_{4,20} & & & & \\ & & & P_{5,20} & P_{5,21} & & & \\ & & & & P_{6,21} & P_{6,22} & & \\ & & & & & P_{7,22} & P_{7,23} & \\ & & & & & & P_{8,23} & P_{8,24} \end{bmatrix}$$

This alternative embodiment of the modified third partial-matrix, $H_3^2$, is also a 648×648 matrix such that the each of the empty positions of the matrix represents an 81×81 zero matrix (e.g., all 81×81 entries therein being 0) and the remaining matrices, $P_{i,j}$, are all corresponding permutation matrices.

There is a wide variety of means by which each of these partial matrices may modified thereby generating a parity check matrix that corresponds to a GRS-based irregular LDPC code. A designer has great latitude to select which of the permutation matrices are to be replaced by zero matrices. These various embodiments of modified partial-matrices illustrate just some possible examples by which the parity check matrix may be generated.

Using just this small number of modified partial-matrices, a number of different parity check matrices may be generated as indicated below.

$$H(1)=[H_1,H_2^1,H_3^1]$$

$$H(2)=[H_1,H_2^1,H_3^2]$$

$$H(3)=[H_1,H_2^2,H_3^1]$$

$$H(4)=[H_1,H_2^1,H_3^1]$$

Two of these possible parity check matrices are looked at in closer detail below.

Now, a GRS-based regular LDPC code ($LDPC_0$) may be constructed according to the constraints and design of the (EQ 9) as shown above. The same values of p=3, m=4, ρ=24 and γ=8 may be employed as was given above with respect to the Example 1. This GRS-based regular LDPC code ($LDPC_0$) code has rate 0.67.

Then, a parity check matrix that corresponds to a GRS-based irregular LDPC code ($LDPC_1$) may be constructed using the modified partial-matrices depicted as follows:

$$H(1)=[H_1,H_2^1,H_3^1] \qquad \text{(EQ 11)}$$

This GRS-based irregular LDPC code ($LDPC_1$) has code rate 0.667.

Then, a parity check matrix that corresponds to another GRS-based irregular LDPC code ($LDPC_2$) may be constructed using the modified partial-matrices depicted as follows:

$$H(2)=[H_1,H_2^1,H_3^2] \qquad \text{(EQ 12)}$$

This GRS-based irregular LDPC code ($LDPC_2$) also has code rate 0.667.

The following diagram shows an embodiment of how one GRS-based irregular LDPC code may be selected during a design approach from among a plurality of GRS-based irregular LDPC codes.

Figure 5:
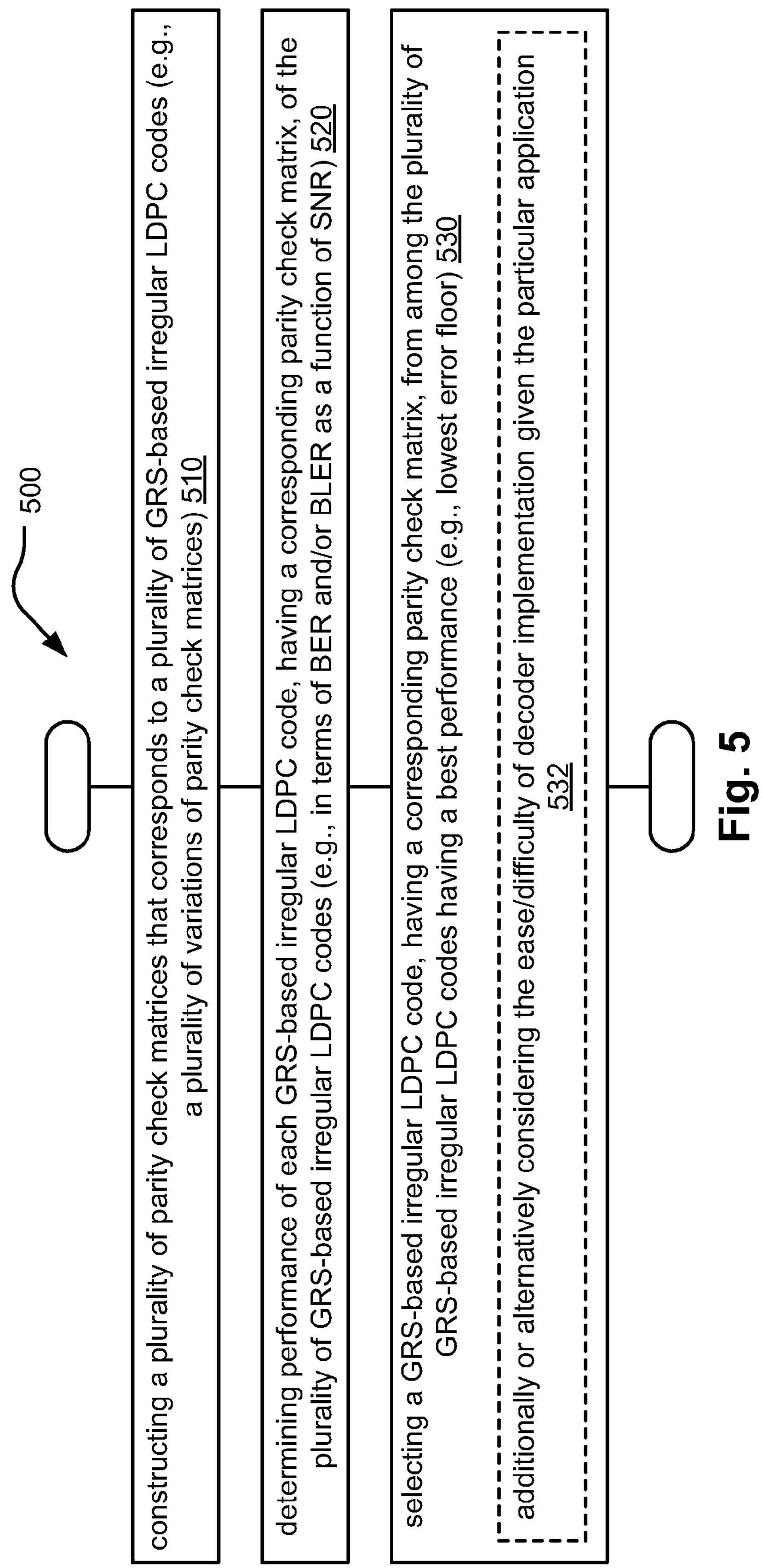
FIG. 5 illustrates an embodiment of a method for selecting a GRS-based irregular LDPC code.

FIG. 5 illustrates an embodiment of a method 500 for selecting a GRS-based irregular LDPC code. This method involves generating a plurality of parity check matrices that corresponds to a plurality of GRS-based irregular LDPC codes (e.g., a plurality of variations of parity check matrices), as shown in a block 510. The various embodiments described above may be employed to generate the plurality of parity check matrices that corresponds to a plurality of GRS-based irregular LDPC codes. Then, as shown in a block 520, the method involves determining the performance of each GRS-based irregular LDPC code, having a corresponding parity check matrix, of the plurality of GRS-based irregular LDPC codes (e.g., in terms of BER and/or BLER as a function of SNR). The method then involves selecting a GRS-based irregular LDPC code, having a corresponding parity check matrix, from among the plurality of GRS-based irregular LDPC codes having a best performance, as shown in a block 530. In some instances, this best performance may be viewed in terms of which GRS-based irregular LDPC code has the lowest error floor in terms of BER/BLER as a function of SNR. The selection of which of the GRS-based irregular LDPC codes should be selected may include additionally or alternatively considering the ease/difficulty of decoder implementation given the particular application, as shown in a block 532.

Figure 6:
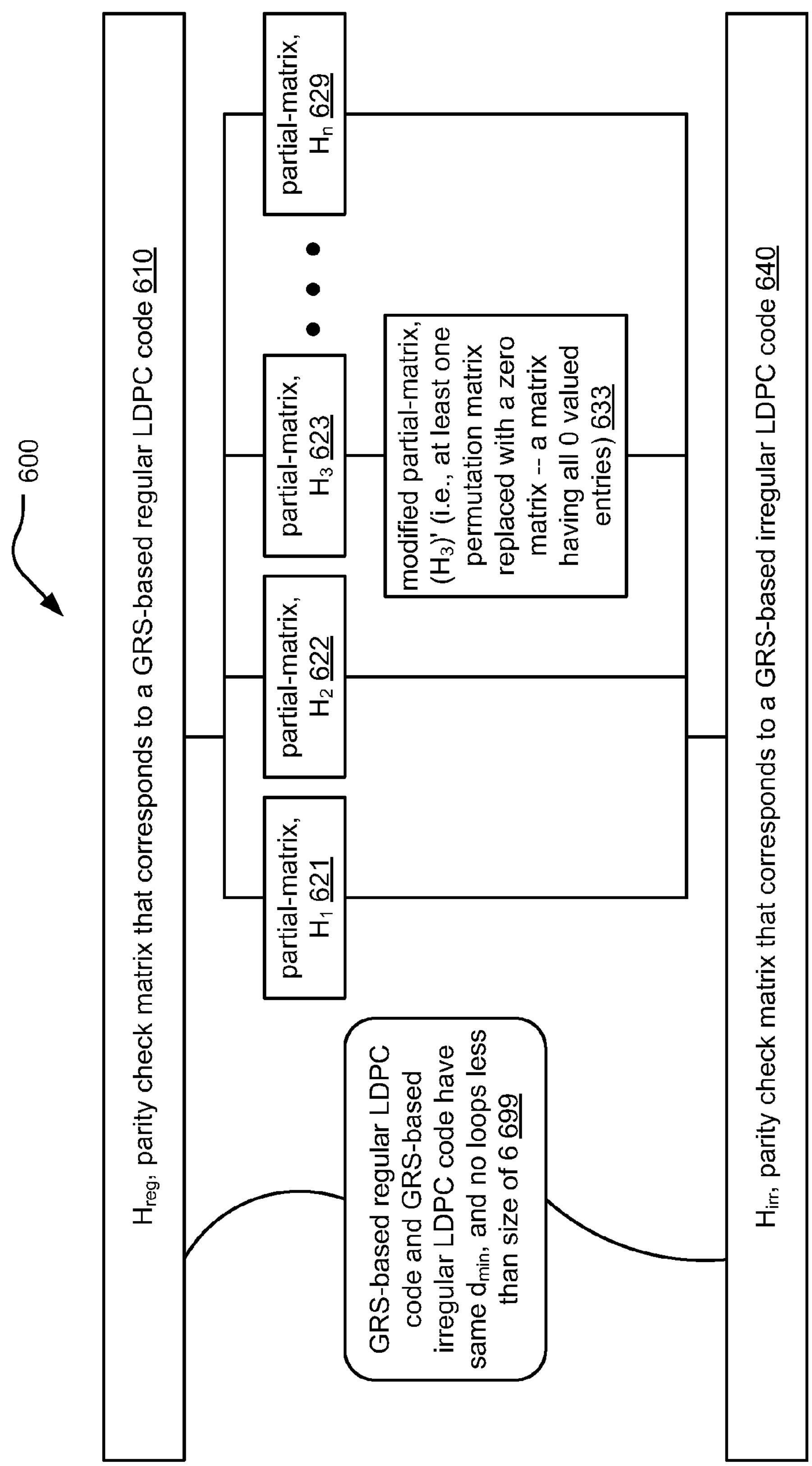
FIG. 6 illustrates an embodiment of generation of a parity check matrix that corresponds to a GRS-based irregular LDPC code using a parity check matrix that corresponds to a GRS-based regular LDPC code.

FIG. 6 illustrates an embodiment 600 of generation of a parity check matrix that corresponds to a GRS-based irregular LDPC code using a parity check matrix that corresponds to a GRS-based regular LDPC code. This diagram may assist the reader in understanding the manner by which the parity check matrix is constructed.

As can be seen, a parity check matrix, $H_{reg}$, that corresponds to a GRS-based regular LDPC code, as indicated by reference numeral 610, is decomposed into a plurality of partial-matrices (shown as partial matrix, $H_1$ 621, partial matrix, $H_2$ 622, partial matrix, $H_3$ 623, and . . . partial matrix, $H_n$ 629). The number of partial-matrices into which the parity check matrix, $H_{reg}$, that corresponds to a GRS-based regular LDPC code is decomposed may be selected by the designer of the GRS-based irregular LDPC code.

Then, at least one of these partial-matrices (e.g., partial matrix, $H_3$ 623) is modified by replacing at least one of the permutation matrices therein with a zero matrix (i.e., a matrix having all 0 valued entries); this modified partial-matrix is referred to as partial-matrix, $(H_3)'$ 633. Also, any one of the partial-matrices may be modified; the partial-matrix, $H_3$ 623 being modified into the partial-matrix, $(H_3)'$ 633 is shown in this diagram just as one possible design choice. Clearly, other of the partial-matrices may alternatively be modified. In addition, more than one of the partial-matrices may be modified without departing from the scope and spirit of the invention.

Thereafter, these partial-matrices are then employed to generate a parity check matrix, $H_{irr}$, that corresponds to a GRS-based irregular LDPC code, as indicated by reference numeral 640.

The minimum distance, $d_{min}$, of such a GRS-based irregular LDPC code is provided as follows:

$$d_{min} \geq \begin{cases} \gamma + 2 & \text{even } \gamma \\ \gamma + 1 & \text{odd } \gamma \end{cases}$$

It is also noted, as indicated by reference numeral 699, that the minimum distance, $d_{min}$, of such the GRS-based irregular LDPC code is the same minimum distance, $d_{min}$, of the GRS-based regular LDPC code that is used to generate the GRS-based irregular LDPC code. In other words, both of the GRS-based irregular LDPC code and the GRS-based regular LDPC code has the same minimum distance, $d_{min}$. Also, as indicated by the reference numeral 699, each of the GRS-based irregular LDPC code and the GRS-based regular LDPC code has no loops less than size of 6. There are no size 4 loops in either of the LDPC bipartite graphs that correspond to either of the GRS-based irregular LDPC code and the GRS-based regular LDPC code.

Also, the corresponding LDPC bipartite graph for such a GRS-based irregular LDPC code will have no cycle (or loop) that is less than or equal to 4. The minimum cycle (or loop) of the corresponding LDPC bipartite graph would then be 6. That is to say, each loop of an LDPC bipartite graph that corresponds to the GRS-based irregular LDPC code is at least a size of 6; the code should have no size 4 loops.

Moreover, given the fact that the GRS-based irregular LDPC code is in fact an "irregular" LDPC code, it will provide for better performance than that of a "regular" LDPC code.

In this disclosure, various performance diagrams are described in the context of BLER (Block Error Rate) versus $E_b/N_o$ (ratio of energy per bit $E_b$ to the Spectral Noise Density $N_o$). BLER is oftentimes used in the context of wireless communications where if any one bit in a block is determined to be in error, then the entire block is determined to be in error. In some other communication system application, performance may be viewed in terms of BER (Bit Error Rate) vs. $E_b/N_o$. This term $E_b/N_o$ is the measure of SNR (Signal to Noise Ratio) for a digital communication system. When looking at these performance curves, the BLER may be determined for any given $E_b/N_o$ (or SNR) thereby providing a relatively concise representation of the performance of the decoding approach.

Several different performance comparisons are provided below that show the improved performance provided by a GRS-based irregular LDPC code when compared to some other codes.

Figure 7:
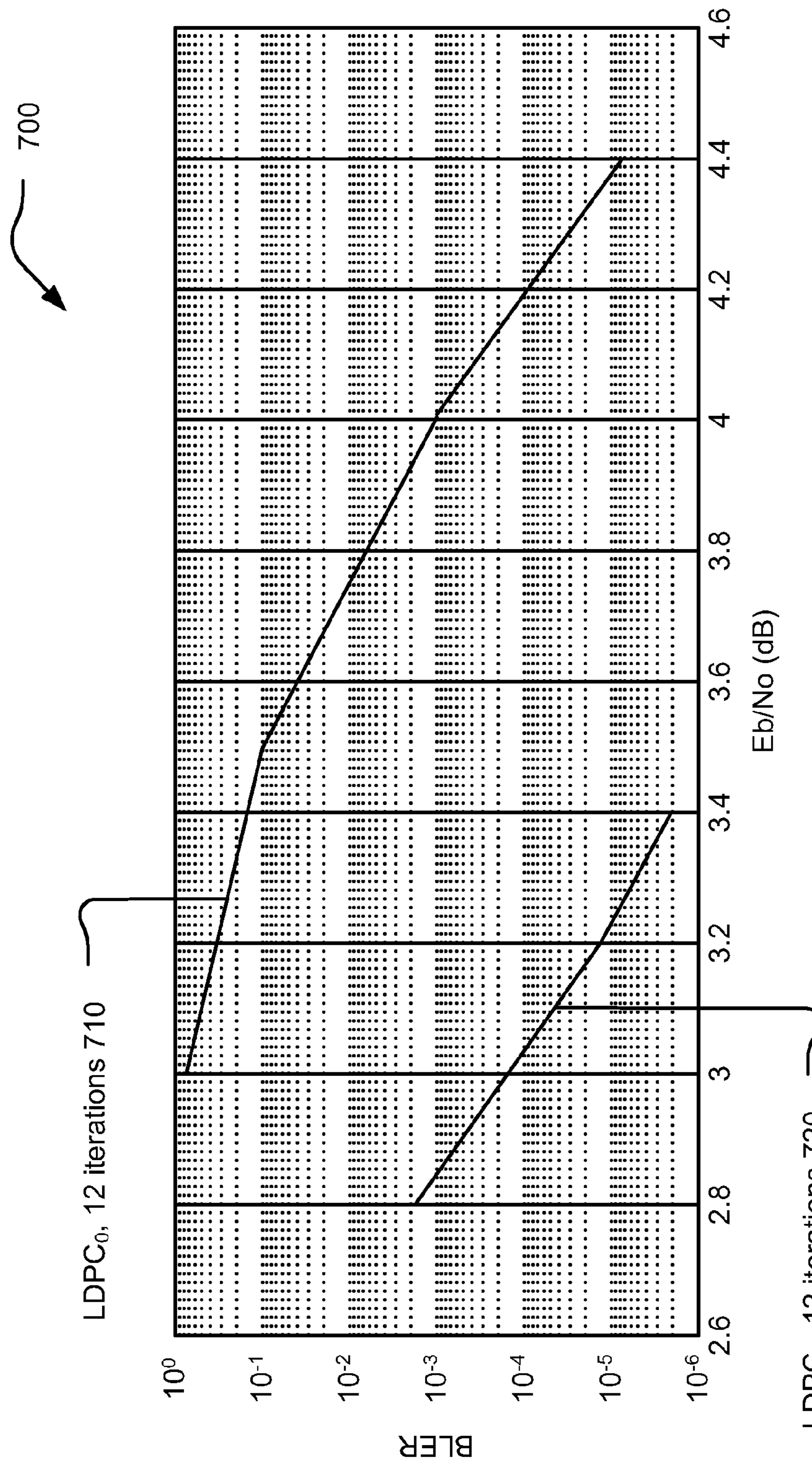
FIG. 7 illustrates an embodiment of a performance comparison between a GRS-based regular LDPC code ($LDPC_0$)

FIG. 7 illustrates an embodiment of a performance comparison 700 between a GRS-based regular LDPC code ($LDPC_0$) (shown by reference numeral 710) and a second GRS-based irregular LDPC code ($LDPC_2$) (shown by reference numeral 720) on an AWGN (Additive White Gaussian Noise) communication channel.

This first example considers BPSK (Binary Phase Shift Key) modulation and an AWGN (Additive White Gaussian Noise) communication channel. These performance curves shows that at BLER=1.5×10−5, $LDPC_2$ over-performing $LDPC_0$ by 1.2 dB.

FIG. 8 illustrates an embodiment of a performance comparison 800 between a GRS-based irregular LDPC code ($LDPC_2$) (shown by reference numeral 820) and an alternative LDPC code, LDPC(a) (shown using reference numeral 810), on an AWGN communication channel.

The LDPC code, $LDPC_2$, depicted in each of FIG. 7 and FIG. 8 has the corresponding parity check matrix of EQ (12) as provided above. Again, this GRS-based irregular LDPC code ($LDPC_2$) has code rate 0.667.

This diagram compares codes $LDPC_2$ to a rate ⅔ code that is depicted by LDPC(a). This rate ⅔ code (LDPC(a)) is provided by the reference [4] cited below.

[4] LDPC code motion for Mon 28 Feb. 2005 Telecon, WWiSE consortium.

The WWiSE is the WWiSE (World Wide Spectrum Efficiency) is an alliance of companies and entities developing a proposal for the IEEE 802.11n Wireless LAN Standard. More information related to the WWiSE may be found publicly on the WWiSE's maintained Internet site.

The following performance curves shows that at BLER=1.5×10−5, $LDPC_2$ over-performing the alternative LDPC code, LDPC(a), by 0.55 dB.

In the IEEE 802.11n application, the Rayleigh fading communication channel is considered and the modulation is 64 QAM (Quadrature Amplitude Modulation) with the mapping given in IEEE 802.11a standard as referenced below in [5]:

[5] Part 11: Wireless LAN Medium Access Control (MAC) and Physical Layer (PHY) specifications: High-speed Physical Layer in the 5 GHZ Band, *IEEE Std* 802.11a-1999.

The entirety of this document is publicly available and may be downloaded from the IEEE's maintained Internet site.

Figure 9:
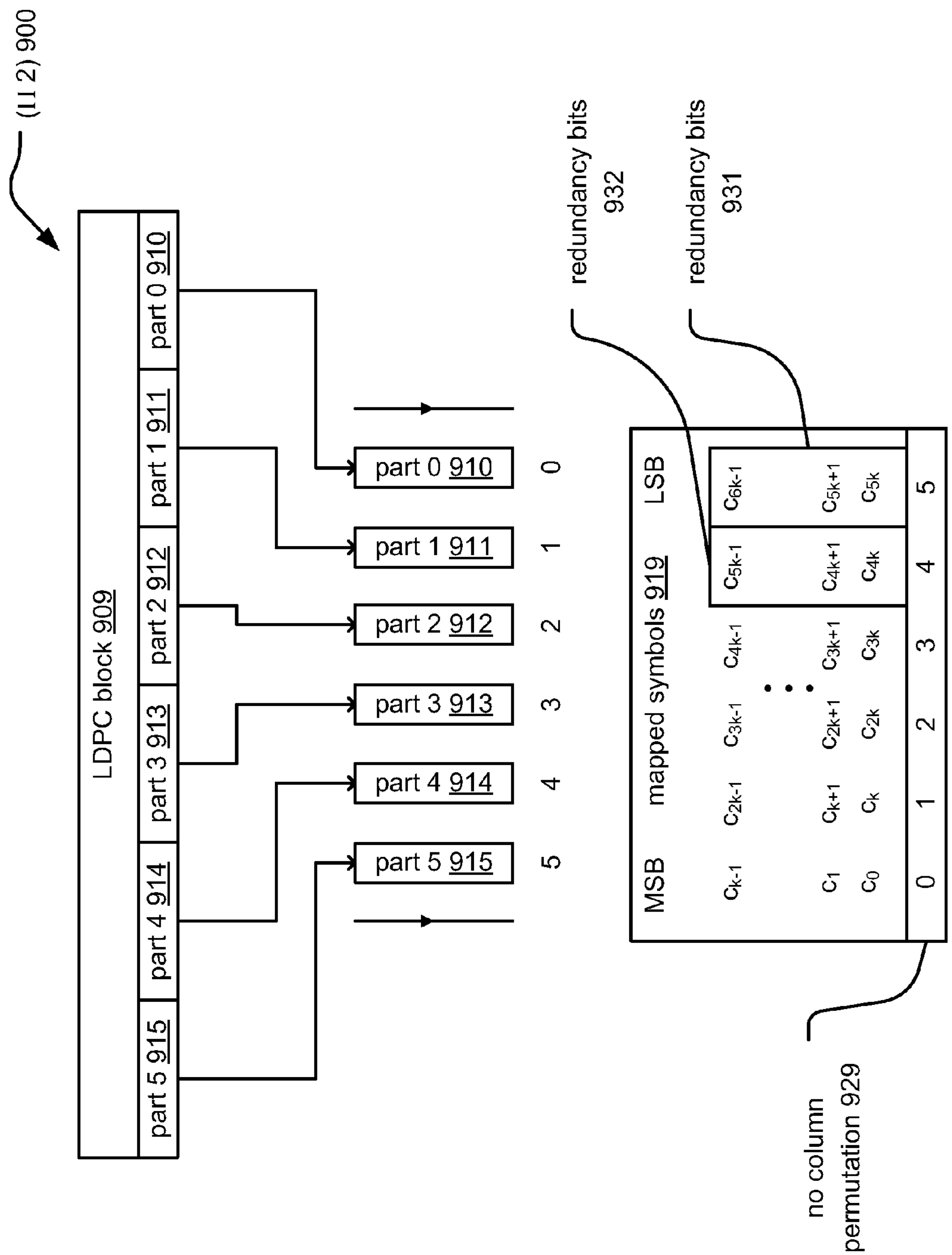

FIG. 9, FIG. 10, FIG. 11, FIG. 12, and FIG. 13 illustrate embodiments of bit to symbol interleaving. Specifically, FIG. 9 shows embodiment 900 (interleave 2, shown as (Π 2)); FIG.

Figure 11:
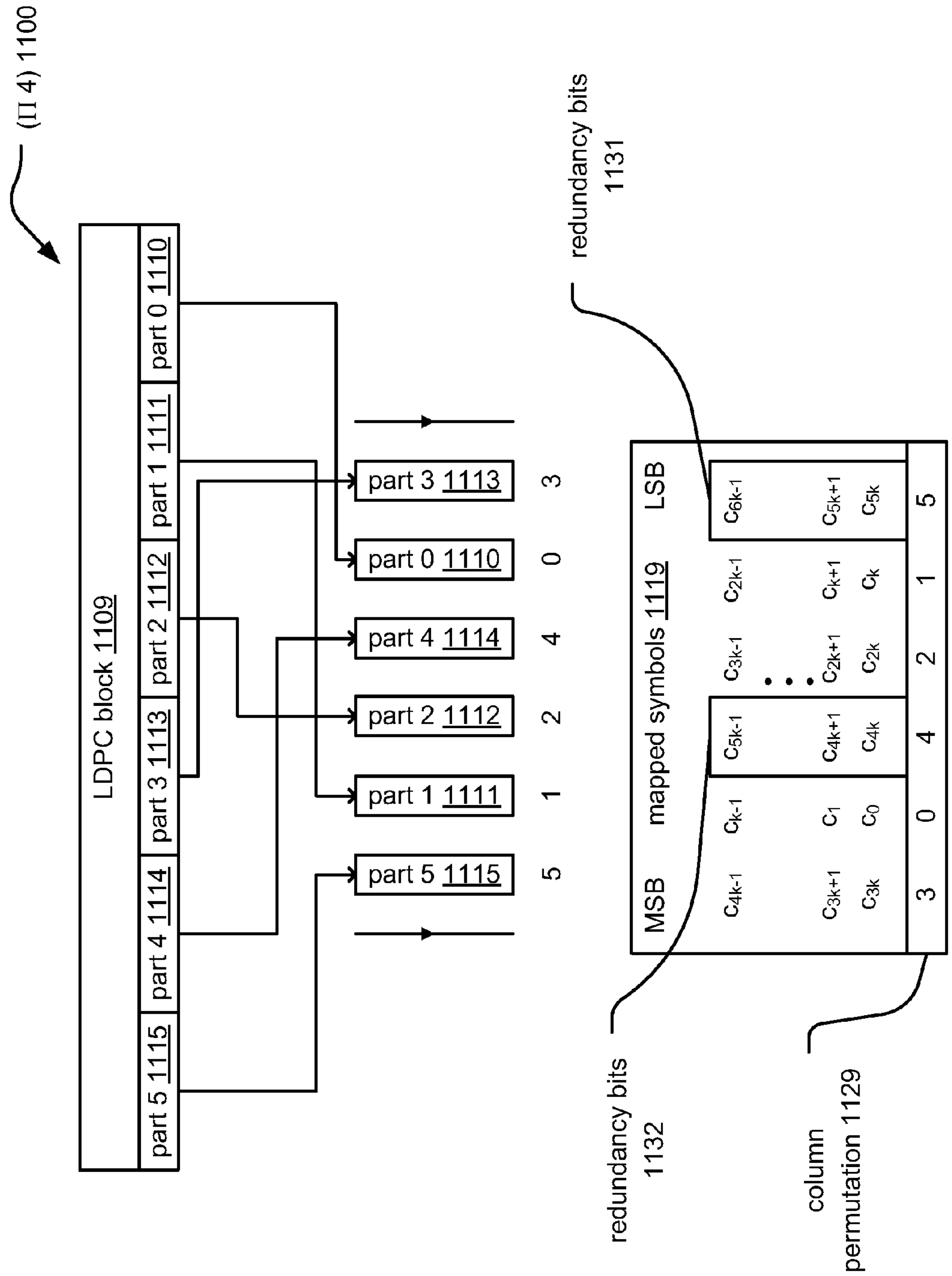
Figure 12:
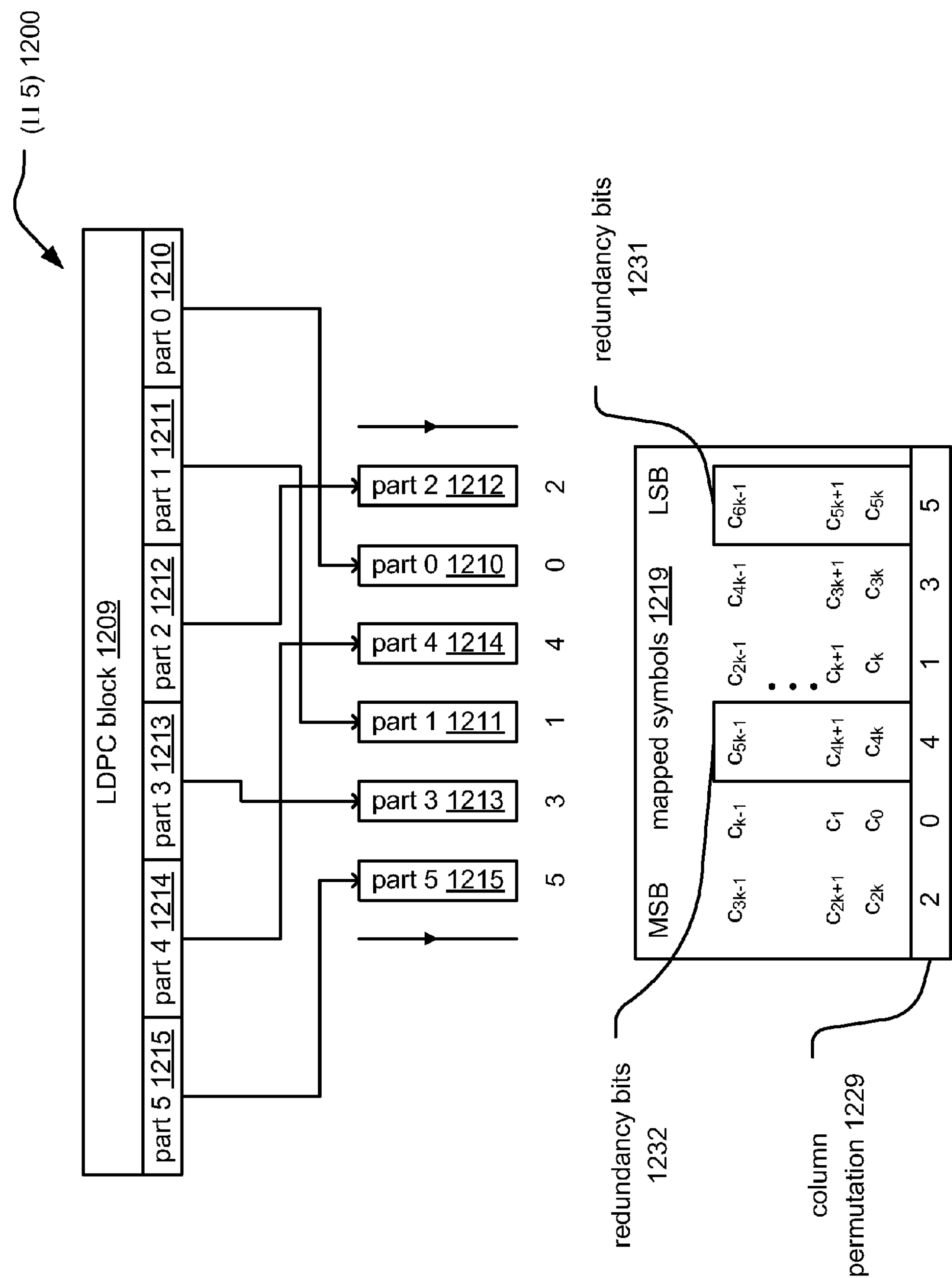
Figure 13:
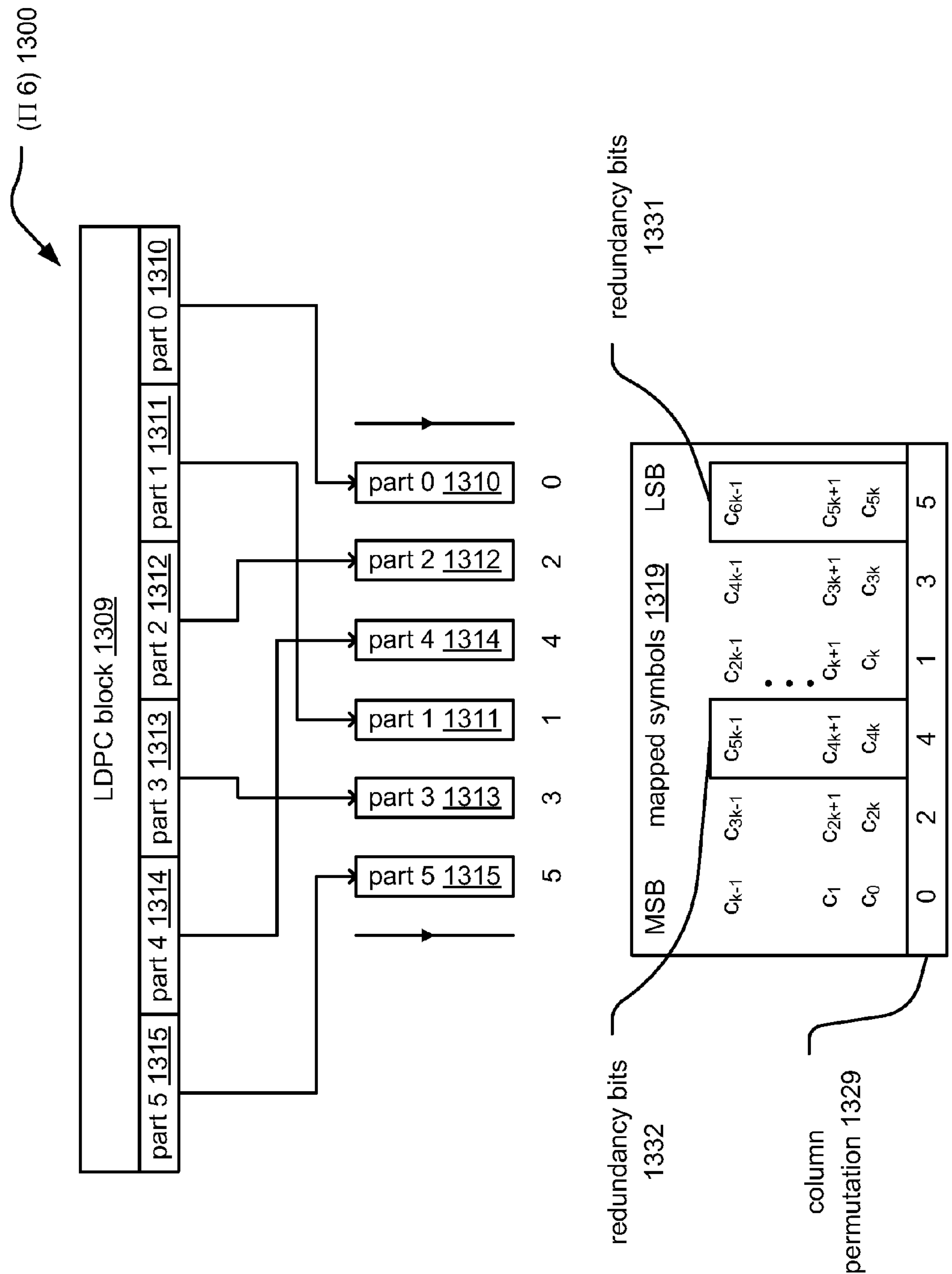

10 shows embodiment 1000 (interleave 3, shown as (Π 3)); FIG. 11 shows embodiment 1100 (interleave 4, shown as (Π 4)); FIG. 12 shows embodiment 1200 (interleave 5, shown as (Π 5)); and FIG. 13 shows embodiment 1300 (interleave 6, shown as (Π 6); respectively, of various embodiments of bit to symbol interleaving. Each of these is shown as being a 6-bit symbol interleave that operates on an LDPC block of encoded bits (e.g., an LDPC codeword). Clearly, any other number (i.e., n) of columns may be employed to perform a bit to n-bit interleave as well without departing from the scope and spirit of the invention.

Referring to the embodiment 900 (interleave 2, shown as (Π 2)) of the FIG. 9, an LDPC block 909 is received and may be viewed as being partitioned or divided into a plurality of parts. For example, the LDPC block 909 is divided into part 0 910, part 1 911, part 2 912, part 3 913, part 4 914, and part 5 915. Each of these parts is provided to a corresponding column.

Each of the parts is provided to a plurality of column as indicated in the diagram. The 6 bit labels to be symbol mapped (as indicated by reference numeral 919) that are pulled out from the columns are as follows (MSB (Most Significant Bit) on left . . . LSB (Least Significant Bit) on right):

$1^{st}$6 bit label: $c_0 c_k c_{2k} c_{3k} c_{4k} c_{5k}$ $2^{nd}$6 bit label: $c_1 c_{k+1} c_{2k+1} c_{3k+1} c_{4+1} c_{5k+1}$

. . . .

nth 6 bit label: $c_{k-1} c_{2k-1} c_{3k-1} c_{4k-1} c_{5k-1} c_{6k-1}$

Each of the parts that is provided to each of the corresponding columns has k bits. The total number of bits of the LDPC block 909 is 6k.

As can be seen with respect to the LSB and MSB of the bits that are pulled out from the rows, there is no column permutation with respect to the columns into which the parts are partitioned as indicated by the reference numeral 929. The bits ($c_{5k-1}$, . . . , $c_{4k+1}$, $c_{4k}$) and the LSB bits ($c_{6k-1}$, . . . , $c_{5k+1}$, $c_{5k}$) are redundancy bits as selected from the LDPC block 909 as indicated by the reference numerals 932 and 931, respectively.

Figure 10:
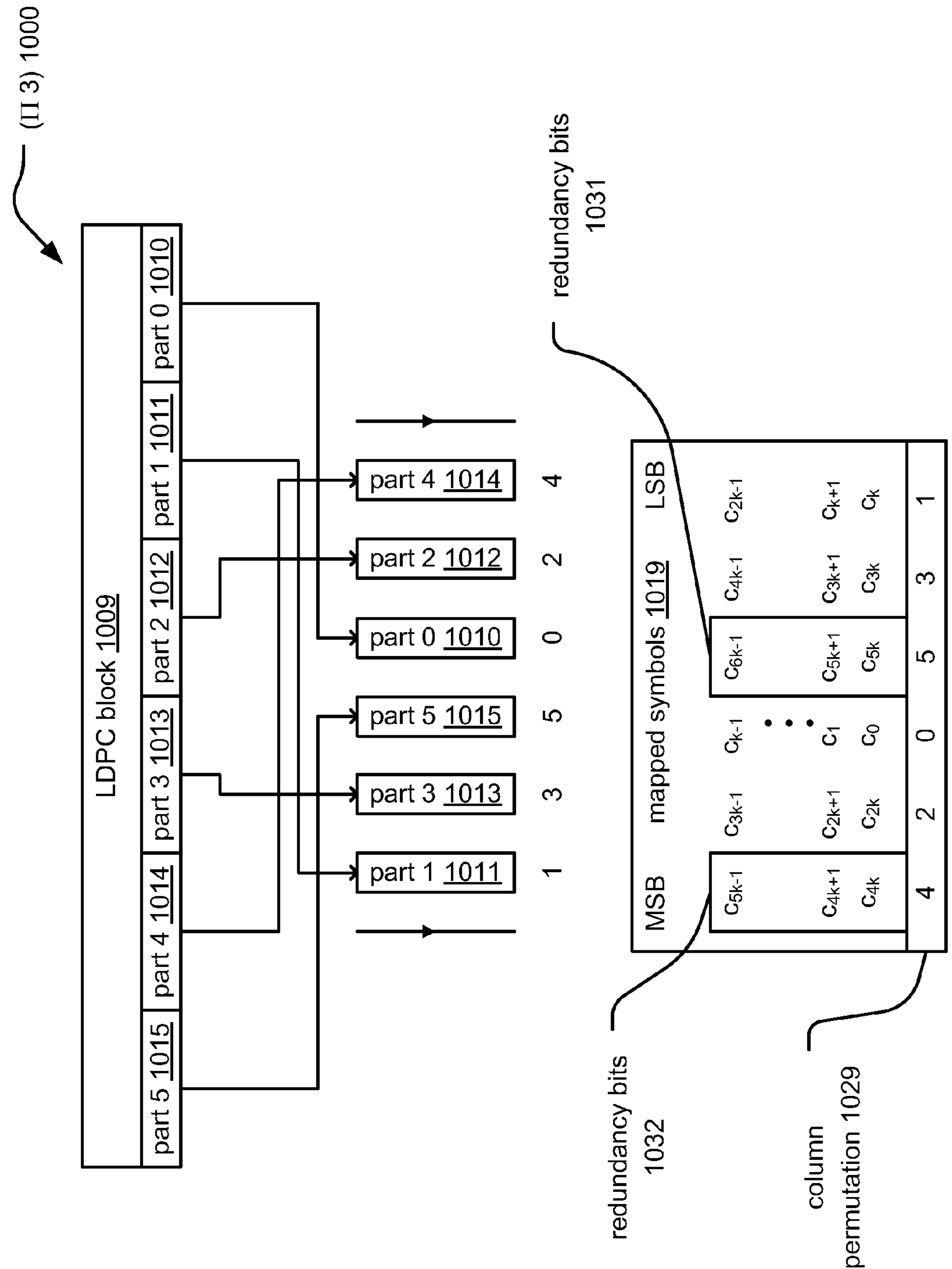

Referring to the embodiment 1000 (interleave 3, shown as (Π3)) of the FIG. 10, an LDPC block 1009 is received and may be viewed as being partitioned or divided into a plurality of parts. For example, the LDPC block 1009 is divided into part 0 1010, part 1 1011, part 2 1012, part 3 1013, part 4 1014, and part 5 1015. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1019) that are pulled out from the columns are as follows (MSB on left . . . LSB on right):

$1^{st}$6 bit label: $c_{4k} c_{2k}\ c_0 c_{5k} c_{3k} c_k$ $2^{nd}$6 bit label: $c_{4k+1} c_{2k+1} c_1 c_{5k+1} c_{3+1} c_{k+1}$

. . . .

nth 6 bit label: $c_{5k-1} c_{3k-1} c_{k-1} c_{6k-1} c_{4k-1} c_{2k-1}$

Each of the parts that is provided to each of the corresponding columns has k bits. The total number of bits of the LDPC block 1009 is 6k.

As can be seen with respect to the LSB (Least Significant Bit) and MSB of the bits that are pulled out from the rows, there is a column permutation with respect to the columns into which the parts are partitioned as indicated by the reference numeral 1029. The MSB bits ($c_{5k-1}$, . . . , $c_{4k+1}$, $c_{4k}$) and the bits ($c_{6k-1}$, . . . , $c_{5k+1}$, $c_{5k}$) are redundancy bits as selected from the LDPC block 1009 as indicated by the reference numerals 1032 and 1031, respectively.

Referring to the embodiment 1100 (interleave 4, shown as (Π 4)) of the FIG. 11, an LDPC block 1109 is received and may be viewed as being partitioned or divided into a plurality of parts. For example, the LDPC block 1109 is divided into part 0 1110, part 1 1111, part 2 1112, part 3 1113, part 4 1114, and part 5 1115. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1119) that are pulled out from the columns are as follows (MSB on left . . . LSB on right):

$1^{st}$6 bit label: $c_{3k} c_0\ c_{4k} c_{2k} c_k c_{5k}$ $2^{nd}$6 bit label: $c_{3k+1} c_1 c_{4k+1} c_{2k+1} c_{k+1} c_{5k+1}$

. . . .

nth 6 bit label: $c_{4k-1} c_{k-1} c_{5k-1} c_{3k-1} c_{2k-1} c_{6k-1}$

Each of the parts that is provided to each of the corresponding columns has k bits. The total number of bits of the LDPC block 1109 is 6k.

As can be seen with respect to the LSB (Least Significant Bit) and MSB of the bits that are pulled out from the rows, there is a column permutation with respect to the columns into which the parts are partitioned as indicated by the reference numeral 1129. The bits ($c_{5k-1}$, . . . , $c_{4k+1}$, $c_{4k}$) and the LSB bits ($c_{6k-1}$, . . . , $c_{5k+1}$, $c_{5k}$) are redundancy bits as selected from the LDPC block 1109 as indicated by the reference numerals 1132 and 1131, respectively.

Referring to the embodiment 1200 (interleave 5, shown as (Π 5)) of the FIG. 12, an LDPC block 1209 is received and may be viewed as being partitioned or divided into a plurality of parts. For example, the LDPC block 1209 is divided into part 0 1210, part 1 1211, part 2 1212, part 3 1213, part 4 1214, and part 5 1215. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1219) that are pulled out from the columns are as follows (MSB on left . . . LSB on right):

$1^{st}$6 bit label: $c_{2k} c_0\ c_{4k} c_k c_{3k} c_{5k}$ $2^{nd}$6 bit label: $c_{2k+1} c_1 c_{4k+1} c_{k+1} c_{3k+1} c_{5k+1}$

. . . .

nth 6 bit label: $c_{3k-1} c_{k-1} c_{5k-1} c_{2k-1} c_{4k-1} c_{6k-1}$

Each of the parts that is provided to each of the corresponding columns has k bits. The total number of bits of the LDPC block 1209 is 6k.

As can be seen with respect to the LSB (Least Significant Bit) and MSB of the bits that are pulled out from the rows, there is a column permutation with respect to the columns into which the parts are partitioned as indicated by the reference numeral 1229. The bits ($c_{5k-1}$, . . . , $c_{4k+1}$, $c_{3k}$) and the LSB bits ($c_{6k-1}$, . . . , $c_{5k+1}$, $c_{5k}$) are redundancy bits as selected from the LDPC block 1209 as indicated by the reference numerals 1232 and 1231, respectively.

Referring to the embodiment 1300 (interleave 6, shown as (Π 6)) of the FIG. 13, an LDPC block 1309 is received and may be viewed as being partitioned or divided into a plurality of parts. For example, the LDPC block 1309 is divided into part 0 1310, part 1 1311, part 2 1312, part 3 1313, part 4 1314, and part 5 1315. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1319) that are pulled out from the columns are as follows (MSB on left . . . LSB on right):

$1^{st}$6 bit label: $c_0c_{2k}c_{4k}c_kc_{3k}c_{5k}$ $2^{nd}$6 bit label: $c_1c_{2k+1}c_{4k+1}c_{k+1}c_{3k+1}c_{5k+1}$

. . . .

nth 6 bit label: $c_{k-1}c_{3k-1}c_{5k-1}c_{2k-1}c_{4k-1}c_{6k-1}$

Each of the parts that is provided to each of the corresponding columns has k bits. The total number of bits of the LDPC block 1309 is 6k.

As can be seen with respect to the LSB (Least Significant Bit) and MSB of the bits that are pulled out from the rows, there is a column permutation with respect to the columns into which the parts are partitioned as indicated by the reference numeral 1329. The bits ($c_{5k-1}, \ldots, c_{4k+1}, c_{4k}$) and the LSB bits ($c_{6k-1}, \ldots, c_{5k+1}, c_{5k}$) are redundancy bits as selected from the LDPC block 1309 as indicated by the reference numerals 1332 and 1331, respectively.

FIG. 14 illustrates an embodiment of a performance comparison 1400 between a GRS-based regular LDPC code ($LDPC_0$) (shown by reference numeral 1405), a first GRS-based irregular LDPC code ($LDPC_1$) (shown by reference numeral 1410), and a second GRS-based irregular LDPC code ($LDPC_2$) (shown by reference numeral 1420) on a Rayleigh fading communication channel. This embodiment shows that both irregular $LDPC_1$ and $LDPC_2$ out performing $LDPC_0$ by at least 3 dB with BLER (block error rate).

The GRS-based regular LDPC code ($LDPC_0$) is constructed according to the constraints and design of the (EQ 9) as shown above. The same values of p=3, m=4, ρ=24 and γ=8 can be employed as was given above with respect to the Example 1. This GRS-based regular LDPC code ($LDPC_0$) code has rate 0.67.

The parity check matrix that corresponds to the GRS-based irregular LDPC code ($LDPC_1$) is constructed using the modified partial-matrices as also provided above with respect to EQ (11) (which is provided again here for ease of the reader):

$$H(1)=[H_1,H_2^1,H_3^1] \quad \text{(EQ 11)}$$

This GRS-based irregular LDPC code ($LDPC_1$) has code rate 0.667.

The parity check matrix that corresponds to the GRS-based irregular LDPC code ($LDPC_2$) is constructed using the modified partial-matrices as also provided above with respect to EQ (12) (which is provided again here for ease of the reader):

$$H(3)=[H_1,H_2^2,H_3^1] \quad \text{(EQ 12)}$$

This GRS-based irregular LDPC code ($LDPC_2$) also has code rate 0.667.

FIG. 15 illustrates an embodiment of a performance comparison 1500 between a first GRS-based irregular LDPC code ($LDPC_1$) (shown using reference numeral 1510), a second GRS-based irregular LDPC code ($LDPC_2$) (shown using reference numeral 1520), and an alternative LDPC code, LDPC (b) (shown using reference numeral 1505), on a communication channel.

This embodiment compares the codes $LDPC_1$ 1510 and $LDPC_2$ 1520 to the rate ⅔ code, LDPC(b) 1505. That code, LDPC(b) 1505, has the same code length as 1944 and is also irregular. With the bit to symbol interleave that is provided in FIG. 9, the corresponding performances are given in FIG. 15. The GRS-based irregular codes constructed herein give 1 dB performance improvement.

FIG. 16 and FIG. 17 illustrate alternative embodiments of bit to symbol interleaving. Specifically, FIG. 16 and FIG. 17 illustrate embodiment 1600 (interleave 0, shown as (Π 0)), and embodiment 1700 (interleave 1, shown as (Π 1)), respectively, of bit to symbol interleaving. As with previous embodiments, each of these is shown as being a 6-bit symbol interleave that operates on an LDPC block of encoded bits (e.g., an LDPC codeword). Clearly, any other number (i.e., n) of columns may be employed to perform a bit to n-bit interleave as well without departing from the scope and spirit of the invention.

In the embodiment 1600, an LDPC block 1609 is provided directly to each of a plurality of columns. Rather than put each of a plurality of parts of the LDPC block 1609 into corresponding columns (as done in some of the previous embodiments), a first bit of the LDPC block 1609 is provided to a first column, a second bit of the LDPC block is provided to a second column, a third bit of the LDPC block is provided to a third column, and so on. As can be seen, the order of the columns is not permuted (0 1 2 3 4 5), as indicated by the reference numeral 1629. Depending on the symbol size employed (e.g., n bit symbol size), then the n+1 symbol is provided to the first column in a wrapping around procedure as depicted in the diagram.

The 6 bit labels to be symbol mapped (as indicated by reference numeral 1619) that are pulled out from the columns are as follows (MSB on left . . . LSB on right):

$1^{st}$6 bit label: $c_0c_1c_2c_3c_4c_5$ $2^{nd}$6 bit label: $c_6c_7c_8c_9c_{10}c_{11}$

. . . .

nth 6 bit label: $c_{6k-6}c_{6k-5}c_{6k-4}c_{6k-3}c_{6k-2}c_{6k-1}$

The total number of bits of the LDPC block 1609 is 6k. As can be seen with respect to the LSB and MSB of the bits that are of the mapped pulled out from the rows, there is no column permutation with respect to the columns into which the parts are partitioned as indicated by the reference numeral 1629.

In the embodiment 1700, an LDPC block 1709 is provided directly to each of a plurality of columns. Rather than put each of a plurality of parts of the LDPC block 1609 into corresponding columns (as done in some of the previous embodiments), a first bit of the LDPC block 1609 is provided to a first column, a second bit of the LDPC block is provided to a second column, a third bit of the LDPC block is provided to a third column, and so on. As can be seen, the order of the columns is in fact permuted (0 2 4 1 3 5), as indicated by the reference numeral 1729. Depending on the symbol size employed (e.g., n bit symbol size), then the n+1 symbol is provided to the first column in a wrapping around procedure as depicted in the diagram.

The 6 bit labels to be symbol mapped (as indicated by reference numeral 1719) that are pulled out from the columns are as follows (MSB on left LSB on right):

$1^{st}$6 bit label: $c_0c_1c_4c_1c_3c_5$ $2^{nd}$6 bit label: $c_5c_7c_9c_6c_8c_{10}$

. . . .

nth 6 bit label: $c_{6k-6}c_{6k-4}c_{6k-2}c_{6k-5}c_{6k-3}c_{6k-1}$

The total number of bits of the LDPC block 1709 is 6k. As can be seen with respect to the LSB and MSB of the bits that are of the mapped pulled out from the rows, there is in fact a column permutation with respect to the columns into which the parts are partitioned as indicated by the reference numeral 1729.

In each of the embodiments 1600 of FIG. 16 and embodiment 1700 of FIG. 17, the entire LDPC block need not be available before performing the symbol formation and symbol mapping. When comparing this to each of the embodiments 900 of FIG. 9, embodiment 1000 of FIG. 10, embodiment 1100 of FIG. 11, embodiment 1200 of FIG. 12, and embodiment 1300 of FIG. 13. Those embodiments (900, 1000, 1100, 1200, and 1300) require a bit of memory management and incur some latency when compared to the embodiments 1600 and 1700. However, there can be a significant improvement in performance when doing those embodiments (900, 1000, 1100, 1200, and 1300) of bit to symbol interleave when compared to the embodiments 1600 and 1700. Therefore, a small price to pay in terms of latency may yield a large payoff in terms of performance.

Clearly, for each of the embodiments depicted in FIG. 16 and FIG. 17, other sized LDPC blocks (e.g., having different total numbers of bits) and symbols having other numbers of bits (e.g., labels for symbols having n bits and n corresponding columns) may also be employed herein without departing from the scope and spirit of the invention. A designer is provided wide latitude is selecting the LDPC block size and type as well as the manner of bit to symbol interleaving without departing from the scope and spirit of the invention.

With other interleaves such as those provided in FIG. 16 and FIG. 17, codes $LDPC_1$ 1210 and $LDPC_2$ 1220 out perform LDPC(b) 1205 by approximately 0.5 to 0.8 dB.

The following four diagrams show the performance of 4 different GRS-based irregular LDPC codes to each of 4 alternative LDPC codes, namely, LDPC(c) (1944, 972), LDPC(d) (1944, 1296), LDPC(e) (1944, 487), and LDPC(f) (1944, 1620). Each of these 4 different GRS-based irregular LDPC codes, designed according to the novel approach presented herein, has a corresponding low parity check matrix; these low density parity check matrices are provided in the APPENDIX.

Later in the APPENDIX, 3 additional low density parity check matrices corresponding to 3 different GRS-based irregular LDPC codes are also provided.

FIG. 18 illustrates an embodiment of a performance comparison 1800 between a GRS-based irregular LDPC (1944, 973) code (1) (shown by reference numeral 1820) and a first code, LDPC(c) (1944, 972) (shown by reference numeral 1810), on a communication channel.

This shows the performance of these two code rate ½ codes on an AWGN communication channel in terms of BLER vs. SNR (or $E_b/N_o$). As can be seen, at a BLER of $1.5\times10^{-5}$, the GRS-based irregular LDPC (1944, 973) code (1) 1820 outperforms the LDPC(c) (1944, 972) code 1810 by approximately 0.33 dB.

FIG. 19 illustrates an embodiment of a performance comparison 1900 between a GRS-based irregular LDPC (1944, 1297) code (2) (shown by reference numeral 1920) and a second code, LDPC(d) (1944, 1296) (shown by reference numeral 1910), on a communication channel.

FIG. 20 illustrates an embodiment of a performance comparison 2000 between a GRS-based irregular LDPC (1944, 487) code (3) (shown by reference numeral 2020) and a third code, LDPC(e) (1944, 486) (shown by reference numeral 2010), on a communication channel.

FIG. 21 illustrates an embodiment of a performance comparison 2100 between a GRS-based irregular LDPC (1944, 1621) code (4) (shown by reference numeral 2120) and a fourth code, LDPC(f) (1944, 1620) (shown by reference numeral 2110), on a communication channel.

FIG. 22A illustrates an embodiment of a method 2200 for generating an LDPC coded signal. This method 2200 involves constructing a generator matrix that corresponds to a parity check matrix of a corresponding GRS-based irregular LDPC code, as shown in a block 2210. When provided any parity check matrix that corresponds to an LDPC code, a corresponding generator matrix may be constructed. The method 2200 then involves encoding at least one information bit using the generator matrix thereby generating at least one LDPC codeword of an LDPC coded signal, as shown in a block 2220. This encoding operation may be viewed as taking place in an encoder at a transmitter end of a communication channel. By encoding the at least one information bit using this constructed generator matrix (that corresponds to the parity check matrix), the decoding of the LDPC coded signal may then be performed using the parity check matrix that is used to construct the generator matrix. Any of a number of hardware devices (e.g., transmitters, transceivers, encoders, etc.) that include this encoding functionality may be implemented to perform these operations in any of a wide variety of communication system types.

FIG. 22B illustrates an embodiment of a method 2205 for decoding an LDPC coded signal. This method 2205 may be viewed as receiving an LDPC coded signal, as shown in a block 2215. Then, the method 2205 may be viewed as decoding an LDPC coded signal, that has been encoded using a GRS-based irregular LDPC code, using a parity check matrix that corresponds to the GRS-based irregular LDPC code thereby making a best estimate of at least one information bit encoded within the LDPC coded signal, as shown in a block 2225. From some perspectives, this decoding operation may be viewed as being performed in a decoder located at a receiver end of a communication channel. Any of a number of hardware devices (e.g., receivers, transceivers, decoders, etc.) that include this decoding functionality may be implemented to perform these operations in any of a wide variety of communication system types.

Moreover, it is noted that the formation of a parity check matrix that corresponds to a GRS-based irregular LDPC code may take following form, where P is an n×n (e.g., 81×81 in one embodiment) permutation matrix.

Some examples of a P matrix may be provided as follows (as shown within some 3×3 embodiments):

$$P = \begin{bmatrix} 1 & 0 & 0 \\ 0 & 1 & 0 \\ 0 & 0 & 1 \end{bmatrix}, \text{ or}$$

$$P = \begin{bmatrix} 1 & 0 & 0 \\ 0 & 0 & 1 \\ 0 & 1 & 0 \end{bmatrix}.$$

A zero matrix, x, may be represented as follows (as shown within various embodiments):

$$x = \begin{bmatrix} 0 & 0 & 0 \\ 0 & 0 & 0 \\ 0 & 0 & 0 \end{bmatrix}, 3\times 3 \text{ embodiment}$$

$$x = \begin{bmatrix} 0 & 0 & 0 & 0 \\ 0 & 0 & 0 & 0 \\ 0 & 0 & 0 & 0 \\ 0 & 0 & 0 & 0 \end{bmatrix}, 4\times 4 \text{ embodiment}$$

$$x = \begin{bmatrix} 0 & \dots & 0 \\ \vdots & \ddots & \vdots \\ 0 & \dots & 0 \end{bmatrix}_{n\times n}, n\times n \text{ embodiment}$$

In one embodiment, each of the permutation matrices, P, and the zero matrices, x, are 81×81 matrices when implemented within an LDPC code having a block length of 1944.

One $1^{st}$ possible code structure is based on a parity check matrix, H, that corresponds to a GRS-based irregular LDPC code, for a code rate of 973/1944(>½), which may be approximated as being a code rate of 0.5. The form of the parity check matrix, H, is provided as follows: $H=[H_a, H_b]$. Because of the size of this parity check matrix, H, it is depicted using 2 paragraphs. The first paragraph depicts columns 1-12 and rows 1-12, and the second paragraph depicts columns 13-24 and rows 1-12.

$$H_a = \begin{bmatrix} P & P & P & P & x & x & P & x & x & P & x & x \\ P & P & P & x & P & x & x & P & x & x & P & x \\ P & P & P & x & x & P & x & x & P & x & x & P \\ P & P & P & P & x & x & P & x & x & P & x & x \\ P & P & P & x & P & x & x & P & x & P & x & x \\ P & P & P & x & x & P & x & x & P & x & x & P \\ P & P & P & x & x & P & x & x & P & x & x & P \\ P & P & P & x & P & x & x & P & x & x & P & x \\ P & P & P & x & x & P & x & x & P & x & x & P \\ P & P & P & P & x & x & P & x & x & P & x & x \\ P & P & P & x & P & x & x & P & x & x & P & x \\ P & P & P & x & x & P & x & x & P & x & x & P \end{bmatrix}$$

$$H_b = \begin{bmatrix} P & x & x & x & x & x & x & x & x & x & x & P \\ P & P & x & x & x & x & x & x & x & x & x & x \\ x & P & P & x & x & x & x & x & x & x & x & x \\ x & x & P & P & x & x & x & x & x & x & x & x \\ x & x & x & P & P & x & x & x & x & x & x & x \\ x & x & x & x & P & P & x & x & x & x & x & x \\ x & x & x & x & x & P & P & x & x & x & x & x \\ x & x & x & x & x & x & P & P & x & x & x & x \\ x & x & x & x & x & x & x & P & P & x & x & x \\ x & x & x & x & x & x & x & x & P & P & x & x \\ x & x & x & x & x & x & x & x & x & P & P & x \\ x & x & x & x & x & x & x & x & x & x & P & P \end{bmatrix}$$

A 2nd possible code structure is based on a parity check matrix, H, that corresponds to a GRS-based irregular LDPC code, for a code rate of ⅔, which may be approximated as being a code rate of 0.667. The form of this parity check matrix, H, is provided as follows: $H=[H_a, H_b]$. Because of the size of this parity check matrix, H, it is depicted using 2 paragraphs. The first paragraph depicts columns 1-12 and rows 1-8, and the second paragraph depicts columns 13-24 and rows 1-8.

$$H_a = \begin{bmatrix} P & P & P & P & P & x & P & x & P & x & P & x \\ P & P & P & P & x & P & x & P & x & P & x & P \\ P & P & P & P & P & x & P & x & P & x & P & x \\ P & P & P & P & x & P & x & P & x & P & x & P \\ P & P & P & P & P & x & P & x & P & x & P & x \\ P & P & P & P & x & P & x & P & x & P & x & P \\ P & P & P & P & P & x & P & x & P & x & P & x \\ P & P & P & P & x & P & x & P & x & P & x & P \end{bmatrix}$$

-continued $$H_b = \begin{bmatrix} P & x & P & x & P & P & x & x & x & x & x & x \\ x & P & x & P & x & P & P & x & x & x & x & x \\ P & x & P & x & x & x & P & P & x & x & x & x \\ x & P & x & P & x & x & x & P & P & x & x & x \\ P & x & P & x & x & x & x & x & P & P & x & x \\ x & P & x & P & x & x & x & x & x & P & P & x \\ P & x & P & x & x & x & x & x & x & x & P & P \\ x & P & x & P & x & x & x & x & x & x & x & P \end{bmatrix}$$

A 3rd possible code structure is based on a parity check matrix, H, that corresponds to a GRS-based irregular LDPC code, for a code rate of ¾. The form of the parity check matrix, H, is provided as follows: $H=[H_a, H_b]$. Because of the size of this parity check matrix, H, it is depicted using 2 paragraphs. The first paragraph depicts columns 1-12 and rows 1-6, and the second paragraph depicts columns 13-24 and rows 1-6.

$$H_a = \begin{bmatrix} P & P & P & P & P & P & x & P & P & P & P & x \\ P & P & P & P & P & P & x & x & P & P & P & P \\ P & P & P & P & P & P & P & x & x & P & P & P \\ P & P & P & P & P & P & P & P & x & x & P & P \\ P & P & P & P & P & P & P & P & P & x & x & P \\ P & P & P & P & P & P & P & P & P & P & x & x \end{bmatrix}$$

$$H_b = \begin{bmatrix} x & P & P & P & P & x & P & P & x & x & x & x \\ x & x & P & P & P & P & x & P & P & x & x & x \\ P & x & x & P & P & P & x & x & P & P & x & x \\ P & P & x & x & P & P & x & x & x & P & P & x \\ P & P & P & x & x & P & x & x & x & x & P & P \\ P & P & P & P & x & x & x & x & x & x & x & P \end{bmatrix}$$

A 4th possible code structure is based on a parity check matrix, H, that corresponds to a GRS-based irregular LDPC code, for a code rate of ⅚, which may be approximated as being a code rate of 0.833. The form of the parity check matrix, H, is provided as follows: $H=[H_a, H_b]$. Because of the size of this parity check matrix, H, it is depicted using 2 paragraphs. The first paragraph depicts columns 1-12 and rows 1-4, and the second paragraph depicts columns 13-24 and rows 1-4.

$$H_a = \begin{bmatrix} P & P & P & P & P & P & P & P & P & P & P & P \\ P & P & P & P & P & P & P & P & P & P & P & P \\ P & P & P & P & P & P & P & P & P & P & P & P \\ P & P & P & P & P & P & P & P & P & P & P & P \end{bmatrix}$$

$$H_b = \begin{bmatrix} P & P & P & P & P & P & P & P & P & x & x & x \\ P & P & P & P & P & P & P & P & P & P & x & x \\ P & P & P & P & P & P & P & P & x & P & P & x \\ P & P & P & P & P & P & P & P & x & x & P & P \end{bmatrix}$$

For each of these 3 embodiments, the values and forms of H and P are provided above with respect to the 81×81 embodiment for each of the permutation matrices, P, and each of the zero matrices, x.

The GRS-based irregular LDPC coded constructed according to each of these possible parity check matrices achieve better BLER performance at all rates and SNRs. In addition, these codes have lower error floors. Each of these GRS-based irregular LDPC codes is simulated down to a BLER of $1.5\times10^{-5}$, which is appropriate for aggregated frames of 8192 bytes.

The performance of the $1^{st}$ possible code structure is described above with respect to FIG. 18.

FIG. 23 illustrates an embodiment of a performance comparison 2300 between a GRS-based irregular LDPC (1944, 1296) code (5) (shown using reference numeral 2320) and the second code, LDPC(d) (1944, 1296) (shown using reference numeral 2310), on a communication channel.

This shows the performance of these two code rate ⅔ codes on an AWGN communication channel in terms of BLER vs. SNR (or $E_b/N_o$). As can be seen, at a BLER of $1.5\times10^{-5}$, the GRS-based irregular LDPC (1944, 1296) code (5) 2320 outperforms the LDPC(d) (1944, 1296) code 2310 by approximately 0.6 dB.

FIG. 24 illustrates an embodiment of a performance comparison 2400 between a GRS-based irregular LDPC (1944, 486) code (6) (shown using reference numeral 2420) and the third code, LDPC(e) (1944, 486) (shown using reference numeral 2410), on a communication channel.

This shows the performance of these two code rate ¾ codes on an AWGN communication channel in terms of BLER vs. SNR (or $E_b/N_o$). As can be seen, at a BLER of $1.5\times10^{-5}$, the GRS-based irregular LDPC (1944, 486) code (6) 2420 outperforms the LDPC(e) (1944, 486) code 2410 by approximately 0.22 dB.

FIG. 25 illustrates an embodiment of a performance comparison 2500 between a GRS-based irregular LDPC (1944, 1620) code (7) (shown using reference numeral 2520) and the fourth code, LDPC(f) (1944, 1620) (shown using reference numeral 2510), on a communication channel.

This shows the performance of these two code rate ⅚ codes on an AWGN communication channel in terms of BLER vs. SNR (or $E_b/N_o$). As can be seen, at a BLER of $1.5\times10^{-5}$, the GRS-based irregular LDPC (1944, 1620) code (7) 2520 outperforms the LDPC(f) (1944, 1620) code 2510 code by approximately 0.11 dB.

The complexity of each of these possible code structures may be summarized as a function of the total number of edges within a corresponding LDPC bipartite graph; this is directly related to the mount of memory required for the messages. A worst case is 648 more that that which is shown.

TABLE 2

| | | |
|---|---|---|
| Code rate = 1/2 | LDPC(c) (1944, 972), 6966 edges | GRS-based irregular LDPC (1944, 973) code (1), 7776 edges |
| Code rate = 2/3 | LDPC(d) (1944, 1296), 7128 edges | GRS-based irregular LDPC (1944, 1296) code (5), 7695 edges |
| Code rate = 3/4 | LDPC(e) (1944, 486), 6803 edges | GRS-based irregular LDPC (1944, 486) code (6), 7695 edges |
| Code rate = 5/6 | LDPC(f) (1944, 1620) code, 6803 edges | GRS-based irregular LDPC (1944, 1620) code (7), 7047 edges |

Using these various design approaches provided herein, a complete family of LDPC codes having a better performance than known before is made available for designers. Also, the very low error floors provided by these codes are appropriate for the high throughput applications required in many applications. Moreover, the complexity of such a decoder implemented to decode such coded signals is relatively low while providing this improved performance.

FIG. 26 illustrates an embodiment of a performance comparison 2600 between a first GRS-based irregular LDPC code ($LDPC_1$), a second GRS-based irregular LDPC code ($LDPC_2$), and an alternative LDPC code, LDPC(b), using different types of bit to symbol interleaving, on a communication channel. This communication channel is a Rayleigh fading communication channel, and the modulation employed is 64 QAM. The LDPC block size of each of these codes ($LDPC_1$ and $LDPC_2$) is 1944, and the number of decoding iterations for each of these performance curves is 12. The alternative LDPC code, LDPC(b), has a code rate of ⅔, a code length of 1944 and is also an irregular LDPC code.

The parity check matrix that corresponds to the GRS-based irregular LDPC code ($LDPC_1$) is constructed using the modified partial-matrices as also provided above with respect to EQ (11) (which is provided again here for ease of the reader):

$$H(1)=[H_1,H_2^1,H_3^1] \qquad \text{(EQ 11)}$$

This GRS-based irregular LDPC code ($LDPC_1$) has code rate 0.667.

The parity check matrix that corresponds to the GRS-based irregular LDPC code ($LDPC_2$) is constructed using the modified partial-matrices as also provided above with respect to EQ (12) (which is provided again here for ease of the reader):

$$H(3)=[H_1,H_2^2,H_3^1] \qquad \text{(EQ 12)}$$

This GRS-based irregular LDPC code ($LDPC_2$) also has code rate 0.667.

Several different types of bit to symbol interleaving are employed; some of these bit to symbol interleaves are depicted above within the FIG. 9 (Π2), FIG. 10 (Π3), FIG. 11 (Π4), FIG. 12 (Π5), FIG. 13 (Π6), FIG. 16 (Π0), and FIG. 17 (Π1), respectively. Clearly, alternative permuting of the columns employed therein could also be performed without departing from the scope and spirit of the invention.

Specifically, the performance of GRS-based irregular LDPC code ($LDPC_1$) is depicted using bit to symbol interleaving (Π1) (shown using reference numeral 2611) and bit to symbol interleaving (Π2) (shown using reference numeral 2612).

The performance of GRS-based irregular LDPC code ($LDPC_2$) is depicted using bit to symbol interleaving (Π1) (shown using reference numeral 2621), bit to symbol interleaving (Π2) (shown using reference numeral 2622), bit to symbol interleaving (Π4) (shown using reference numeral 2624), bit to symbol interleaving (Π5) (shown using reference numeral 2625), and bit to symbol interleaving (Π6) (shown using reference numeral 2626).

The performance of alternative LDPC code, LDPC(b), is depicted using bit to symbol interleaving (Π0) (shown using reference numeral 2630), bit to symbol interleaving (Π1) (shown using reference numeral 2631), bit to symbol interleaving (Π2) (shown using reference numeral 2632), bit to symbol interleaving (Π3) (shown using reference numeral 2633), and bit to symbol interleaving (Π6) (shown using reference numeral 2636).

As can be seen, at a BLER of $1.5\times10^{-5}$, each of the GRS-based irregular LDPC code ($LDPC_1$) and the GRS-based irregular LDPC code ($LDPC_2$) outperforms the alternative LDPC code, LDPC(b), by approximately 0.8 dB.

As can be seen when considering these various performance diagrams, the GRS-based irregular LDPC codes that have been constructed according to the approach provided herein out perform other codes in terms of providing for lower error floors in terms of BLER as a function of SNR.

In addition, it is clear that the appropriate selection of a bit to symbol interleaving can provide for a significant increase in performance for each of the various LDPC codes whose performance is compared here. This principle may be extended to a wide variety of LDPC codes including those not specifically presented herein. There are many approaches by which the bit to symbol interleaving of an LDPC block may be performed.

One possible approach seeks to correspond those LDPC coded bits of the LDPC block that have higher coding strength (i.e., higher bit degree thereby indicating relatively more edges connected between those bit nodes and corresponding check nodes) to the LSBs of an n-bit label that is to be symbol mapped according to a modulation (having a constellation shape and corresponding mapping). This approach also seeks to correspond those LDPC coded bits of the LDPC block that have lower coding strength (i.e., lower bit degree thereby indicating relatively fewer edges connected between those bit nodes and corresponding check nodes) to the MSBs of an n-bit label that is to be symbol mapped according to a modulation (having a constellation shape and corresponding mapping). This approach seeks to align those LDPC coded bits (of the LDPC block) that have relatively higher coding strength to the relatively weak bit locations within the n-bit label (i.e., LSBs), and to align those LDPC coded bits (of the LDPC block) that have relatively lower coding strength to the relatively strong bit locations within the n-bit label (i.e., MSBs). This approach can be referred to as "strong to weak and weak to strong".

Another possible approach seeks to correspond those LDPC coded bits of the LDPC block that have higher coding strength (i.e., higher bit degree thereby indicating relatively more edges connected between those bit nodes and corresponding check nodes) to the MSBs of an n-bit label that is to be symbol mapped according to a modulation (having a constellation shape and corresponding mapping). This approach also seeks to correspond those LDPC coded bits of the LDPC block that have lower coding strength (i.e., lower bit degree thereby indicating relatively fewer edges connected between those bit nodes and corresponding check nodes) to the LSBs of an n-bit label that is to be symbol mapped according to a modulation (having a constellation shape and corresponding mapping). This approach seeks to align those LDPC coded bits (of the LDPC block) that have relatively higher coding strength to the relatively strong bit locations within the n-bit label (i.e., MSBs), and to align those LDPC coded bits (of the LDPC block) that have relatively lower coding strength to the relatively weak bit locations within the n-bit label (i.e., LSBs). This approach can be referred to as "strong to strong and weak to weak".

Also, when considering many of the 6 bit labels and interleaving presented above, the first 3 bits (starting at the MSB) can be considering as an in-phase component, and the last 3 bits (ending at the MSB) can be considering as a quadrature-phase component as in an I, Q (In-phase, Quadrature) implementation. From this perspective, each of these 3 bit groups can also be appropriately interleaved such that these 3 bit groups may also be mapped according to either of the "strong to weak and weak to strong" or the "strong to strong and weak to weak" approaches described above.

For example, both of the in-phase component (MSB and next 2 bits) and the quadrature-component (2 bits before LSB and LSB) can be mapped according to the "strong to weak and weak to strong" approach. Alternatively, both of the in-phase component (MSB and next 2 bits) and the quadrature-component (2 bits before LSB and LSB) can be mapped according to the "strong to strong and weak to weak" approach.

In even other approaches, the in-phase component (MSB and next 2 bits) can be can be mapped according to the "strong to weak and weak to strong" approach, and the quadrature-component (2 bits before LSB and LSB) can be mapped according to the "strong to strong and weak to weak" approach. In even another approach, the in-phase component (MSB and next 2 bits) can be can be mapped according to the "strong to strong and weak to weak" approach, and the quadrature-component (2 bits before LSB and LSB) can be mapped according to the "strong to weak and weak to strong" approach.

However, after considering many of the interleaves presented above that do various combinations of these approaches that are described just above, it is clear that there can be no generalization made as to which of the bit to symbol interleave approaches provides for the best performance. For example, when considering each of the "strong to weak and weak to strong" or the "strong to strong and weak to weak" approaches described above as well as combinations thereof (e.g., when considering the in-phase component and the quadrature component separately), it is clear that there is no generalized approach which can be stated by which to select the mapping of the strength of the LDPC coded bits to bit locations within the n-bit labels that are to be symbol mapped.

Rather, the best performance is a function of both the coding selected (e.g., the GRS-based irregular LDPC code selected) as well as the bit to symbol interleave selected. At the time of this filing, there appears no generalization that can be made. Once a particular LDPC code is selected, it seems clear that a number of bit to symbol interleaves should be considered in an effort to find the combination that provides the best performance.

FIG. 27 illustrates an embodiment of a wireless communication system 2700. This embodiment is of a wireless communication system 2700 that includes a plurality of base stations and/or access points 2712, 2716, a plurality of wireless communication devices 2718-2732 and a network hardware component 2734. it is noted that the network hardware 2734, which may be a router, switch, bridge, modem, system controller, etc. provides a wide area network connection 2742 for the wireless communication system 2700. It is further noted that the wireless communication devices 2718-2732 may be laptop host computers 2718 and 2726, personal digital assistant hosts 2720 and 2730, personal computer hosts 2724 and 2732 and/or cellular telephone hosts 2722 and 2728. More details of the wireless communication devices are described in greater detail with reference to FIG. 24 and FIG. 25.

Wireless communication devices 2722, 2723, and 2724 are located within an independent basic service set (IBSS) area and communicate directly (i.e., point to point). In this configuration, these devices 2722, 2723, and 2724 may only communicate with each other. To communicate with other wireless communication devices within embodiment 2700 of the communication system or to communicate outside of the wireless communication system 2700, the devices 2722, 2723, and/or 2724 need to affiliate with one of the base stations or access points 2712 or 2716.

The base stations or access points 2712, 2716 are located within basic service set (BSS) areas 2711 and 2713, respectively, and are operably coupled to the network hardware 2734 via local area network connections 2736, 2738. Such a connection provides the base station or access point 2712, 2716 with connectivity to other devices within the wireless communication system 2700 and provides connectivity to other networks via the WAN connection 2742. To communicate with the wireless communication devices within its BSS 2711 or 2713, each of the base stations or access points 2712-2716 has an associated antenna or antenna array. For instance, base station or access point 2712 wirelessly communicates with wireless communication devices 2718 and 2720 while base station or access point 2716 wirelessly communicates with wireless communication devices 2726-2732. Typically, the wireless communication devices register with a particular base station or access point 2712, 2716 to receive services from the wireless communication system 2700.

Typically, base stations are used for cellular telephone systems and like-type systems, while access points are used for in-home or in-building wireless networks (e.g., IEEE 802.11 and versions thereof, Bluetooth, and/or any other type of radio frequency based network protocol). Regardless of the particular type of communication system, each wireless communication device includes a built-in radio and/or is coupled to a radio.

FIG. 28 illustrates an embodiment of a wireless communication device 2800. This embodiment is of a wireless communication device 2800 that includes the host device 2818-2832 and an associated radio 2860. For cellular telephone hosts, the radio 2860 is a built-in component. For personal digital assistants hosts, laptop hosts, and/or personal computer hosts, the radio 2860 may be built-in or an externally coupled component.

As illustrated, the host device 2823-2832 includes a processing module 2850, memory 2852, a radio interface 2854, an input interface 2858, and an output interface 2856. The processing module 2850 and memory 2852 execute the corresponding instructions that are typically done by the host device. For example, for a cellular telephone host device, the processing module 2850 performs the corresponding communication functions in accordance with a particular cellular telephone standard.

The radio interface 2854 allows data to be received from and sent to the radio 2860. For data received from the radio 2860 (e.g., inbound data), the radio interface 2854 provides the data to the processing module 2850 for further processing and/or routing to the output interface 2856. The output interface 2856 provides connectivity to an output display device such as a display, monitor, speakers, etc. such that the received data may be displayed. The radio interface 2854 also provides data from the processing module 2850 to the radio 2860. The processing module 2850 may receive the outbound data from an input device such as a keyboard, keypad, microphone, etc. via the input interface 2858 or generate the data itself. For data received via the input interface 2858, the processing module 2850 may perform a corresponding host function on the data and/or route it to the radio 2860 via the radio interface 2854.

Radio 2860 includes a host interface 2862, digital receiver processing module 2864, an analog-to-digital converter (ADC) 2866, a high pass and low pass filter module 2868, an intermediate frequency (IF) mixing down conversion stage 2870, a receiver filter 2871, a low noise amplifier (LNA) 2872, a transmitter/receiver switch 2873, a local oscillation module 2874, memory 2875, a digital transmitter processing module 2876, a digital-to-analog converter (DAC) 2878, a filtering/gain module 2880, an IF mixing up conversion stage 2882, a power amplifier (PA) 2884, a transmitter filter module 2885, a channel bandwidth adjust module 2887, and an antenna 2886. The antenna 2886 may be a single antenna that is shared by the transmit and receive paths as regulated by the Tx/Rx switch 2873, or may include separate antennas for the transmit path and receive path. The antenna implementation will depend on the particular standard to which the wireless communication device is compliant.

The digital receiver processing module 2864 and the digital transmitter processing module 2876, in combination with operational instructions stored in memory 2875, execute digital receiver functions and digital transmitter functions, respectively. The digital receiver functions include, but are not limited to, digital intermediate frequency (IF) to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 2864 and 2876 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 2875 may be a single memory device or a plurality of memory devices. Such a memory device may be a read-only memory (ROM), random access memory (RAM), volatile memory, non-volatile memory, static memory, dynamic memory, flash memory, and/or any device that stores digital information. It it noted that when the processing module 2864 and/or 2876 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 2860 receives outbound data 2894 from the host device via the host interface 2862. The host interface 2862 routes the outbound data 2894 to the digital transmitter processing module 2876, which processes the outbound data 2894 in accordance with a particular wireless communication standard (e.g., IEEE 802.11, Bluetooth, etc.) to produce outbound baseband signals 2896. The outbound baseband signals 2896 will be digital base-band signals (e.g., have a zero IF) or a digital low IF signals, where the low IF typically will be in the frequency range of one hundred kilohertz to a few megahertz.

The digital-to-analog converter (DAC) 2878 converts the outbound baseband signals 96 from the digital domain to the analog domain. The filtering/gain module 2880 filters and/or adjusts the gain of the analog signals prior to providing it to the IF mixing stage 2882. The IF mixing stage 2882 converts the analog baseband or low IF signals into RF signals based on a transmitter local oscillation 2883 provided by local oscillation module 2874. The power amplifier (PA) 2884 amplifies the RF signals to produce outbound RF signals 2898, which are filtered by the transmitter filter module 2885. The antenna 2886 transmits the outbound RF signals 2898 to a targeted device such as a base station, an access point and/or another wireless communication device.

The radio 2860 also receives inbound RF signals 2888 via the antenna 2886, which were transmitted by a base station, an access point, or another wireless communication device. The antenna 2886 provides the inbound RF signals 2888 to the receiver filter module 2871 via the Tx/Rx switch 2873, where the Rx filter 2871 bandpass filters the inbound RF signals 2888. The Rx filter 2871 provides the filtered RF signals to low noise amplifier (LNA) 2872, which amplifies the signals 2888 to produce an amplified inbound RF signals. The low noise amplifier (LNA) 2872 provides the amplified inbound RF signals to the IF mixing module 2870, which directly converts the amplified inbound RF signals into an inbound low IF signals or baseband signals based on a receiver local oscillation 2881 provided by local oscillation module 2874. The down conversion module 2870 provides the inbound low IF signals or baseband signals to the filtering/gain module 2868. The high pass and low pass filter module 2868 filters, based on settings provided by the channel bandwidth adjust module 2887, the inbound low IF signals or the inbound baseband signals to produce filtered inbound signals.

The analog-to-digital converter (ADC) 2866 converts the filtered inbound signals from the analog domain to the digital domain to produce inbound baseband signals 2890, where the inbound baseband signals 2890 will be digital base-band signals or digital low IF signals, where the low IF typically will be in the frequency range of one hundred kilohertz to a few megahertz. The digital receiver processing module 2864, based on settings provided by the channel bandwidth adjust module 2887, decodes, descrambles, demaps, and/or demodulates the inbound baseband signals 2890 to recapture inbound data 2892 in accordance with the particular wireless communication standard being implemented by radio 2860. The host interface 2862 provides the recaptured inbound data 2892 to the host device 2818-2832 via the radio interface 2854.

As the reader will appreciate, the wireless communication device 2800 of FIG. 28 may be implemented using one or more integrated circuits. For example, the host device may be implemented on one integrated circuit, the digital receiver processing module 2864, the digital transmitter processing module 2876 and memory 2875 may be implemented on a second integrated circuit, and the remaining components of the radio 2860, less the antenna 2886, may be implemented on a third integrated circuit. As an alternate example, the radio 2860 may be implemented on a single integrated circuit. As yet another example, the processing module 2850 of the host device and the digital receiver and transmitter processing modules 2864 and 2876 may be a common processing device implemented on a single integrated circuit. Further, the memory 2852 and memory 2875 may be implemented on a single integrated circuit and/or on the same integrated circuit as the common processing modules of processing module 2850 and the digital receiver and transmitter processing module 2864 and 2876.

FIG. 29 illustrates an alternative embodiment of a wireless communication device 2900. This diagram is of a wireless communication device 2900 that includes the host device 2918-2932 and an associated radio 2960. For cellular telephone hosts, the radio 2960 is a built-in component. For personal digital assistants hosts, laptop hosts, and/or personal computer hosts, the radio 2960 may be built-in or an externally coupled component.

As illustrated, the host device 2918-2932 includes a processing module 2950, memory 2952, radio interface 2954, input interface 2958 and output interface 2956. The processing module 2950 and memory 2952 execute the corresponding instructions that are typically done by the host device. For example, for a cellular telephone host device, the processing module 2950 performs the corresponding communication functions in accordance with a particular cellular telephone standard.

The radio interface 2954 allows data to be received from and sent to the radio 2960. For data received from the radio 2960 (e.g., inbound data), the radio interface 2954 provides the data to the processing module 2950 for further processing and/or routing to the output interface 2956. The output interface 2956 provides connectivity to an output display device such as a display, monitor, speakers, etc. such that the received data may be displayed. The radio interface 2954 also provides data from the processing module 2950 to the radio 2960. The processing module 2950 may receive the outbound data from an input device such as a keyboard, keypad, microphone, etc. via the input interface 2958 or generate the data itself. For data received via the input interface 2958, the processing module 2950 may perform a corresponding host function on the data and/or route it to the radio 2960 via the radio interface 2954.

Radio 2960 includes a host interface 2962, a baseband processing module 29100, memory 2965, a plurality of radio frequency (RF) transmitters 29106-29110, a transmit/receive (T/R) module 29114, a plurality of antennas 2981-2985, a plurality of RF receivers 29118-29120, a channel bandwidth adjust module 2987, and a local oscillation (LO) module 2974. The baseband processing module 29100, in combination with operational instructions stored in memory 2965, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 29100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 2965 may be a single memory device or a plurality of memory devices. Such a memory device may be a read-only memory, random access memory, volatile memory, non-volatile memory, static memory, dynamic memory, flash memory, and/or any device that stores digital information. It is noted that when the processing module 29100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 2960 receives outbound data 2994 from the host device via the host interface 2962. The baseband processing module 29100 receives the outbound data 2994 and, based on a mode selection signal 29102, produces one or more outbound symbol streams 29104. The mode selection signal 29102 indicates a particular mode of operation that is compliant with one or more specific modes of the various IEEE 802.11 standards. For example, the mode selection signal 29102 may indicate a frequency band of 2.4 GHz, a channel bandwidth of 20 or 22 MHz and a maximum bit rate of 54 megabits-peRSecond. In this general category, the mode selection signal will further indicate a particular rate ranging from 1 megabit-peRSecond to 54 megabits-peRSecond. In addition, the mode selection signal will indicate a particular type of modulation, which includes, but is not limited to, Barker Code Modulation, BPSK, QPSK, CCK, 16 QAM, 64 QAM and/or 256 QAM. The mode select signal 29102 may also include a code rate, a number of coded bits per subcarrier (NBPSC), coded bits per OFDM (Orthogonal Frequency Division Multiplexing) symbol (NCBPS), and/or data bits per OFDM symbol (NDBPS). The mode selection signal 29102 may also indicate a particular channelization for the corresponding mode that provides a channel number and corresponding center frequency. The mode select signal 29102 may further indicate a power spectral density mask value and a number of antennas to be initially used for a MIMO communication.

The baseband processing module 29100, based on the mode selection signal 29102 produces one or more outbound symbol streams 29104 from the outbound data 2994. For example, if the mode selection signal 29102 indicates that a single transmit antenna is being utilized for the particular mode that has been selected, the baseband processing module 29100 will produce a single outbound symbol stream 29104. Alternatively, if the mode select signal 29102 indicates 2, 3 or 4 antennas, the baseband processing module 29100 produces 2, 3 or 4 outbound symbol streams 29104 from the outbound data 2994.

Depending on the number of outbound streams 29104 produced by the baseband module 29100, a corresponding number of the RF transmitters 29106-29110 will be enabled to convert the outbound symbol streams 29104 into outbound RF signals 29112. In general, each of the RF transmitters 29106-29110 includes a digital filter and upsampling module, a digital to analog conversion module, an analog filter module, a frequency up conversion module, a power amplifier (PA), and a radio frequency bandpass filter. The RF transmitters 29106-29110 provide the outbound RF signals 29112 to the transmit/receive module 29114, which provides each outbound RF signal to a corresponding antenna 2981-2985.

When the radio 2960 is in the receive mode, the transmit/receive module 29114 receives one or more inbound RF signals 29116 via the antennas 2981-2985 and provides them to one or more RF receivers 29118-29122, which is described in greater detail with reference to FIG. 30. The RF receiver 29118-29122, based on settings provided by the channel bandwidth adjust module 2987, converts the inbound RF signals 29116 into a corresponding number of inbound symbol streams 29124. The number of inbound symbol streams 29124 will correspond to the particular mode in which the data was received. The baseband processing module 29100 converts the inbound symbol streams 29124 into inbound data 2992, which is provided to the host device 2918-2932 via the host interface 2962.

As the reader will appreciate, the wireless communication device 2900 of FIG. 29 may be implemented using one or more integrated circuits. For example, the host device may be implemented on one integrated circuit, the baseband processing module 29100 and memory 2965 may be implemented on a second integrated circuit, and the remaining components of the radio 2960, less the antennas 2981-2985, may be implemented on a third integrated circuit. As an alternate example, the radio 2960 may be implemented on a single integrated circuit. As yet another example, the processing module 2950 of the host device and the baseband processing module 29100 may be a common processing device implemented on a single integrated circuit. Further, the memory 2952 and memory 2965 may be implemented on a single integrated circuit and/or on the same integrated circuit as the common processing modules of processing module 2950 and the baseband processing module 29100.

FIG. 30 illustrates an embodiment of baseband transmit processing 3000. This diagram of baseband transmit processing 3000 can be viewed as being within the baseband processing module 29100 of the FIG. 29, which includes an encoding module 30121, an interleaver 30191, a puncture module 30123, an interleaving module 30125, a plurality of symbol mapping modules 30128, 30130, a beamforming module (V) 30132, a modulation control module 30135, and a plurality of inverse fast Fourier transform (IFFT) modules 30134, 30136 for converting the outbound data 3094 into the outbound symbol stream 30104. In one embodiment, the interleaving module 30125 includes a switching module and a plurality of interleavers 30127, 30126. As the reader will appreciate, the baseband transmit processing 30100 may include two or more of each of the interleavers 30127, 30126, the symbol mapping modules 30128, 30130, and the IFFT modules 30134, 30136, wherein the number of each module corresponds to the number of transmit paths of a MIMO wireless communication. In addition, one of ordinary skill in art will further appreciate that the encoding module 30121, the interleaver 30191, puncture module 30123, the interleavers modules 30127, 30126, the symbol mapping modules 30128, 30130, and the IFFT modules 30134, 30136 may be function in accordance with one or more wireless communication standards including, but not limited to, IEEE 802.11a, b, g, n.

In one embodiment, the encoding module 30121 is operably coupled to convert outbound data 3094 into encoded data in accordance with one or more wireless communication standards. The puncture module 30123 punctures the encoded data to produce punctured encoded data. The plurality of interleavers 30127, 30126 is operably coupled to interleave the punctured encoded data into a plurality of interleaved streams of data. The plurality of symbol mapping modules 30128, 30130 is operably coupled to map the plurality of interleaved streams of data into a plurality of streams of data symbols based on a plurality of modulation control signals 30139 provided by the modulation control module 30135. The modulation control module 30135 may operate based on a multiple path channel estimation 30137. The beamforming module 30132 is operably coupled to beamform, using a unitary matrix having polar coordinates, the plurality of streams of data symbols into a plurality of streams of beamformed symbols. The plurality of IFFT modules 30124, 30136 is operably coupled to convert the plurality of streams of beamformed symbols into a plurality of outbound symbol streams.

The beamforming module 30132 is operably coupled to multiply a beamforming unitary matrix (V) with baseband signals provided by the plurality of constellation mapping modules 30128, 30130. The beamforming unitary matrix V used by the beamforming module 30132 satisfies the conditions of "V*V=VV*="I", where "I" is an identity matrix of [1 0; 0 1] for 2×2 MIMO wireless communication, is [1 0 0; 0 1 0; 0 0 1] for 3×3 MIMO wireless communication, or is [1 0 0 0; 0 1 0 0; 0 0 1 0; 0 0 0 1] for 4×4 MIMO wireless communication. In this equation, V*V means "conjugate (V) times V" and VV* means "V times conjugate (V)". It is noted that V may be a 2×2 unitary matrix for a 2×2 MIMO wireless communication, a 3×3 unitary matrix for a 3×3 MIMO wireless communication, and a 4×4 unitary matrix for a 4×4 MIMO wireless communication. It is further noted that for each column of V, a first row of polar coordinates including real values as references and a second row of polar coordinates including phase shift values.

In one embodiment, the symbol mapping modules 30128, 30130 function in accordance with one of the IEEE 802.11x standards to provide an OFDM (Orthogonal Frequency Domain Multiplexing) frequency domain baseband signals that includes a plurality of tones, or subcarriers, for carrying data. Each of the data carrying tones represents a symbol mapped to a point on a modulation dependent constellation map. For instance, a 16 QAM (Quadrature Amplitude Modulation) includes 16 constellation points, each corresponding to a different symbol. The particular modulation scheme used on a per transmit path basis, on a per subcarrier basis, and/or a combination thereof is dictated by the modulation control module 30135 via the modulation control modules. For example, if the modulation scheme is adjusted on a per transmit path basis, the modulation control module 30135 may determine that one transmit path will use a 16 QAM modulation scheme, while another may use a 64 QAM modulation scheme, and yet another transmit path may use a QPSK modulation scheme. As another example, if the modulation scheme is adjusted on a per subcarrier basis, each sub carrier of each transmit path may have a different modulation scheme. For instance, some subcarriers may have a 16 QAM modulation scheme, while others may use a 64 QAM modulation scheme, and some others may use a QPSK modulation scheme.

The modulation control module 30135 determines the modulation control signals 30139 based on a multiple path channel estimate 30137. In one embodiment, the modulation control module 30135 receiving the multiple path channel estimation 30137 from another RF transceiver. From this, the modulation control module 30135 determines, for each of the plurality of symbol mapping modules, a corresponding one of the plurality of modulation control signals based on a corresponding portion of the multiple path channel estimation. For instance, the modulation control module 30135 may receive the multiple path channel estimation 30137 as a diagonalized channel (H) based on eigen beamforming using singular value decomposition, wherein H=UDV*, such that y=Hx+n=UDV*x+n, where U corresponds to the unitary de-beamforming matrix, V corresponds to the unitary beamforming matrix, V* corresponds to a conjugate of the unitary beamforming matrix, y corresponds to the plurality of streams of frequency domain inbound baseband symbols, x corresponds to the plurality of streams of symbols, and n corresponds to noise.

For a diagonalized channel (H), the modulation control module may determine the corresponding modulation control signals for a 2×N multiple input multiple output (MIMO) wireless communication by first setting z=Vx, where V corresponds to the unitary beamforming matrix and x corresponds to the plurality of streams of symbols. The modulation control module 30135 then determines a conjugate of the unitary de-beamforming matrix multiplied by the plurality of streams of frequency domain inbound baseband symbols such that U*y=U*UDV*Vz+U*n=Dz+N, where D corresponds to a diagonal matrix of D=[$s_1$ 0; 0 $s_2$] and N corresponds to a noise power, and where $s_1$ and $s_2$ represent first and second signal components. In various embodiments, $s_1$ and $s_2$ represent first and second signal components, where a signal component may be a signal representation of a subcarrier of a transmit path, and/or a signal representation of the transmit path.

The modulation control module 30135 then determines signal to noise ratio (SNR) for each transmit path of the MIMO wireless communication, where $SNR_1=s_1^2/N_0$, and $SNR_2=s_2^2/N_0$; where the $SNR_1$ represents the SNR for a first transmit path of the MIMO wireless communication and the $SNR_2$ represents the SNR for a second transmit path of the MIMO wireless communication. The modulation control module 135 then determines the corresponding modulated control signals based on at least one of the $SNR_1$ and the $SNR_2$. For example, for a first transmit path, if the SNR is between a first and second threshold (e.g., between 75 dB and 90 dB) a modulation scheme of 64 QAM may be used and, for a second transmit path, if the SNR is between a different set of thresholds (e.g., 60 dB and 74 dB), a modulation scheme of 16 QAM may be used. As a further example, the modulation control module 30135 may determine the SNR for subcarriers of each transmit path and determine the modulation scheme for each subcarrier based on the SNR.

As another example, the modulation control module 30135 may determine the corresponding modulated control signals by first determining a geometric mean for the SNR (SNRgeo) for each of the transmit paths of the MIMO wireless communication over subcarriers of an OFDM (orthogonal frequency division multiplex) frame of the MIMO wireless communication, where $SNRgeo=prod(1+SNRi)^{(1/(N-1))}$. The modulation control module 135 then determines assigned bits (b) for the each of the transmit paths based on an Aslanis formula, where $b=\log_2(1+SNR/G)$, where G corresponds to margin such that $b_1 <= \log_2(1+SNRgeo_1/G_1)$ and $b_2 <= \log_2(1+SNRgeo_2/G_2)$. The modulation control module 30135 then relates, or corresponds, the assigned bits for the each of the transmit paths to a modulation convention to produce the corresponding one of the plurality of modulation control signals.

As an extension of the preceding example, the modulation control module 30135 may perform the corresponding of the assigned bits for the each of the transmit paths to a modulation convention by first limiting one of the assigned bits in accordance with $b_i=floor(\log_2(1+SNRgeo_i/G_i)/2)*2$ such that a maximum $b_i$ includes 8 bits/tone/stream. The modulation control module 135 then sets a margin (G) to 0 dB. The modulation control module 30135 then equates assigned bits $b_i$ of 2 to a 4QAM (quadrature amplitude modulation) modulation convention, assigned bits $b_i$ of 4 to a 16 QAM modulation convention, assigned bits $b_i$ of 6 to a 64QAM modulation convention, and assigned bits $b_i$ of 8 to a 256 QAM modulation convention.

In one embodiment, the modulation control module 135 generates the modulation control signals as part of the mode select signal 102 to include, but not limited to, a code rate, a number of coded bits per subcarrier (NBPSC), coded bits per OFDM symbol (NCBPS), and/or data bits per OFDM symbol (NDBPS).

FIG. 31 illustrates an embodiment of baseband receive processing 3100. This diagram is of baseband receive processing 3100 that includes a plurality of fast Fourier transform (FFT) modules 31140, 31142, a beamforming (U) module 31144, an equalizing module 31145, a plurality of demapping modules 31146, 31148, a deinterleaving module 31155, a depuncture module 31154, a de-interleaver 31156, and a decoding module 31156 for converting a plurality of inbound symbol streams 31124 into inbound data 3192. In one embodiment, the deinterleaving module 31155 includes a switching module and a plurality of de-interleavers 31150, 31152. As the reader will appreciate, the baseband receive processing 3100 may include two or more of each of the deinterleavers 31150, 31152, the demapping modules 31146, 31148, and the FFT modules 31140, 31142, where the number of each module corresponds to the number of receive paths (e.g., receiver antennas) in a MIMO wireless communication. In addition, one of ordinary skill in art will further appreciate that the decoding module 31156, the de-interleaver 31191, depuncture module 31154, the deinterleavers 31150, 31152, the decoding modules 31146, 31148, and the FFT modules 31140, 31142 may be function in accordance with one or more wireless communication standards including, but not limited to, IEEE 802.11a, b, g, n.

In an embodiment, a plurality of FFT modules 31140, 31142 is operably coupled to convert a plurality of inbound symbol streams 31124 into a plurality of streams of frequency domain inbound symbols. The de-beamforming module 31144 is operably coupled to inverse beamform, using a unitary matrix having polar coordinates, the plurality of streams of beamformed symbols into a plurality of streams of de-beamformed inbound symbols. The equalizing module 31145 is operably coupled to equalize the plurality of streams of de-beamformed inbound baseband symbols in accordance with channel estimation 31147 to produce a plurality of streams of equalized de-beamformed inbound baseband symbols. The channel estimation 31147 may be derived using one or more of a plurality of known methods for determining a channel response.

The plurality of demapping modules 31146, 31148 is operably coupled to demap plurality of streams of equalized de-beamformed inbound baseband symbols in accordance with a plurality of demodulation signals 31159 to produce a plurality of streams of inbound baseband signals. The deinterleaver 31150, 31152 are operably coupled to deinterleave the plurality of inbound baseband signals to produce demodulated inbound baseband signals. The decoding module 31156 is operably coupled to convert the demodulated inbound baseband signals into inbound data 3192.

In an embodiment, the beamforming module 31144 is operably coupled to multiply a beamforming unitary matrix (U) with baseband signals provided by the plurality of FFT modules 31140, 31142. The beamforming unitary matrix U used by the beamforming module 144 satisfies the conditions of "U*U=UU*="I", where "I" is an identity matrix of [1 0; 0 1] for 2×2 MIMO wireless communication, is [1 0 0; 0 1 0; 0 0 1] for 3×3 MIMO wireless communication, or is [1 0 0 0; 0 1 0 0; 0 0 1 0; 0 0 0 1] for 4×4 MIMO wireless communication. In this equation, U*U means "conjugate (U) times U" and UU* means "U times conjugate (U)". It is noted that U may be a 2×2 unitary matrix for a 2×2 MIMO wireless communication, a 3×3 unitary matrix for a 3×3 MIMO wireless communication, and a 4×4 unitary matrix for a 4×4 MIMO wireless communication. It is further noted that for each column of U, a first row of polar coordinates including real values as references and a second row of polar coordinates including phase shift values.

In an embodiment, the FFT modules 31140, 31142 function in accordance with one of the IEEE 802.11x standards to provide an OFDM (Orthogonal Frequency Domain Multiplexing) frequency domain baseband signals that includes a plurality of tones, or subcarriers, for carrying data. Each of the data carrying tones represents a symbol mapped to a point on a modulation dependent constellation map.

The modulation control module 31135 is operably coupled to generate the demodulation control signals 31159 based on multiple channel path estimation. In one embodiment, the modulation control module 31135 generates the plurality of demodulation control signals by interpreting a signal field of a frame received from another RF transceiver. The modulation control module 31135 may operate based on a multiple path channel estimation 30137.

FIG. 32 illustrates an embodiment of transmit processing 3200 within a communication device. Outbound data (bits) 3205 is provided to a scrambler 3210 to incur some randomness in the outbound data (bits) 3205. This scrambled data (bits) is then provided to a channel encoder that is operable to encode some redundancy by use of some ECC (Error Correcting Code). In some embodiments, the ECC employed by the channel encoder 3210 is that employed by an LDPC encoder 3221. The corresponding LDPC code employed therein may be a GRS-based irregular LDPC code generated in accordance with one of the various embodiments described above. The channel encoder 3210 then provides its encoded codeword (e.g., LDPC code block in the instance of the LDPC encoder 3221) to an interleaver (Πa) 3230 that is operable to interleave the encoded information in some desire manner. This interleaved information is then provided to a DEMUX (demultiplexor) 3240 that is operable to partition the interleaved information across a plurality of streams (e.g., as in the context of a MIMO communication system).

If desired, a plurality of interleavers ((Πb) 3241, (Πc) 3241, (Πz) 3249) can also be implemented to interleave further each of these individual streams. In some instances, the interleaving performed by the plurality of interleavers ((Πb) 3241, (Πc) 3241, (Πz) 3249) is the same for each stream; in other embodiments, the interleaving is different. In even other embodiments, the plurality of interleavers ((Πb) 3241, (Πc) 3241, (Πz) 3249) is not implemented at all (or it is bypassed in each stream). A designer is provided great latitude by which to implement the various interleavers herein.

A plurality of symbol mappers 3251, 3252, 3259 is operable to symbol map each of the labels provided thereto to a modulation that includes a constellation and mapping thereby generating a plurality of sequences of discrete-valued modulation symbols (i.e., one sequence per stream). In some embodiments, each of the plurality of symbol mappers 3251, 3252, 3259 employs a similar modulation; in other embodiments, each of the plurality of symbol mappers 3251, 3252, 3259 can employ a distinct modulation.

Each of these streams then has a corresponding inverse fast Fourier transform/cyclic prefix addition block (shown as IFFT/CP add blocks 3261, 3262, 3269). The outputs of each of the IFFT/CP add blocks 3261, 3262, 3269 is provided to a space time encoder 3270 (shown as receiving M inputs). The space time encoder 3270 is then operable to generate P outputs to correspond to the multiple path communication channel to which a communication device employing the transmit processing 3200 is communicatively coupled. In some instances, the number of M inputs is equal to the number of P outputs. These P outputs can be viewed as being output symbol streams.

A mode managing module 3280 is also communicatively coupled at least to each of the channel encoder 3220 (i.e., also to the LDPC encoder 3221 in embodiments that employ LDPC encoding), the interleaver (Πa) 3230, the plurality of interleavers ((Πb) 3241, (Πc) 3241, (Πz) 3249), the plurality of symbol mappers 3251, 3252, 3259, and the space time encoder 3270. Based on settings signals 3282, and based on a mode control signal 3281, the mode managing module 3280 is operable to govern at least the encoding, interleaving, and symbol mapping of the transmit processing 3200. Analogous to an embodiment described above, the mode control signal 3281 can indicate a particular mode of operation that is compliant with one or more specific modes of the various IEEE 802.11 standards.

It is noted that the interleaving of the interleaver (Πa) 3230 can be performed according to any of the interleaving of an LDPC block according to the embodiments described above with respect to the FIG. 9, FIG. 10, FIG. 11, FIG. 12, FIG. 13, FIG. 16, or FIG. 17.

FIG. 33 illustrates an embodiment of receive processing 3300 within a communication device. This receive processing 3300 can be viewed as being the corresponding reverse processing of the transmit processing 3200 of the FIG. 32. P inputs (e.g., P input symbol streams) is received by a space time decoder 3370 that is operable to partition the P inputs to generate M outputs (e.g., M streams) such that each stream is provided to corresponding fast Fourier transform/cyclic prefix removal block (shown as FFT/CP removal blocks 3361, 3362, 3369). Each of these FFT/CP removal blocks 3361, 3362, 3369 couples to a corresponding symbol demapper 3351, 3352, 3359. In some embodiments, each of the plurality of symbol demapper 3351, 3352, 3359 employs a similar modulation; in other embodiments, each of the plurality of symbol demapper 3351, 3352, 3359 can employ a distinct modulation.

If desired, a plurality of de-interleavers ((Πb)$^{-1}$ 3341, (Πc)$^{-1}$ 3341, (Πz)$^{-1}$ 3349) can also be implemented to de-interleave each of these individual streams. In some instances, the de-interleaving performed by the plurality of de-interleavers ((Πb)$^{-1}$ 3341, (Πc)$^{-1}$ 3341, (Πz)$^{-1}$ 3349) is the same for each stream; in other embodiments, the de-interleaving is different. In even other embodiments, the plurality of de-interleavers ((Πb)$^{-1}$ 3341, (Πc)$^{-1}$ 3341, (Πz)$^{-1}$ 3349) is not implemented at all (or it is bypassed in each stream). A designer is provided great latitude by which to implement the various de-interleavers herein. These plurality of de-interleavers ((Πb)$^{-1}$ 3341, (Πc)$^{-1}$ 3341, (Πz)$^{-1}$ 3349) can be viewed as performing the reverse processing of the plurality of interleavers ((Πb) 3241, (Πc) 3241, (Πz) 3249) of the FIG. 32 in some instances. Again, there are embodiments in which neither of the plurality of interleavers ((Πb) 3241, (Πc) 3241, (Πz) 3249) nor the plurality of de-interleavers ((Πb)$^{-1}$ 3341, (Πc)$^{-1}$ 3341, (Πz)$^{-1}$ 3349) is implemented (or they are simply bypassed in operation).

The outputs of either the plurality of symbol demappers 3351, 3352, 3359 (or the plurality of de-interleavers ((Πb)$^{-1}$ 3341, (Πc)$^{-1}$ 3341, (Πz)$^{-1}$ 3349), if implemented) are provided to a MUX (multiplexor) 3340 that is operable to process and convert the plurality of streams to a single signal that is then provided to a de-interleaver (Πa)$^{-1}$ 3330 that is operable to de-interleave the signal in some desire manner. The de-interleaving of the de-interleaver (Πa)$^{-1}$ 3330 can be implemented to perform the reverse processing of the interleaver (Πa) 3230 of the FIG. 32 in some instances. The output of the de-interleaver (Πa)$^{-1}$ 3330 is then provided to a channel decoder 3320 that is operable to decode the signal according to the ECC (Error Correcting Code) by which it was generated. In doing so, the channel decoder 3320 is operable to make a best estimate of at least one information bit that has been encoded in the received signal (e.g., within the received P inputs). In some embodiments, the channel decoder 3320 is implemented using an LDPC decoder 3321. The LDPC decoder 3321 can be implemented to decode the signal according to a GRS-based irregular LDPC code by which it was created. The best estimates are then provided to a descrambler 3310 that is operable to undo any scrambling or randomness that is incurred during any transmit processing (e.g., the transmit processing 3200 of the FIG. 32) thereby generating inbound data (bits) 3305.

A mode managing module 3380 is also communicatively coupled at least to each of the channel decoder 3320 (i.e., also to the LDPC decoder 3321 in embodiments that employ LDPC decoding), the deinterleaver (Πa)$^{-1}$ 3330, the plurality of de-interleavers ((Πb)$^{-1}$ 3341, (Πc)$^{-1}$ 3341, (Πz)$^{-1}$ 3349), the plurality of symbol demappers 3351, 3352, 3359, and the space time decoder 3370. Based on settings signals 3382, and based on a mode control signal 3381, the mode managing module 3380 is operable to govern at least the decoding, de-interleaving, and symbol demapping of the receive processing 3300. Analogous to an embodiment described above, the mode control signal 3381 can indicate a particular mode of operation that is compliant with one or more specific modes of the various IEEE 802.11 standards.

It is noted that the mode managing module 3280 of the FIG. 32 and the mode managing module 3380 of the FIG. 33 can operate cooperatively to ensure that the manner in which the transmit processing 3200 of the FIG. 32 is performed can be properly accommodate in the receive processing 3300 of the FIG. 33 (i.e., in embodiments that employ both the transmit processing 3200 and the receive processing 3300).

It is noted that the de-interleaving of the de-interleaver (Πa)$^{-1}$ 3330 can be performed to perform the reverse processing (e.g., the opposite of the interleaving) that is performed according to any of the interleaving of an LDPC block according to the embodiments described above with respect to the FIG. 9, FIG. 10, FIG. 11, FIG. 12, FIG. 13, FIG. 16, or FIG. 17.

Also, it is noted that transmit processing 3200 of the FIG. 32 and the receive processing 3300 of the FIG. 33 can be implemented in each of 2 separate communication devices (e.g., a communication transmitter and a communication receiver or 2 separate communication transceivers) that communicate with one another via a communication channel. Alternatively, each of the transmit processing 3200 of the FIG. 32 and the receive processing 3300 of the FIG. 33 can be implemented can be implemented within a singular communication device (e.g., a singular communication transceiver) that is operable to perform both transmit processing 3200 and receive processing 3300.

FIG. 34 illustrates an embodiment of a method 3400 for transmit processing. Initially, the method operates by receiving at least one information bit as shown in a block 3410. Then, the method operates by encoding the at least one information bit using a GRS-based irregular LDPC code thereby generating an LDPC block as shown in a block 3420. The method 3400 then operates by performing bit to symbol interleaving of the LDPC block thereby generating x-bit labels as shown in a block 3430. It is noted that the x-bit labels can include y uncoded bits and z coded bits. In some instances, the number y of uncoded bits is 0 (zero).

Then, the method 3400 can operate by performing some alternative operations, if desired. The method 3400 can operate by partitioning x-bit labels across a plurality of streams as shown in a block 3431. Also, another optional operation includes the interleaving of at least one stream as shown in a block 3432. These operations as shown in the blocks 3431 and 3432 need not be performed in all embodiments. In other words, some embodiments envision a single stream to be processed, and other embodiments also envision no interleaving the multiple streams (when multiple streams are employed). Moreover, as few as one of the streams, as many as all of the streams, or any combination thereof, can perform interleaving therein without departing from the scope and spirit of the invention.

The method 3400 then operates by symbol mapping the x-bit labels (or the interleaved 1 or more streams of x-bit labels) according to 1 or more modulations thereby generating a sequence of discrete-valued modulation symbols (each modulation includes constellation and mapping) as shown in a block 3440. Then, the method 3400 operates by processing the sequence of discrete-valued modulation symbols thereby generating a continuous time transmit signal 3450, and launching the continuous time transmit signal into a communication channel 3460. The processing the sequence of discrete-valued modulation symbols thereby generating a continuous time transmit signal 3450 can include a wide variety of processing including, but not limited to, frequency up conversion, gain adjustment, filtering, and/or any other appropriate processing to ensure the continuous time transmit signal comports to a format that communication channel requires.

FIG. 35 illustrates an embodiment of a method 3500 for receive processing. The method 3500 begins by receiving a continuous time receive signal from a communication channel as shown in a block 3510. The method 3500 then operates by processing the continuous time receive signal thereby generating 1 or more sequences of discrete-valued modulation symbols as shown in a block 3520. This processing can include a wide variety of processing including, but not limited to, frequency down conversion, gain adjustment, filtering, and/or any other appropriate processing to ensure the sequence of discrete-valued modulation symbols is in a format that is suitable to subsequent processing.

The method 3500 then continues by symbol demapping of the sequence of discrete-valued modulation symbols thereby generating x-bit labels as shown in a block 3530. This may include performing symbol demapping of more than 1 sequence of discrete-valued modulation symbols as well. In such an embodiment, the processing continuous time receive signal thereby generating 1 or more sequences of discrete-valued modulation symbols 3520 is appropriately performed for each of the streams.

Then, the method 3500 can operate by performing some alternative operations, if desired. The method 3500 can operate by de-interleaving at least one stream as shown in a block 3531. In some embodiments, no de-interleaving need be performed at all. However, in embodiments that employ multiple streams (whether de-interleaving is performed or not), the method 3500 can operate by generating a single stream from the at least one stream as shown in a block 3532.

The method 3500 then operates by performing symbol to bit de-interleaving of x-bit labels thereby generating an LDPC block as shown in a block as shown in a block 3540. The method 3500 then operates by decoding the LDPC block using a GRS-based irregular LDPC code by which information has been encoded thereby generating thereby a best estimate of at least one information bit encoded within the signal as shown in a block 3550.

It is also noted that the methods described within the preceding figures may also be performed within any number of appropriate system and/or apparatus designs without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:

a plurality of symbol demappers that is operative to demap each of a plurality of input signals that corresponds to the plurality of streams using at least one constellation that has a corresponding mapping thereby generating a plurality of x-bit labels that corresponds to the plurality of streams, wherein each symbol demapper corresponds to one respective stream of the plurality of streams, wherein x is an integer;

a MUX (multiplexor) that is operative to combine the plurality of x-bit labels thereby generating an LDPC (Low Density Parity Check) code block;

a deinterleaver that is operative to perform symbol to bit deinterleaving on the LDPC code block thereby generating a deinterleaved LDPC code block; and an LDPC decoder that is operative to employ an LDPC matrix of a GRS (Generalized Reed-Solomon)-based irregular LDPC code to decode the deinterleaved LDPC block thereby making a best estimate of an information bit encoded therein; and wherein:

the GRS-based irregular LDPC code is generated using GRS code.

2. The apparatus of claim 1, further comprising:

a plurality of de-interleavers, interposed between the plurality of symbol demappers and the MUX and, that is operative to deinterleave the plurality of x-bit labels thereby generating a deinterleaved plurality of x-bit labels; and wherein:

the MUX is operative to combine the deinterleaved plurality of x-bit labels thereby generating the LDPC code block.

3. The apparatus of claim 1, wherein:

the plurality of input signals is a plurality of sequences of discrete-valued modulation symbols.

4. The apparatus of claim 1, further comprising:

a mode managing module that is operative to select an LDPC code employed by the LDPC decoder, an interleave employed by the deinterleaver, and a plurality of modulations employed by the plurality of symbol demappers based on a mode control signal.

5. The apparatus of claim 1, further comprising:

a mode managing module that is operative to select at least one of a first LDPC code employed by the LDPC decoder, a first interleave employed by the deinterleaver, and a first plurality of modulations employed by the plurality of symbol demappers based on a mode control signal; and wherein:

based on a change of the mode control signal, the mode managing module is operative to select at least one of a second LDPC code employed by the LDPC decoder, a second interleave employed by the deinterleaver, and a second plurality of modulations employed by the plurality of symbol demappers.

6. The apparatus of claim 1, further comprising:

a descrambler that is operative to descramble the best estimate of the information bit and at least one additional best estimate of at least one additional information bit.

7. The apparatus of claim 1, wherein:

the deinterleaver is operative to permute at least two bits within the LDPC code block.

8. The apparatus of claim 1, wherein:

the deinterleaver is operative to permute at least two bits within at least one of the plurality of x-bit labels within the LDPC code block.

9. The apparatus of claim 1, wherein:

the apparatus is an IEEE (Institute of Electrical & Electronics Engineers) 802.11 compatible communication device.

10. The apparatus of claim 1, wherein:

the apparatus is a multiple-input-multiple-output (MIMO) communication device that is implemented in a MIMO communication system.

11. The apparatus of claim 1, wherein the LDPC matrix of the GRS-based irregular LDPC code is generated by:

choosing a plurality of possible bit degree distributions for the LDPC code block;

selecting a bit degree distribution from among the plurality of possible bit degree distributions, wherein the selected bit degree distribution has a best performance threshold among the plurality of possible bit degree distributions;

decomposing a parity check matrix that corresponds to a GRS-based regular LDPC code into a plurality of partial-matrices based on the selected bit degree distribution, wherein each partial-matrix of the plurality of partial-matrices has a corresponding bit degree and each partial-matrix of the plurality of partial-matrices has a corresponding plurality of permutation matrices; and replacing at least one permutation matrix within at least one partial-matrix of the plurality of partial-matrices with a zero matrix thereby generating the parity check matrix that corresponds to the GRS-based irregular LDPC code.

12. An apparatus, comprising:

a plurality of symbol demappers that is operative to demap each of a plurality of sequences of discrete-valued modulation symbols that corresponds to the plurality of streams using at least one constellation that has a corresponding mapping thereby generating a plurality of x-bit labels that corresponds to the plurality of streams, wherein each symbol demapper corresponds to one respective stream of the plurality of streams, wherein x is an integer;

a plurality of de-interleavers that is operative to deinterleave the plurality of x-bit labels thereby generating a deinterleaved plurality of x-bit labels;

a MUX (multiplexor) that is operative to combine the deinterleaved plurality of x-bit labels thereby generating an LDPC (Low Density Parity Check) code block;

a deinterleaver that is operative to perform symbol to bit deinterleaving on the LDPC code block thereby generating a deinterleaved LDPC code block;

an LDPC decoder that is operative to employ an LDPC matrix of a GRS (Generalized Reed-Solomon)-based irregular LDPC code to decode the deinterleaved LDPC block thereby making a best estimate of an information bit encoded therein; and a mode managing module that is operative to select an LDPC code employed by the LDPC decoder, an interleave employed by the deinterleaver, and a plurality of modulations employed by the plurality of symbol demappers based on a mode control signal; and wherein:

the GRS-based irregular LDPC code is generated using GRS code.

13. The apparatus of claim 12, wherein:

the mode managing module is operative to select at least one of a first LDPC code employed by the LDPC decoder, a first interleave employed by the deinterleaver, and a first plurality of modulations employed by the plurality of symbol demappers based on a mode control signal; and based on a change of the mode control signal, the mode managing module is operative to select at least one of a second LDPC code employed by the LDPC decoder, a second interleave employed by the deinterleaver, and a second plurality of modulations employed by the plurality of symbol demappers.

14. The apparatus of claim 12, further comprising:

a descrambler that is operative to descramble the best estimate of the information bit and at least one additional best estimate of at least one additional information bit.

15. The apparatus of claim 12, wherein:

the deinterleaver is operative to permute at least two bits within the LDPC code block.

16. The apparatus of claim 12, wherein:

the apparatus is a multiple-input-multiple-output (MIMO) communication device that is implemented in a MIMO communication system.

17. The apparatus of claim 12, wherein the LDPC matrix of the GRS-based irregular LDPC code is generated by:

choosing a plurality of possible bit degree distributions for the LDPC code block;

selecting a bit degree distribution from among the plurality of possible bit degree distributions, wherein the selected bit degree distribution has a best performance threshold among the plurality of possible bit degree distributions;

decomposing a parity check matrix that corresponds to a GRS-based regular LDPC code into a plurality of partial-matrices based on the selected bit degree distribution, wherein each partial-matrix of the plurality of partial-matrices has a corresponding bit degree and each partial-matrix of the plurality of partial-matrices has a corresponding plurality of permutation matrices; and replacing at least one permutation matrix within at least one partial-matrix of the plurality of partial-matrices with a zero matrix thereby generating the parity check matrix that corresponds to the GRS-based irregular LDPC code.

18. An apparatus, comprising:

a plurality of symbol demappers that is operative to demap each of a plurality of input signals that corresponds to the plurality of streams using at least one constellation that has a corresponding mapping thereby generating a plurality of x-bit labels that corresponds to the plurality of streams, wherein each symbol demapper corresponds to one respective stream of the plurality of streams, wherein x is an integer;

a MUX (multiplexor) that is operative to combine the plurality of x-bit labels thereby generating an LDPC (Low Density Parity Check) code block;

a deinterleaver that is operative to perform symbol to bit deinterleaving on the LDPC code block thereby generating a deinterleaved LDPC code block;

an LDPC decoder that is operative to employ an LDPC matrix of a GRS (Generalized Reed-Solomon)-based irregular LDPC code to decode the deinterleaved LDPC block thereby making a best estimate of an information bit encoded therein;

a descrambler that is operative to descramble the best estimate of the information bit and at least one additional best estimate of at least one additional information bit; and a mode managing module that is operative to select an LDPC code employed by the LDPC decoder, an interleave employed by the deinterleaver, and a plurality of modulations employed by the plurality of symbol demappers based on a mode control signal; and wherein:

the deinterleaver is operative to permute at least two bits within the LDPC code block; and the GRS-based irregular LDPC code is generated using GRS code.

19. The apparatus of claim 18, wherein the LDPC matrix of the GRS-based irregular LDPC code is generated by:

choosing a plurality of possible bit degree distributions for the LDPC code block;

selecting a bit degree distribution from among the plurality of possible bit degree distributions, wherein the selected bit degree distribution has a best performance threshold among the plurality of possible bit degree distributions;

decomposing a parity check matrix that corresponds to a GRS-based regular LDPC code into a plurality of partial-matrices based on the selected bit degree distribution, wherein each partial-matrix of the plurality of partial-matrices has a corresponding bit degree and each partial-matrix of the plurality of partial-matrices has a corresponding plurality of permutation matrices; and replacing at least one permutation matrix within at least one partial-matrix of the plurality of partial-matrices with a zero matrix thereby generating the parity check matrix that corresponds to the GRS-based irregular LDPC code.

20. The apparatus of claim 18, wherein:

the apparatus is a multiple-input-multiple-output (MIMO) communication device that is implemented in a MIMO communication system.

* * * * *